(12) United States Patent
Tanaka et al.

(10) Patent No.: US 8,749,753 B2
(45) Date of Patent: Jun. 10, 2014

(54) MOVABLE BODY APPARATUS, EXPOSURE APPARATUS AND OPTICAL SYSTEM UNIT, AND DEVICE MANUFACTURING METHOD

(75) Inventors: Keiichi Tanaka, Saitama (JP); Yukio Kakizaki, Yokohama (JP)

(73) Assignee: Nikon Corporation, Tokyo (JP)

( * ) Notice: Subject to any disclaimer, the term of this patent is extended or adjusted under 35 U.S.C. 154(b) by 1170 days.

(21) Appl. No.: 12/109,069

(22) Filed: Apr. 24, 2008

(65) Prior Publication Data
US 2009/0059190 A1  Mar. 5, 2009

Related U.S. Application Data

(60) Provisional application No. 60/924,059, filed on Apr. 27, 2007, provisional application No. 60/924,060, filed on Apr. 27, 2007, provisional application No. 60/924,137, filed on May 1, 2007, provisional application No. 60/924,142, filed on May 1, 2007, provisional application No. 60/924,143, filed on May 1, 2007.

(51) Int. Cl.
| | |
|---|---|
| G03B 27/52 | (2006.01) |
| G03B 27/58 | (2006.01) |
| G03B 27/60 | (2006.01) |
| G03B 27/62 | (2006.01) |
| G03F 7/20 | (2006.01) |
| G03B 27/42 | (2006.01) |
| G03B 27/54 | (2006.01) |

(52) U.S. Cl.
CPC .......... *G03F 7/7085* (2013.01); *G03F 7/70816* (2013.01); *G03F 7/70841* (2013.01)
USPC ............... 355/30; 355/53; 355/67; 355/72; 355/73; 355/75; 355/76

(58) Field of Classification Search
CPC ............. G03F 7/7025; G03F 7/70616; G03F 7/70775; G03F 7/70641; G03F 7/70816; G03F 7/70808; G03F 7/708; G03F 7/70708; G03F 7/70866; G03F 7/70858; G03F 7/7085; G03F 7/70841; G03F 7/70916; G03F 7/70908; G03F 7/70883
USPC ................. 355/30, 53, 67, 72–76; 250/492.1, 250/492.2, 492.22, 493.1, 441.11, 442.11; 378/34, 35
See application file for complete search history.

(56) References Cited

U.S. PATENT DOCUMENTS

| | | |
|---|---|---|
| 4,425,508 A | 1/1984 | Lewis et al. |
| 4,801,352 A | 1/1989 | Piwczyk |

(Continued)

FOREIGN PATENT DOCUMENTS

| | | |
|---|---|---|
| EP | 1 339 084 A2 | 2/2003 |
| JP | 2005-276932 | 10/2005 |

OTHER PUBLICATIONS

English-translation of JP Patent Application Pub. No. 2005-276932 A2.

*Primary Examiner* — Toan Ton
*Assistant Examiner* — Christina Riddle
(74) *Attorney, Agent, or Firm* — Finnegan, Henderson, Farabow, Garrett & Dunner, LLP

(57) ABSTRACT

The upper end of a static gas bearing member of a wafer side seal unit is connected to an edge section on the outgoing side of an exposure beam of a chamber in an air tight state via bellows, and the lower end surface is in a state forming a predetermined clearance with a wafer and a wafer holder. By this arrangement, the inside of the chamber is isolated from the outside. Accordingly, it becomes possible to maintain a vacuum environment in the periphery of the optical path of the exposure beam without arranging a vacuum chamber to house a wafer, a wafer holder, and a wafer stage, which allows the size of the entire exposure apparatus to be reduced, and also makes it easy to have access to the vicinity of the wafer stage.

24 Claims, 44 Drawing Sheets

(56) References Cited

U.S. PATENT DOCUMENTS

| | | | | |
|---|---|---|---|---|
| 4,818,838 | A * | 4/1989 | Young et al. | 219/121.12 |
| 5,103,102 | A | 4/1992 | Economou et al. | |
| 5,559,584 | A * | 9/1996 | Miyaji et al. | 355/73 |
| 5,997,963 | A * | 12/1999 | Davison et al. | 427/582 |
| 6,031,598 | A * | 2/2000 | Tichenor et al. | 355/67 |
| 6,287,004 | B1 | 9/2001 | Sogard | |
| 6,300,630 | B1 * | 10/2001 | Veneklasen | 850/16 |
| 6,402,380 | B1 | 6/2002 | Sogard | |
| 6,542,220 | B1 * | 4/2003 | Schrijver et al. | 355/53 |
| 6,731,371 | B1 | 5/2004 | Shiraishi | |
| 6,891,593 | B2 * | 5/2005 | Arakawa | 355/30 |
| 2001/0035942 | A1 * | 11/2001 | Hara et al. | 355/30 |
| 2002/0142496 | A1 * | 10/2002 | Nakasuji et al. | 438/14 |
| 2003/0117600 | A1 * | 6/2003 | Taniuchi et al. | 355/53 |
| 2003/0178581 | A1 * | 9/2003 | Miura et al. | 250/492.3 |
| 2003/0185715 | A1 * | 10/2003 | Krivts et al. | 422/104 |
| 2005/0168712 | A1 * | 8/2005 | Miyajima | 355/30 |
| 2005/0248744 | A1 * | 11/2005 | Shibazaki | 355/72 |
| 2006/0001958 | A1 * | 1/2006 | Hasegawa | 359/443 |
| 2006/0060259 | A1 * | 3/2006 | Devitt | 141/65 |
| 2006/0181689 | A1 * | 8/2006 | Phillips et al. | 355/53 |
| 2007/0022831 | A1 * | 2/2007 | Naftali et al. | 73/865.8 |
| 2007/0199201 | A1 * | 8/2007 | Tanaka | 34/92 |

* cited by examiner

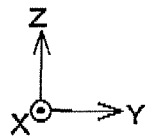
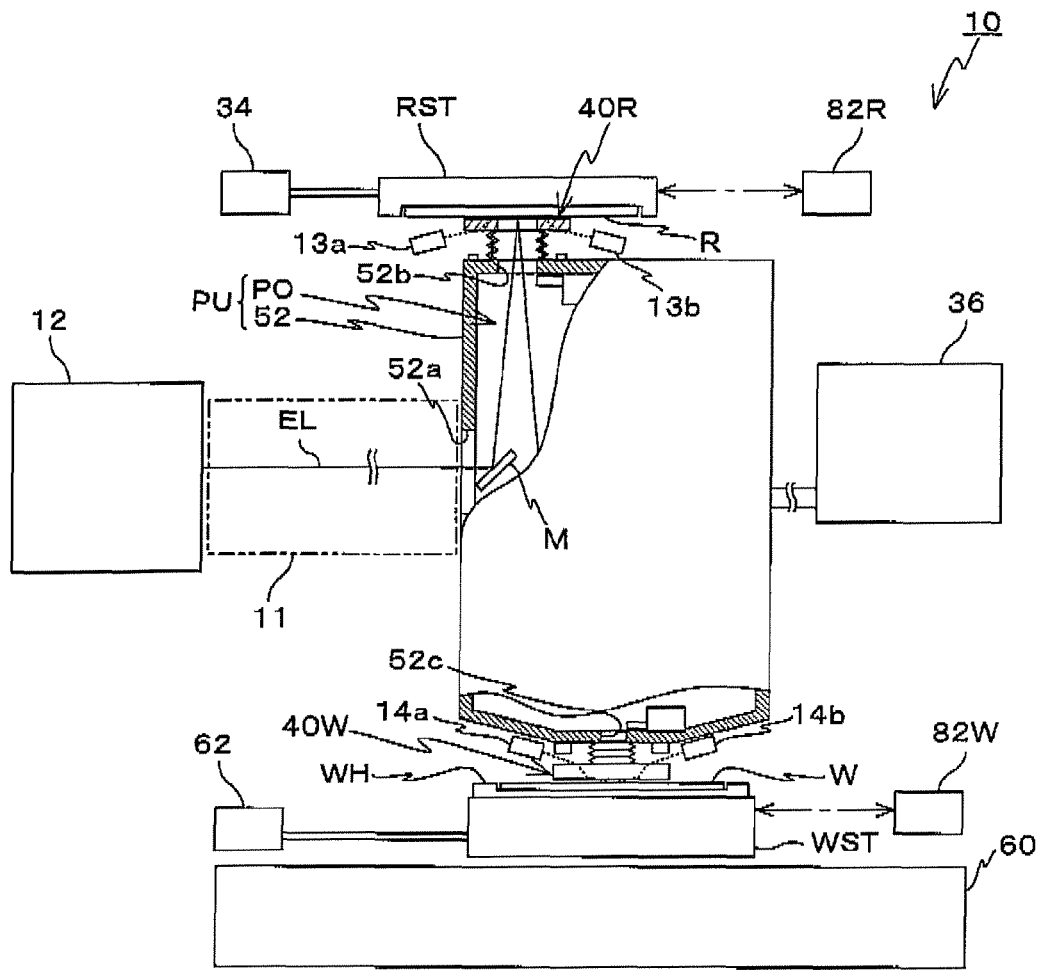

MOVABLE BODY APPARATUS, EXPOSURE APPARATUS AND OPTICAL SYSTEM UNIT, AND DEVICE MANUFACTURING METHOD

CROSS-REFERENCE TO RELATED APPLICATIONS

This non-provisional application claims the benefit of Provisional Application No. 60/924,059 and No. 60/924,060 filed Apr. 27, 2007, and Provisional Application No. 60/924,137, No. 60/924,142, and No. 60/924,143 filed May 1, 2007, the disclosures of which are hereby incorporated herein by reference in its entirety.

BACKGROUND OF THE INVENTION

1. Field of the Invention

The present invention relates to movable body apparatus, exposure apparatus and optical system units, and more particularly to a movable body apparatus that is equipped with a movable body which moves holding an object, an exposure apparatus that irradiates an energy beam on the object via an optical system and forms a predetermined pattern on the object and an optical system unit suitable for use in the exposure apparatus, and a device manufacturing method using the exposure apparatus.

2. Description of the Background Art

Conventionally, in a lithography process to produce a semiconductor device, a liquid crystal display or the like, a projection exposure apparatus by the step-and-repeat method (the so-called stepper) or a projection exposure apparatus by the step-and-scan method (the so-called scanner) is mainly used that transfers a pattern formed on a mask or a reticle (hereinafter generally referred to as a "reticle") onto a substrate (hereinafter also appropriately referred to as a "wafer") such as a wafer or a glass plate on which a resist or the like is coated via a projection optical system.

In these exposure apparatus, further improvement of resolution of the projection optical system is becoming required due to higher integration and finer patterns in a semiconductor device. Therefore, the wavelength of the exposure light is becoming shorter year by year, and recently, development of an EUV exposure apparatus (EUVL) which uses an SOR (Synchrotron Orbital Radiation) ring, a laser plasma light source or the like that generates an extreme ultraviolet light (EUV (Extreme Ultraviolet) light) of 100 nm or less as the exposure light source is underway.

In the EUV exposure apparatus, because there are no optical materials at present having a suitable transmittance to EUV light, an optical system of total reflection consisting of only reflection type optical members (catoptric elements) is employed as the projection optical system and the illumination optical system, and a reflection type reticle is also used as the reticle. Further, because the EUV light is absorbed by most materials, the optical path space of the EUV light needs to be set in a predetermined high vacuum state, and the EUV exposure apparatus main section is usually installed in a vacuum chamber (refer to, for example, Kokai (Japanese Patent Unexamined Application) No. 2005-276932 bulletin).

However, when the whole exposure apparatus is placed in a vacuum chamber, the size of the whole apparatus will increase and it will also take a lot of time to set the inside of the vacuum chamber to a vacuum environment. Further, because access to the apparatus in the vacuum chamber from the outside is relatively difficult, maintenance operation will take a lot of time and effort. Further, there are cases when the vacuum chamber is deformed by a difference in pressure inside and outside the vacuum chamber, and by the deformation, positional relation of each section of the exposure apparatus may fluctuate, which may cause a decrease in the exposure precision.

Further, also in the EUV exposure apparatus, in order to improve the exposure accuracy, it is desirable to measure the surface position information of the wafer and the reticle and perform exposure operation taking into consideration the measurement results, as in the optical exposure apparatus.

SUMMARY OF THE INVENTION

The present invention was made under the circumstances described above, and according to a first aspect there is provided a first exposure apparatus that exposes an object by an energy beam and forms a pattern on the object, the apparatus comprising: an optical system chamber that houses an optical system which emits the energy beam including information of the pattern; and an outgoing side sealing mechanism that includes a loop shaped static gas bearing member which forms a predetermined clearance between a specific object including at least the object placed in the vicinity of the edge section of the optical system chamber located on the outgoing side of the energy beam from the optical system, and isolates the inside of the optical system chamber from the outside.

According to the apparatus, the periphery of the beam path of the energy beam can be maintained to a predetermined environment, without arranging a chamber and the like to house the specific object. Accordingly, the size of the entire exposure apparatus can be reduced, and access of the worker or the like to the specific object least including the object and its periphery becomes easy, which makes it possible to perform operations such as maintenance easily.

According to a second aspect of the present invention, there is provided a second exposure apparatus that exposes an object by an energy beam and forms a pattern on the object, the apparatus comprising: an optical system chamber that houses the optical system on which the energy beam including the information of the pattern is incident; and an incidence side sealing mechanism that includes a loop shaped static gas bearing member which forms a predetermined clearance between a specific object including at least a pattern formation member placed in the vicinity of the edge section of the optical system chamber located on the incident side of the energy beam to the optical system, and isolates the inside of the optical system chamber from the outside.

According to the apparatus, the periphery of the beam path of the energy beam can be maintained to a predetermined environment, without arranging a chamber and the like to house the specific object. Accordingly, the size of the entire exposure apparatus can be reduced, and access of the worker or the like to the specific object least including the pattern formation member and its periphery becomes easy, which makes it possible to perform operations such as maintenance easily.

According to a third aspect of the present invention, there is provided a movable body apparatus which moves an object along a two dimensional plane, the device comprising: a movable body that moves in a state where a surface holding the object faces a predetermined plane substantially parallel to the two dimensional plane while holding the object; and a seal mechanism which has a loop-shaped static gas bearing member surrounding the object and whose end section on the opposite side of the side that faces the predetermined plane connects to the movable body in an air tight state, and by the surface on the side facing the predetermined plane of the static gas bearing member forming a predetermined clearance between the predetermined plane, the inside of the static gas bearing member is isolated from the outside.

According to the apparatus, because the vacuum environment in the periphery of the object can be maintained even if the movable body is not housed in a vacuum chamber or the like as it was conventionally, the structural complexity and the increase in size of the movable body and its periphery can be suppressed, and the access to the movable body also becomes easy such as for workers, which allows maintenance to be performed easily.

According to a fourth aspect of the present invention, there is provided a third exposure apparatus which irradiates an energy beam on an object via an optical system and forms a predetermined pattern on the object, the apparatus comprising: a first chamber that houses the optical system and has its inside is set to a negative pressure state; a second chamber which houses the first chamber and has its inside set to a negative pressure state with a higher pressure than the first chamber; a movable body which moves holding the object; and a seal mechanism which has a loop shaped static gas bearing member surrounding the object and whose end section on the opposite side of the side that faces the second chamber connects to the movable body in an air tight state, and by the surface on the side facing the second chamber of the static gas bearing member forming a predetermined clearance between the predetermined plane which faces the object of the second chamber, the inside of the static gas bearing member is isolated from the outside.

According to the apparatus, by sealing mechanism, it becomes possible to isolate the inside of the space where the object is placed from the outside. Accordingly, even if the entire apparatus is not housed in a chamber where the inside is set to a predetermined environment as it was conventionally, the beam path of the energy beam can be maintained to a predetermined environment. Further, because the first chamber that has the inside set to a negative pressure state is housed inside the second chamber that has the inside set to a negative pressure state with a higher pressure than the first chamber, the difference in pressure inside and outside of the first chamber can be reduced when compared with the case when the first chamber is arranged under atmospheric pressure. By this arrangement, because the deformation of the first chamber due to the internal and external difference in pressure can be suppressed, variation such as the positional relation of an optical system housed in the first chamber can be suppressed as much as possible, which makes it possible to improve the exposure accuracy.

According to a fifth aspect of the present invention, there is provided a fourth exposure apparatus which irradiates an energy beam on a mask and transfers a pattern formed on the mask onto an object via an optical system, the apparatus comprising: a first chamber that houses the optical system and has its inside is set to a negative pressure state; a second chamber which houses the first chamber and has its inside set to a negative pressure state with a higher pressure than the first chamber; a movable body which moves holding the mask; and a seal mechanism which has a loop shaped static gas bearing member surrounding the mask and whose end section on the opposite side of the side that faces the second chamber connects to the movable body in an air tight state, and by the surface on the side facing the second chamber of the static gas bearing member forming a predetermined clearance between the predetermined plane which faces the mask of the second chamber, the inside of the static gas bearing member is isolated from the outside.

According to the apparatus, by sealing mechanism, it becomes possible to isolate the space inside where the mask is placed from the outside. Accordingly, even if the entire apparatus is not housed in a chamber where the inside is set to a predetermined environment as it was conventionally, the optical path of the energy beam can be maintained to a predetermined environment. Further, because the first chamber that has the inside set to a negative pressure state is housed inside the second chamber that has the inside set to a negative pressure state with a higher pressure than the first chamber, the difference in pressure inside and outside of the first chamber can be reduced when compared with the case when the first chamber is arranged under atmospheric pressure. By this arrangement, because the deformation of the first chamber due to the internal and external difference in pressure can be suppressed, variation such as the positional relation of an optical system housed in the first chamber can be suppressed as much as possible, which makes it possible to improve the exposure accuracy.

According to a sixth aspect of the present invention, there is provided an optical system unit, comprising: an optical system; a first chamber that houses the optical system and has its inside is set to a negative pressure state; and a second chamber which houses the first chamber and has its inside set to a negative pressure state with a higher pressure than the inside of the first chamber.

According to the unit, because the first chamber that has the inside set to a negative pressure state is housed inside the second chamber that has the inside set to a negative pressure state with a higher pressure than the first chamber, the difference in pressure inside and outside of the first chamber can be reduced when compared with the case when the first chamber is arranged under atmospheric pressure. By this arrangement, because the deformation of the first chamber due to the internal and external difference in pressure can be suppressed, variation such as the positional relation of an optical system housed in the first chamber can be suppressed as much as possible.

BRIEF DESCRIPTION OF THE DRAWINGS

In the accompanying drawings;

FIG. 1 is a view that schematically shows a configuration of an exposure apparatus of a first embodiment;

DESCRIPTION OF THE EMBODIMENTS

A First Embodiment

Figure 2:
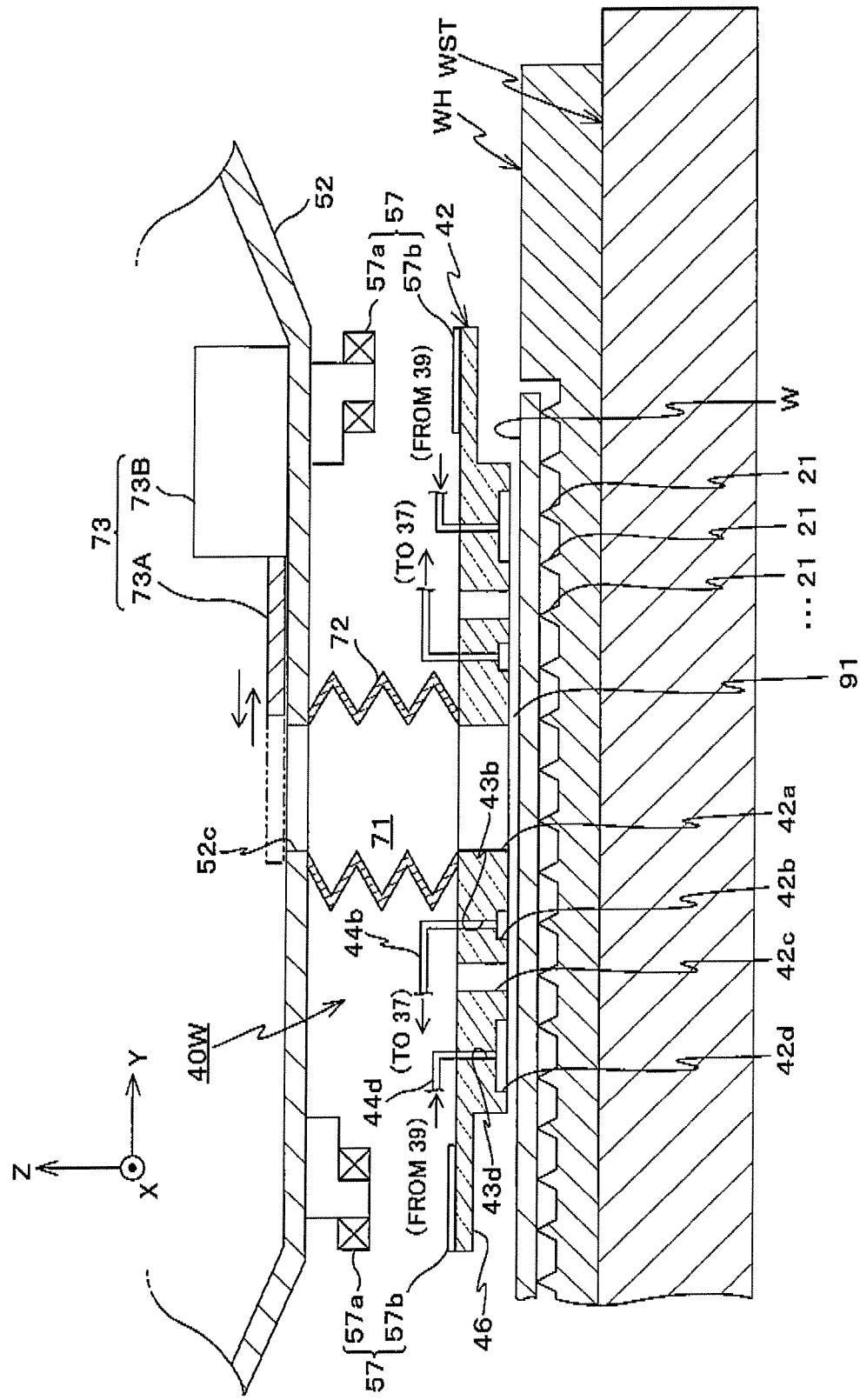
FIG. 2 is a longitudinal sectional view that shows a wafer side seal unit of the exposure apparatus in the first embodiment and its periphery.

Hereinafter, a first embodiment of the present invention will be described, referring to FIGS. 1 to 13.

FIG. 1 schematically shows the entire configuration of an exposure apparatus 10 of the first embodiment. Exposure apparatus 10 transfers the entire circuit pattern of a reticle R onto each of a plurality of shot areas on a wafer W by the step-and-scan method, by relatively scanning reticle R and wafer W in a one-dimension direction (in this case, a Y-axis direction) with respect to a projection unit PU while projecting a part of the circuit pattern formed on reticle R via a projection optical system PO in projection unit PU on wafer W.

Exposure apparatus 10 is equipped with a light source device 12 that emits a EUV light (light in the soft X-ray region) EL, an illumination optical system including a bending mirror M that reflects EUV light EL from light source device 12 and bends the light so that the light is incident on a patterned surface (the lower surface in FIG. 1 (a surface on the −Z side)) of reticle R at a predetermined incident angle such as, for example, around 50 [mrad], a reticle stage RST that holds reticle R, a projection unit PU that perpendicularly projects EUV light EL reflected off the patterned surface of reticle R on a surface (the upper surface in FIG. 1 (a surface on the +Z side)) of wafer W subject to exposure, a wafer stage WST that holds wafer W, and the like. Incidentally, the section between light source device 12 and projection unit PU (the section where the illumination optical system described earlier is arranged) is actually covered by a vacuum chamber 11 (refer to FIG. 1) whose inside is set to a vacuum environment. Further, although bending mirror M is in the inside of a chamber 52 of projection unit PU, it is actually a part of the illumination optical system.

As light source device 12, a laser-excited plasma light source is used as an example. In the laser-excited plasma light source, by irradiating a laser beam with high brightness to a EUV light generation material (a target) the target is excited into a high-temperatured plasma state, and EUV light, ultraviolet light, visible light and light in other wavelength regions that are released when the target cools off are used. Incidentally, in the embodiment, EUV light mainly having the wavelength of 5 to 20 nm, such as, for example, a EUV light EL of 11 nm, is to be used as the exposure beam (hereinafter also referred to as the illumination light).

The illumination optical system is configured, for example, including a wavelength selection window, an illuminance uniformity mirror, (both of which are omitted in the drawings) and bending mirror M and the like. Further, a parabolic mirror (not shown) which serves as a light condensing mirror in light source device 12 also configures a part of the illumination optical system. EUV light EL emitted from light source device 12 via the illumination optical system becomes an arc slit-shaped illumination light and illuminates the patterned surface of reticle R.

Reticle stage RST, for example, has a self-weight cancellation mechanism (not shown), and the self-weight cancellation mechanism supports reticle stage RST while maintaining a non-contact manner to the lower surface of a reticle stage base (not shown) arranged above reticle stage RST. Reticle stage RST is driven by a drive system 34 in directions of six degrees of freedom, that is, in an X-axis, a Y-axis, a Z-axis, a $\theta x$, a $\theta y$ and a $\theta z$ direction. Incidentally, the $\theta x$, the $\theta y$, and the $\theta z$ directions are the rotating directions around the X-axis, the Y-axis, and the Z-axis, respectively.

Figure 7:
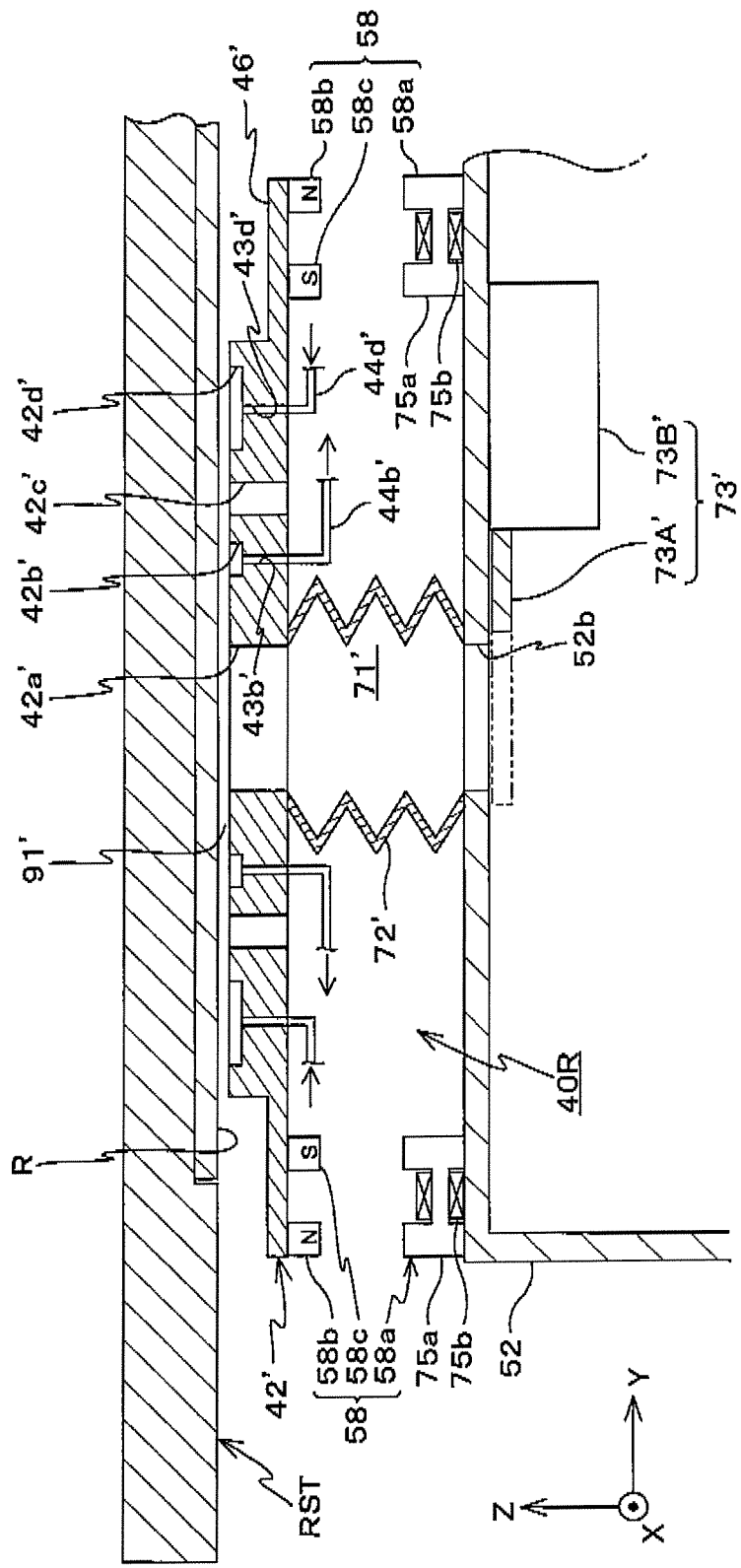
FIG. 7 is a longitudinal sectional view that shows a reticle side seal unit of the exposure apparatus in the first embodiment and its periphery.

Reticle stage RST holds reticle R, which is a reflection type reticle, with a reticle holder (not shown) by a vacuum chuck method (or an electrostatic chuck method, a mechanical chuck method), in a state where the patterned surface serves as the lower surface. In the embodiment, as shown in FIG. 7, reticle R is held by the reticle holder so that the patterned surface of reticle R is at substantially the same height as the lower surface of reticle stage RST (approximately at the same position in the Z-axis direction). Reticle R is made, for example, of a thin plate such as a silicon wafer, quartz, a low expansion glass and the like, and on its surface (patterned surface), a reflection film which reflects the EUV light is formed. This reflection film, for example, is a multilayer film, on which a film of molybdenum Mo and beryllium Be are alternately layered at a period of around 5.5 nm for about 50 pairs. This multilayer film has around 70% reflectance to EUV light which has the wavelength of 11 nm. Incidentally, a multilayer film of a similar structure is formed on the reflection surface of bending mirror M and of each of the other mirrors in the illumination optical system.

On (the surface of) the multilayer film formed on the patterned surface of reticle R, for example, nickel Ni or aluminum Al is coated as an absorption layer, and patterning is applied on the absorption layer so as to form a circuit pattern.

EUV light EL which hits the part where the absorption layer of reticle R remains is absorbed by the absorption layer, and EUV light EL which hits the reflection film on the part where the absorption layer is removed, or more specifically, EUV light EL that hits the reflection film, is reflected by the reflection film, and as a consequence, EUV light EL which includes the information of the circuit pattern is reflected off the patterned surface of reticle R and proceeds toward projection optical system PO.

The position of reticle stage RST (reticle R) is constantly detected by a reticle interferometer 82R, which projects a laser beam on a reflection surface arranged (or formed) On the side surface of reticle stage RST, at a resolution of, for example, around 0.25 to 1 nm. Reticle interferometer 82R is a multiaxial interferometer that has a plurality of measurement axes, and can measure positional information of reticle stage RST in directions of six degree of freedom in the embodiment. Incidentally, positional information in the $\theta x$, $\theta y$ and $\theta z$ directions is referred to as pitching amount, rolling amount, and yawing amount, respectively.

Projection unit PU includes chamber (housing) 52 and projection optical system PO housed in chamber 52. Projection optical system PO is to be a reflection system with a numerical aperture (N.A.) of, for example, 0.1, and has, for example, six pieces of catoptric elements (mirrors), and the projection magnification is to be, for example, ¼ times. In the side wall of chamber 52, an opening 52a is formed, in the ceiling wall, an opening 52b is formed, and in the bottom wall, an opening 52c is formed. Accordingly, EUV light EL, which is emitted from light source device 12 and is incident on reticle R via openings 52a and 52b of chamber 52, is reflected by reticle R, and EUV light EL is projected on wafer W, via projection optical system PO and opening 52c. This allows a ¼ reduced image of the pattern on reticle R to be transferred (formed) on wafer W. Incidentally, the inside of chamber 52 is set to a vacuum environment by a vacuum pump 36 shown in FIG. 1.

Wafer stage WST is supported by levitation on wafer stage base 60 by static gas bearings or the like (not shown), and is driven, for example, in directions of six degrees of freedom by a drive system 62 which includes a linear motor, a voice coil motor and the like. FIG. 1 shows drive system 62 simply as a block, for the sake of convenience.

Although it is not shown in the drawings, as an example, wafer stage WST is finely movable in the Z-axis, $\theta x$, and $\theta y$ directions by a voice coil motor, and has a wafer table including a wafer holder WH, and a main stage on which the wafer table is mounted. As shown in FIG. 2, wafer holder WH is a wafer holder by the so-called pin chuck method that has multiple pins 21, and holds wafer W by vacuum suction by forming a vacuum state in the space formed between wafer W and wafer holder WH. Further, wafer W is held by wafer holder WH so that the surface of wafer W is at substantially the same height as the upper surface of wafer stage WST (approximately at the same position in the Z-axis direction). In the embodiment, the upper surface of the periphery section of wafer holder WH surrounding wafer W is substantially flush with the wafer surface. Incidentally, the wafer table can be finely movable in directions of six degrees of freedom, or the main stage can be driven by a planar motor.

The position of wafer stage WST is constantly detected by a wafer interferometer (hereinafter referred to as a "wafer interferometer") 82W shown in FIG. 1, at a resolution of, for example, around 0.25 to 1 nm. Wafer interferometer 82W is configured of a multiaxial interferometer which has a plurality of measurement axes, and in the embodiment, positional information of wafer stage WST in directions of six degrees of freedom can be measured.

Although it is not shown in FIG. 1, in the embodiment, an alignment system ALG (refer to FIG. 10) by the off-axis method is arranged in the vicinity of the side surface of projection unit PU. As this alignment system ALG, for example, an FIA (Field Image Alignment) system that irradiates a broadband light on an alignment mark (or on an aerial image measuring instrument) on wafer W, receives the reflected light, and performs mark detection by image processing can be used.

Further, exposure apparatus 10 employs a local vacuum method in which local spaces including the optical path of EUV light EL, in between reticle R and projection unit PU and in between projection unit PU and wafer W are each vacuumed. In the embodiment, as shown in FIG. 1, a seal unit 40W of the wafer side is arranged between projection unit PU and wafer stage WST, and a seal unit 40R of the reticle side is arranged between reticle stage RST and projection unit PU.

Seal unit 40W has its upper end connected to chamber 52, and the lower end surface faces wafer W via a predetermined clearance (minute distance). Seal unit 40W substantially maintains sealingly the spacing between wafer W and/or wafer stage WST and projection unit PU. Further, seal unit 40R has its lower end connected to chamber 52, and the upper end surface faces reticle R via a predetermined clearance (minute distance). Seal unit 40R substantially sealingly maintains the spacing between reticle R and/or reticle stage RST and projection unit PU.

Seal unit 40W will hereinafter be described in detail, referring to FIGS. 2 to 6.

FIG. 2 shows a partially sectioned view of the vicinity of seal unit 40W. Seal unit 40W is equipped with a static gas bearing member 42, a bellows 72 which connects the upper surface of static gas bearing member 42 and the lower end surface of chamber 52 in an air tight state, a plurality of electromagnet units 57 arranged in between static gas bearing member 42 and chamber 52, and a shutter unit 73 arranged inside of chamber 52. Incidentally, for example, even in the case when wafer W or wafer stage WST is not placed facing static gas bearing member 42, by closing opening 52c of chamber 52 with shutter unit 73, the inside of projection unit PU is sealingly maintained.

Figure 3:
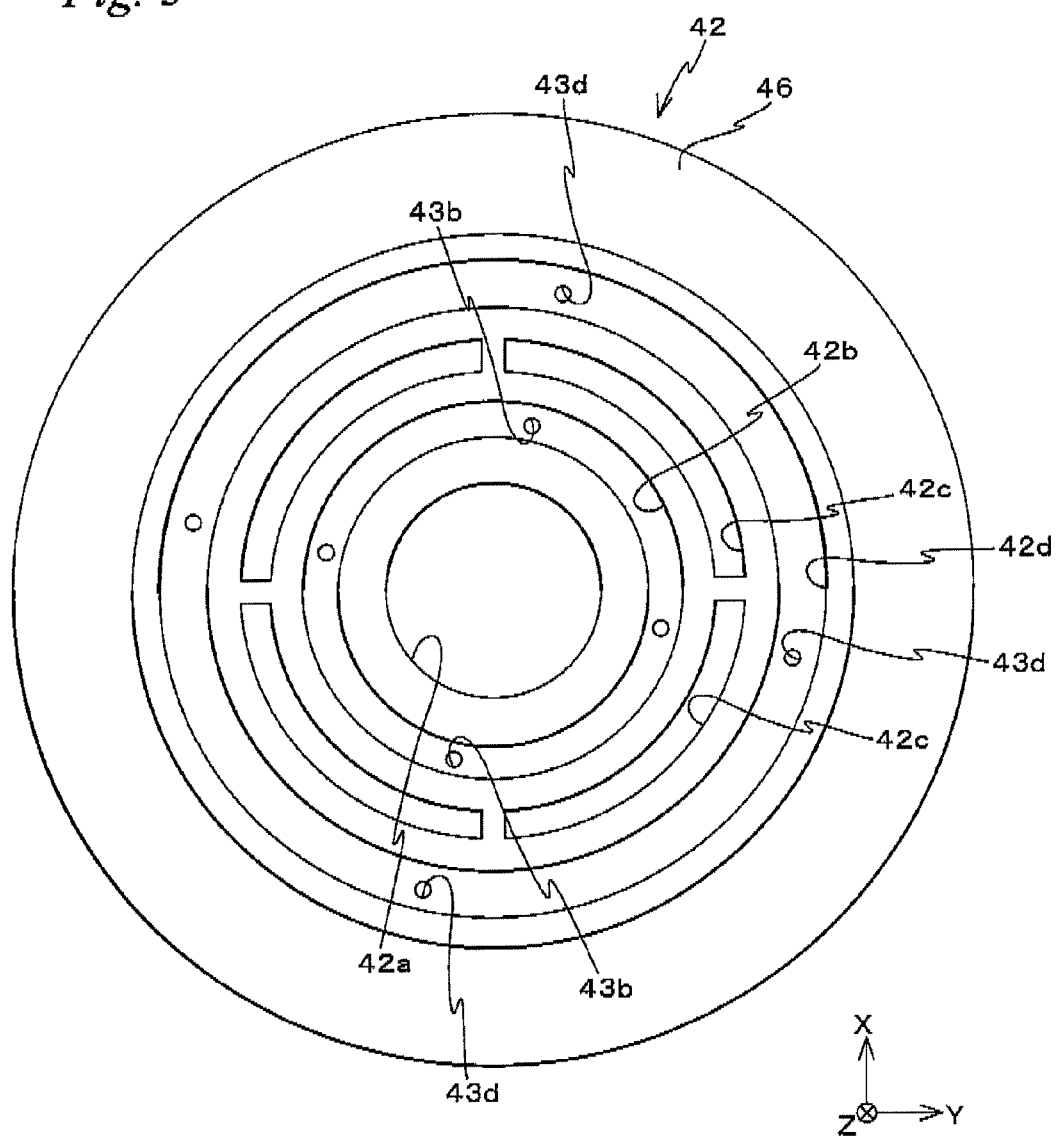
FIG. 3 is a bottom surface view of a static gas bearing member in FIG. 2.

Static gas bearing member 42 is made of a transparent member, such as, for example, a glass member, and as shown in FIG. 2, and FIG. 3, which is a bottom surface view of static gas bearing member 42, has a rough discoid shape with a flange section 46 formed in the circumferential section. In static gas bearing member 42, a through hole 42a is formed which has a circular shape in a planar view (when viewing from the −Z direction) and passes the center of static gas bearing member 42 penetrating in the Z-axis direction. Further, on the bottom surface of static gas bearing member 42 on the outer side of through hole 42a, a loop shaped exhaust groove 42b of a predetermined depth is formed, and on the outer side of exhaust groove 42b, four open air sections 42c are formed, and furthermore, on the outer side, a gas supply groove 42d of a predetermined depth is formed.

As shown in FIG. 3, four exhaust lines 43b are formed at an equal interval (an equiangular interval) in a penetrating manner from the inner bottom surface (a surface on the +Z side) of exhaust groove 42b to the upper surface (a surface on the +Z side) of static gas bearing member 42. Further, to each of these exhaust lines 43b, one end of an exhaust pipe 44b is connected as shown in FIG. 2. The other end of exhaust pipe 44b is connected to a vacuum pump 37 (not shown in FIGS. 2 and 3, refer to FIG. 10).

Open air section 42c, for example, has a rough quarter arc shape in a planar view (when viewing from the −Z direction) as shown in FIG. 3, and is formed in a penetrating manner from the bottom surface (a surface on the −Z side) to the upper surface (a surface on the +Z side) of static gas bearing member 42.

As shown in FIG. 3, four gas supply lines 43d are formed at an equal interval (an equiangular interval) in a penetrating manner from the inner bottom surface (a surface on the +Z side) of gas supply groove 42d to the upper surface (a surface on the +Z side) of static gas bearing member 42. To each of these gas supply lines 43d, one end of a gas supply pipe 44d is connected as shown in FIG. 2. The other end of gas supply pipe 44d is connected to a gas supply device 39 (not shown in FIGS. 2 and 3, refer to FIG. 10).

As shown in FIG. 2, the lower end of bellows 72 is connected to static gas bearing member 42 in an air tight state in a state surrounding through-hole 42a, and the upper end is connected to chamber 52 in an air tight state in a state surrounding an opening 52c of chamber 52. Bellows 72 is to perform expansion/contraction and deformation freely. More specifically, static gas bearing member 42 is connected to chamber 52 in an air tight state, in a state where at least a position in the Z-axis direction and an inclination (attitude) to the XY plane are in a variable state.

Each electromagnet unit 57 has an electromagnet 57a, which has a coil arranged on the lower end surface (a surface on the −Z side) of chamber 52, and a magnetic material member 57b made from an iron plate or the like arranged at a position facing electromagnet 57a on the upper surface (a surface on the +Z side) of flange section 46 of static gas bearing member 42, respectively. According to electromagnet unit 57 configured in the manner described above, by supplying current to a coil which configures electromagnet 57a, it is possible to generate a magnetic attraction (a magnetic force acting as gravitation) between electromagnet 57a and magnetic material member 57b. And, by magnetically adsorbing magnetic material member 57b with electromagnet 57a, it becomes possible to fix static gas bearing member 42 to chamber 52.

Shutter unit 73 is used to open/close opening 52c of chamber 52, and includes a shutter 73A, and a shutter drive device 73B which reciprocally drives shutter 73A in the +Y direction and the −Y-direction. In shutter unit 73, when shutter 73A is driven to the position shown in a phantom line (a two-dot chain line) in FIG. 2 by shutter drive device 73B, the inside of chamber 52 and the space including the inside of bellows 72 move into a non-communicative state (more specifically, a state where the gaseous flow from the outside into the inside of chamber 52 is blocked). Meanwhile, when shutter 73A is driven to the position shown in a solid line in FIG. 2 by shutter drive device 73B, the inside of chamber 52 and the space including the inside of bellows 72 moves into a communicative state. Incidentally, in the description below, the state where shutter 73A is at the position shown in the phantom line will be referred to as "a closed state", and the state where shutter 73A is at the position shown in the solid line will be referred to as "an opened state".

Figure 4:
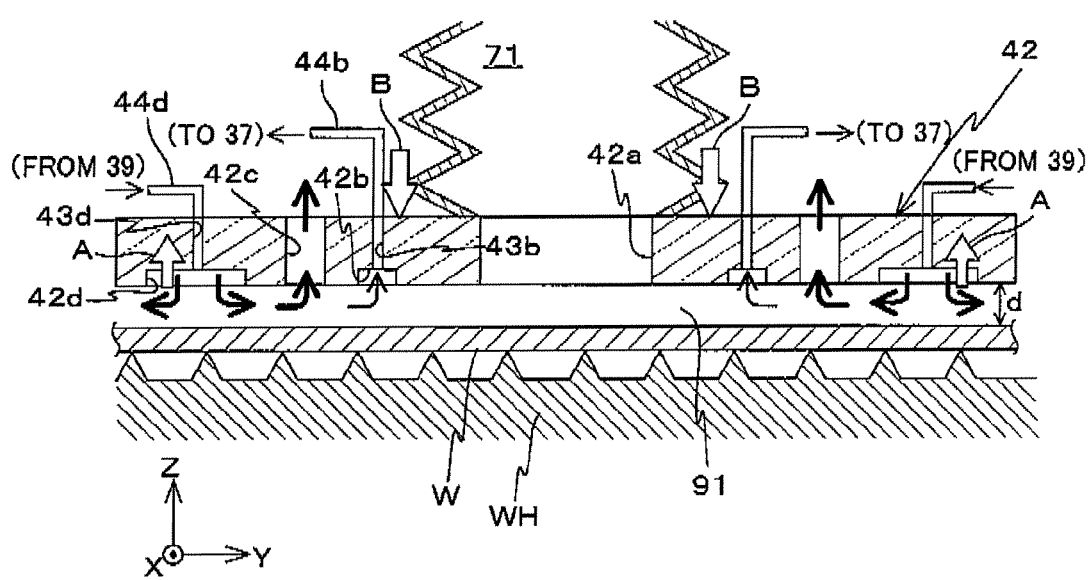
FIG. 4 is a view for explaining an operation of the static gas bearing member in FIG. 2.

In seal unit 40W, when compressed air is supplied from gas supply device 39 (refer to FIG. 10) via gas supply pipe 44d and gas supply line 43d as shown in FIG. 4, compressed air flows out from the entire gas supply groove 42d to the upper surface of wafer W. Accordingly, a force in the direction (an upward direction) indicated by an outlined arrow A acts on static gas bearing member 42 due to the static pressure in a gap (hereinafter to be referred to as a "bearing clearance") 91, which is the gap between the lower surface (a bearing surface) of static gas bearing member 42 and wafer W. Meanwhile, the compressed air that blows out to the upper surface of wafer W flows from the center in the XY plane of bearing clearance 91 towards the outside, and from the outside towards the center, and most of the air which flows from the outside towards the center passes through open air section 42c and is exhausted above static gas bearing member 42. Further, the air which was not exhausted from open air section 42c tries to flow furthermore toward the center of bearing clearance 91, however, such air is removed by vacuum suction by vacuum pump 37, via exhaust groove 42b, exhaust line 43b, and exhaust pipe 44b. Accordingly, the vicinity of exhaust groove 42b (in bearing clearance 91) becomes a negative pressure, and a force in the direction (a downward direction) indicated by an outlined arrow B will act on static gas bearing member 42 due to the difference between the negative pressure and the atmospheric pressure.

More specifically, in the embodiment, even if wafer W moves in directions of six degrees of freedom, a clearance d (e.g., d is around 5 μm) serving as bearing clearance 91 is maintained by the balance between the upward force (static pressure (clearance internal pressure) in bearing clearance 91) and the downward force (a force by the difference of negative pressure which occurs due to vacuum suction and atmospheric pressure and force that includes self-weight of static gas bearing member 42) that acts on static gas bearing member 42. Further, by the flow of gas in bearing clearance 91 shown in FIG. 4, the circulation of the gas between the inside and the outside of a space 71 (refer to FIG. 2) including the inside of bellows 72 and the inside of through hole 42a of static gas bearing member 42 is in a blocked state.

Accordingly, when shutter 73A is in an opened state, vacuum pump 36 (refer to FIG. 1) vacuum suctions the inside of chamber 52 and sets the inside of space 71 to a vacuum environment along with the inside of chamber 52, and also by the function (operation) of static gas bearing member 42, the vacuum environment is maintained.

On the outer side of seal unit 40W, as shown in FIG. 1, a wafer focus sensor (14a, 14b) by the oblique incidence method is arranged which measures the position of wafer W in the Z-axis direction. The wafer focus sensor (14a, 14b) includes a light-transmitting system 14a which irradiates a detection beam to the upper surface of wafer W from an oblique direction, and a photodetection system 14b which receives the detection beam reflected off the wafer W surface.

Figure 5:
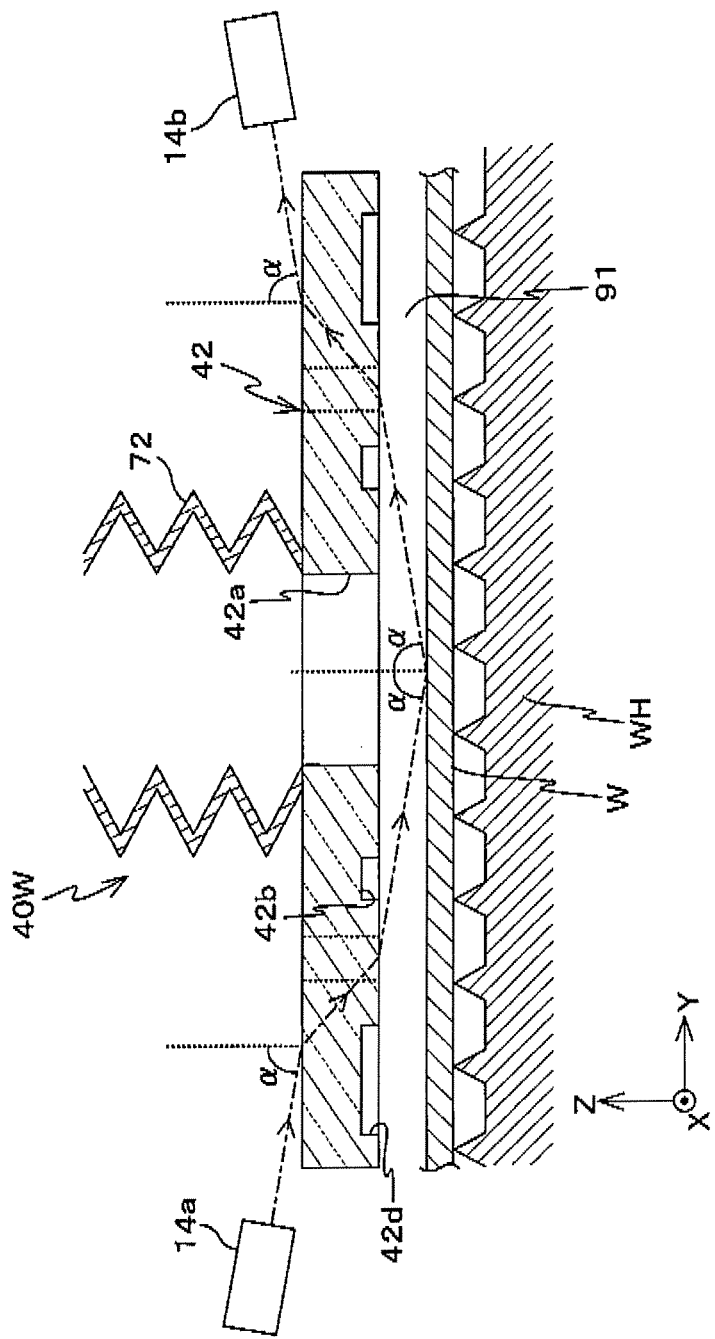
FIG. 5 is a view for explaining a wafer focus sensor of the exposure apparatus in the first embodiment.

As shown in FIG. 5, the detection beam emitted from light-transmitting system 14a is incident on the upper surface of static gas bearing member 42 at an incidence angle α (e.g., α around 80 degrees), and after having been refracted at static gas bearing member 42, the beam is emitted from the lower surface of static gas bearing member 42 at an angle of emergence α and is irradiated on the wafer W surface. Further, the detection beam irradiated on the wafer W surface is reflected off wafer W at a reflection angle α, and after entering the lower surface of static gas bearing member 42 at incidence angle α and being refracted at static gas bearing member 42, the beam is emitted from the upper surface of static gas bearing member 42 at angle of emergence α and is received by photodetection system 14b.

Incidentally, in the embodiment, the beam path of the detection beam is set so that the beam path of the detection beam of the wafer focus sensor (14a, 14b) does not interfere with exhaust groove 42b, open air section 42c, gas supply groove 42d, exhaust line 43b, and gas supply line 43d formed in static gas bearing member 42. Incidentally, besides such an arrangement, the beam path of the detection beam can interfere with exhaust groove 42b, open air section 42c, gas supply groove 42d, exhaust line 43b, and gas supply line 43d, In this case, the placement of the wafer focus sensor (14a, 14b), the outgoing direction of the detection beam and the like have to be decided, taking into consideration refraction which occurs when the detection beam passes through grooves 42b, 42d and the like.

As the wafer focus sensor (14a, 14b), a multipoint focal point position detection system whose details are disclosed in, for example, Kokai (Japanese Patent Unexamined Application Publication) No. 6-283403 bulletin (corresponding U.S. Pat. No. 5,448,332 description), is used. Therefore, based on the measurement values of the wafer focus sensor (14a, 14b), not only the Z position on the upper surface of wafer W but also the inclination (rotation quantity in the θx and θy directions) to the XY plane can be obtained.

The measurement values of the wafer focus sensor (14a, 14b) are supplied to a main controller 20 (not shown in FIG. 1, refer to FIG. 10) along with measurement values of wafer interferometer 82W, and main controller 20 controls drive system 62 so that the position control of wafer stage WST in directions of six degrees of freedom is performed.

Figure 6:
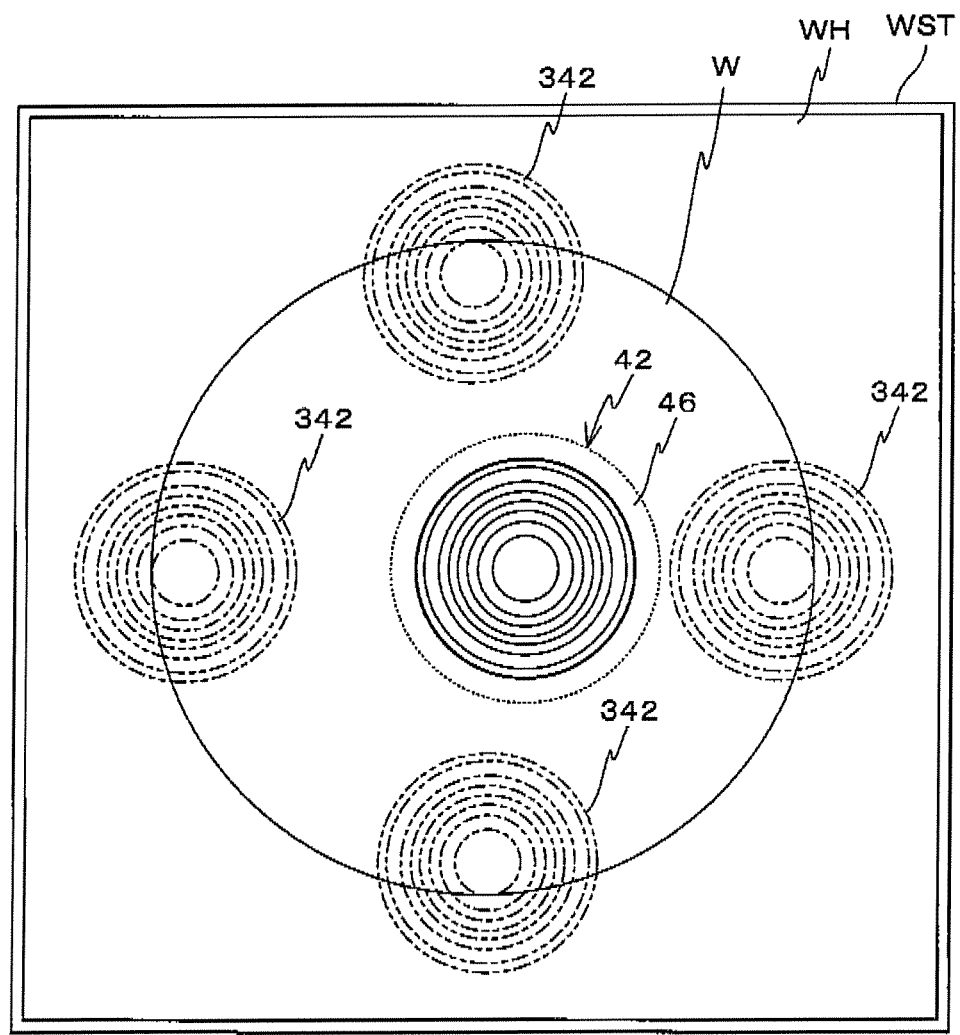
FIG. 6 is a view for explaining the size of a wafer holder of the exposure apparatus in the first embodiment.

Incidentally, when wafer W is exposed, the positional relation between static gas bearing member 42 and wafer W changes by the movement of wafer stage WST, as shown in FIG. 6. As shown in FIG. 6 indicated by numerical reference 342, on exposure of shot areas in the periphery of wafer W, a part of static gas bearing member 42 protrudes from wafer W and is on wafer holder WH. Therefore, wafer holder WH is set around to a size large enough so that static gas bearing member 42 does not move off the upper surface at the time of exposure operation of wafer W. Further, as previously described, in the Z-axis direction, wafer holder WH is set so that the upper surface of the periphery section of wafer holder WH surrounding wafer W is set at a position substantially flush with the surface of wafer W. Therefore, even when a part of static gas bearing member 42 moves outside of wafer W, it does not come into contact with wafer holder WH. For convenience of illustration, FIG. 6 shows the state of static gas bearing member 42 that moves with respect to wafer W, and with numerical reference 342, the portion of static gas bearing member 42 that shows flange section 46 which has nothing to do with vacuum environment maintenance is omitted.

Next, seal unit 40R of the reticle side will be described, referring to FIG. 7.

FIG. 7 shows a longitudinal sectional view of seal unit 40R. Because seal unit 40R has almost the same configuration as that of seal unit 40W vertically reversed, the sections same or similar to seal unit 40W will be indicated by adding an "'" to the same reference codes which were used when describing seal unit 40W, and the description thereabout will also be omitted. In seal unit 40R, instead of electromagnet unit 57 configuring seal unit 40W, an electromagnet/permanent magnet unit 58 is arranged.

Electromagnet/permanent magnet unit 58 includes an electromagnet 58a arranged on the chamber 52 side, and a pair of permanent magnets 58b and 58c arranged on the static gas bearing member 42' side.

Electromagnet 58a has an iron core 75a that has a shape of a rough H when viewed from the +X direction, and a coil 75b wound in the Y-axis direction to the center portion of iron core 75a. Further, permanent magnets 58b and 58c are considered to have a reverse polarity to each other, and for example, when the lower end side of permanent magnet 58b is N pole, the lower end side of permanent magnet 58c is to be S pole.

Figure 9A:
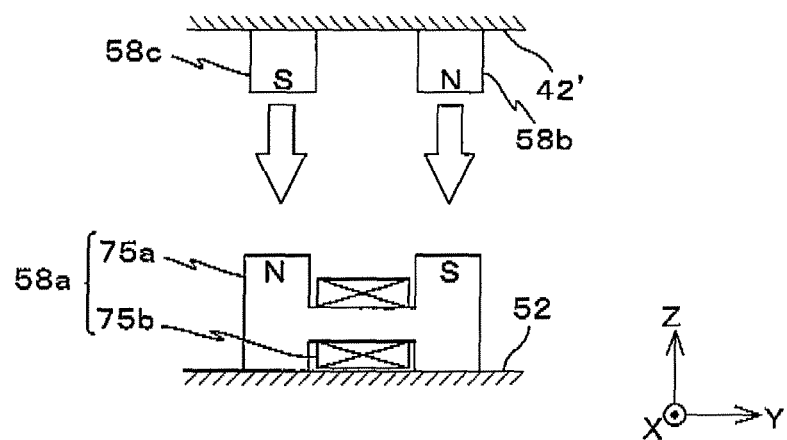
FIGS. 9A and 9B are views for explaining an operation of an electromagnet/permanent magnet unit in FIG. 7.

According to electromagnet/permanent magnet unit 58 having the configuration described above, by supplying current of a predetermined direction to coil 75b of electromagnet 58a, for example, the +Y side end section of iron core 75a is magnetized to S pole and the −Y end section is magnetized to N pole, as shown in FIG. 9A. Accordingly, because a magnetic attraction occurs between iron core 75a and permanent magnets 58b and 58c, a thrust force in the −Z direction can be given to static gas bearing member 42'.

Figure 9B:
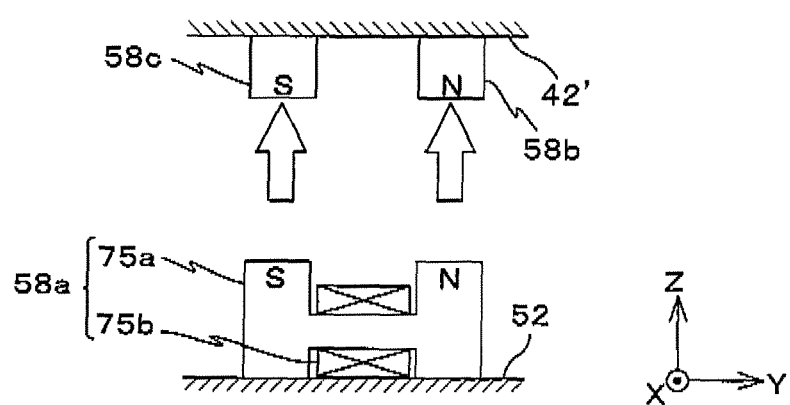

Meanwhile, by supplying current of a reverse direction to coil 75b of electromagnet 58a as opposed to the case in FIG. 9A, for example, the +Y side end section of iron core 75a is magnetized to N pole and the −Y end section is magnetized to S pole, as shown in FIG. 9B. Accordingly, because a magnetic repulsion occurs between iron core 75a and permanent magnets 58b and 58c, a thrust force in the +Z direction can be given to static gas bearing member 42'.

Referring back to FIG. 7, in seal unit 40R configured in the manner described above, when compressed air supplied to gas supply pipe 44d' from gas supply device 39' (refer to FIG. 10) blows out to the lower surface of reticle R from gas supply groove 42d' via gas supply line 43d' as in seal unit 40W previously described, a downward force acts on static gas bearing member 42' by the static pressure in the gap (bearing clearance 91') between the upper surface of static gas bearing member 42' and the lower surface of reticle R. Meanwhile, the compressed air that blows out to the lower surface of reticle R flows from the center in the XY plane of bearing clearance 91' towards the outside, and from the outside towards the center, and most of the air which flows from the outside towards the center passes through an open air section 42c' and is exhausted below static gas bearing member 42'. Further, the air which was not exhausted from open air section 42c' furthermore tries to flow toward the center of bearing clearance 91', however, such air is removed by vacuum suction by a vacuum pump 37' (refer to FIG. 10), via exhaust groove 42b', exhaust line 43b', and exhaust pipe 44b'. Accordingly, the vicinity of exhaust groove 42b' (in bearing clearance 91') becomes a negative pressure, and a force in an upward direction will act on static gas bearing member 42' due to the difference between the negative pressure and the atmospheric pressure.

More specifically, in the embodiment, even if reticle R moves in directions of six degrees of freedom, a predetermined clearance serving as bearing clearance 91' is maintained by the balance between the downward force (static pressure (clearance internal pressure) in bearing clearance 91' and a force that includes self-weight of static gas bearing member 42') and the upward force (a force including the force by the difference of negative pressure which occurs due to vacuum suction and atmospheric pressure) that acts on static gas bearing member 42'. Further, by the flow of gas in bearing clearance 91', the circulation of the gas via bearing clearance 91' inside a bellows 72', and between the inside and the outside of a space 71' (refer to FIG. 7) which includes the inside of a through hole 42a' of static gas bearing member 42' is in a blocked state.

Accordingly, when shutter 73A' is in an opened state, vacuum pump 36 (refer to FIG. 1) vacuum suctions the inside of chamber 52 and sets the inside of space 71' to a vacuum environment along with the inside of chamber 52, and also by the function (operation) of static gas bearing member 42', the vacuum environment is maintained.

Figure 8:
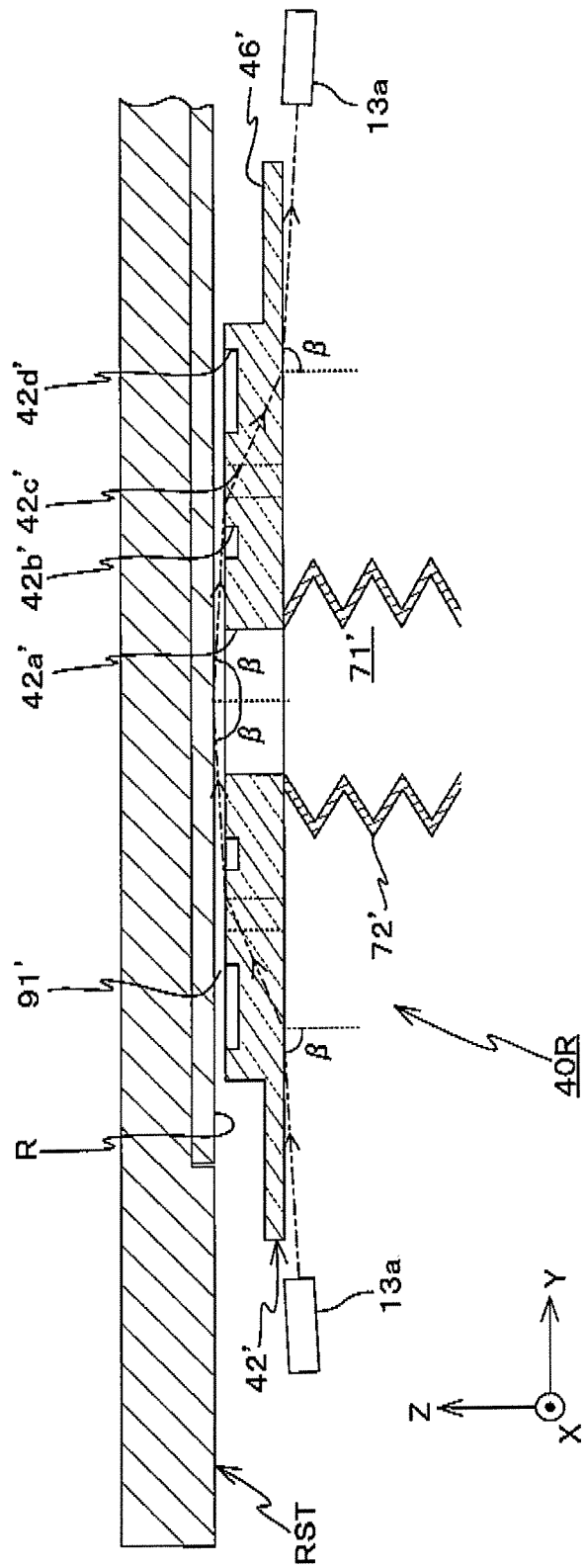
FIG. 8 is a view for explaining a reticle focus sensor of the exposure apparatus in the first embodiment.

On the outer side of seal unit 40R, as shown in FIG. 1, a reticle focus sensor (13a, 13b) by the oblique incidence method is arranged which measures the position of the lower surface (the patterned surface) of reticle R in the Z-axis direction. The reticle focus sensor (13a, 13b) includes a light-transmitting system 13a which irradiates a detection beam to the lower surface (the patterned surface) of reticle R from an oblique direction, and a photodetection system 13b which receives the detection beam reflected off the lower surface (the patterned surface) of reticle R. More specifically, as shown in FIG. 8, the detection beam emitted from light-transmitting system 13a is incident on the lower surface of static gas bearing member 42' at an incidence angle β (e.g., β around 80 degrees), and after having been refracted at static gas bearing member 42', the beam is emitted from the upper surface of static gas bearing member 42' at an angle of emergence β and is irradiated on the patterned surface of reticle R. Further, the detection beam irradiated on the patterned surface of reticle R is reflected off the patterned surface of reticle R at a reflection angle β and enters the upper surface of static gas bearing member 42' at incidence angle β, and after being refracted at static gas bearing member 42', the beam is emitted from the upper surface of static gas bearing member 42' at angle of emergence β and is received by photodetection system 13b.

Incidentally, in the embodiment, the beam path of the detection beam is set so that the beam path of the detection beam of the reticle focus sensor (13a, 13b) does not interfere with exhaust groove 42b', open air section 42c', gas supply groove 42d', exhaust line 43b', and gas supply line 43d' formed in static gas bearing member 42'. Incidentally, besides such an arrangement, the beam path of the detection beam can interfere with exhaust groove 42b', open air section 42c', gas supply groove 42d', exhaust line 43b', and gas supply line 43d'. In this case, the placement of the reticle focus sensor (13a, 13b), the outgoing direction of the detection beam and the like have to be decided, taking into consideration refraction which occurs when the detection beam passes through exhaust groove 42b' or gas supply groove 42d' and the like.

As this reticle focus sensor (13a, 13b), the multiple point focal point position detection system described above is used as in the wafer focus sensor (14a, 14b) previously described. Therefore, based on the measurement values of the reticle focus sensor (13a, 13b), not only the Z position of the patterned surface of reticle R but also the inclination (rotation quantity in the $\theta x$ and $\theta y$ directions) to the XY plane can be obtained.

The measurement values of the reticle focus sensor (13a, 13b) are supplied to main controller 20 along with measurement values of reticle interferometer 82R, and main controller 20 drives reticle stage RST via drive system 34 so that the position control of reticle R in six dimensional directions is performed. Incidentally, wafer stage WST can be controlled via drive system 62, based on the measurement values of reticle interferometer 82R and the reticle focus sensor (13a, 13b).

Figure 10:
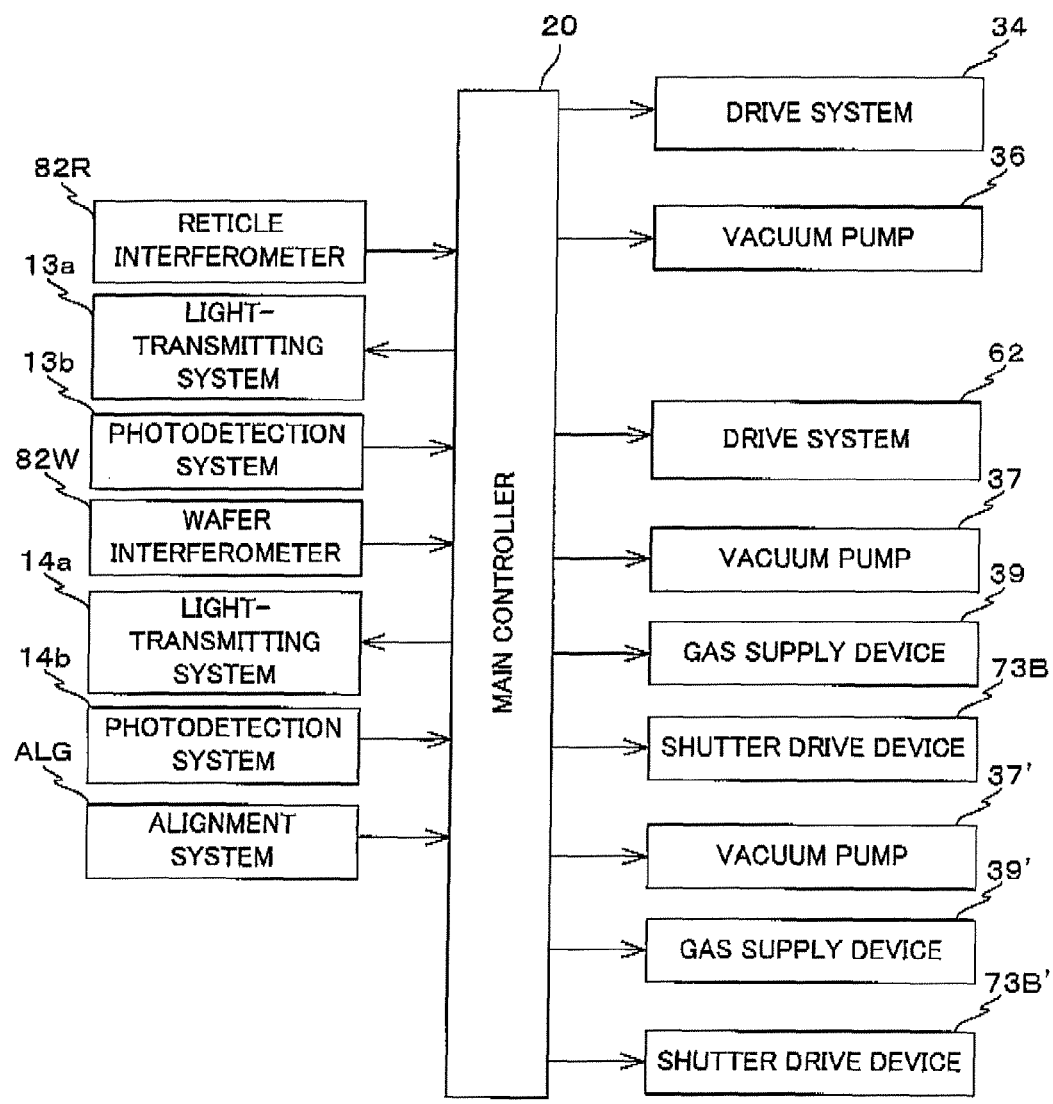
FIG. 10 is a block diagram that shows a control system of the exposure apparatus in the first embodiment.

FIG. 10 shows a control system of exposure apparatus 10 in the embodiment. This control system is mainly configured of main controller 20. Main controller 20 includes a so-called microcomputer (or workstation) consisting of a CPU (Central Processing Unit), ROM (Read Only Memory), RAM (Random Access Memory) and the like, and has overall control over the entire apparatus.

Next, a series of operations in an exposure process by exposure apparatus 10 of the embodiment configured in the manner described above will be described, referring to FIGS. 11A to 13. Incidentally, as a premise, reticle stage RST is to hold a reticle R' which has been exposed, and wafer stage WST is to hold a wafer W' which has been exposed.

Figure 11A:
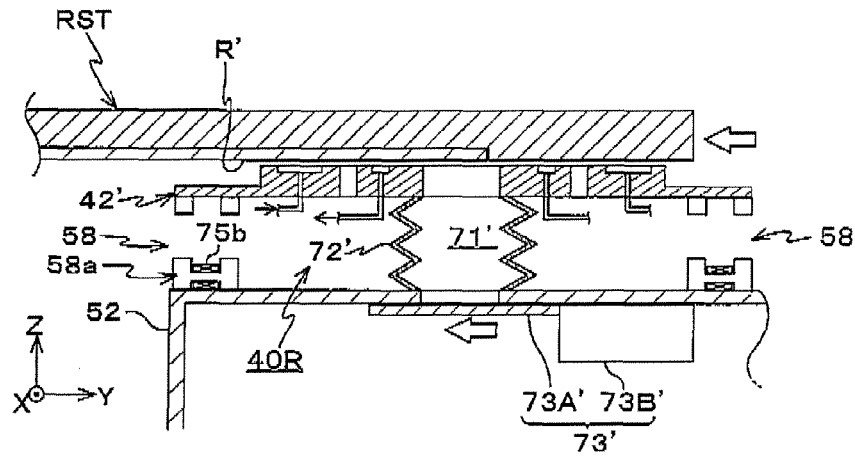
FIGS. 11A to 11C are views for explaining a reticle exchange operation of the exposure apparatus in the first embodiment.
Figure 11B:
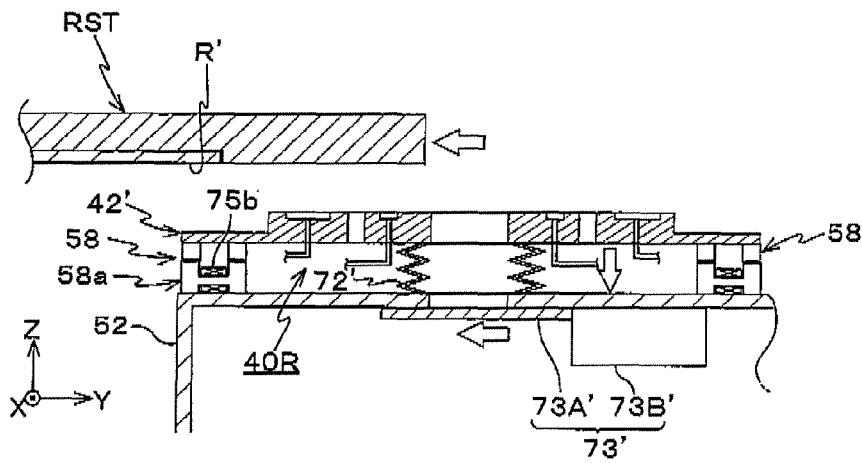
Figure 11C:
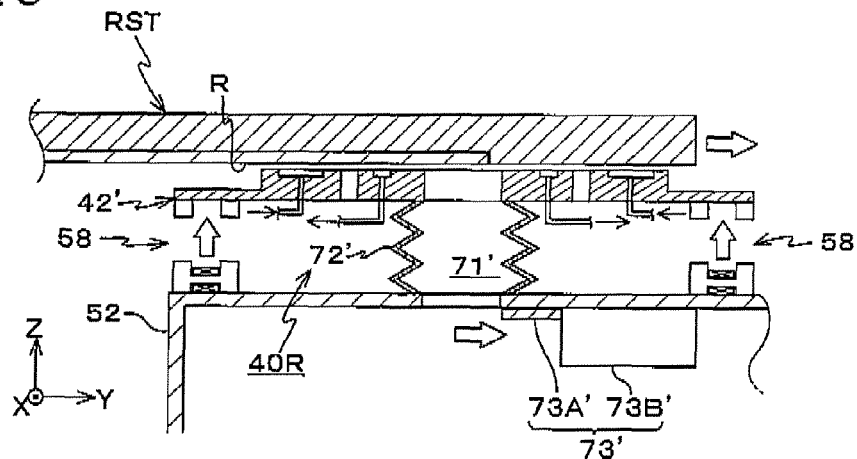

First of all, an exchange operation of a reticle on reticle stage RST will be described. In this exchange operation, first of all, main controller 20 moves reticle stage RST via drive system 34 in the −Y direction toward a predetermined loading position (refer to FIG. 11A). During such movement of reticle stage RST, main controller 20 makes shutter 73A' move into a closed state via a shutter drive unit 73B' and stops the vacuum suction by vacuum pump 37' and the supply of compressed air by gas supply device 39'. By this operation, static gas bearing member 42' moves downward due to its self-weight, as shown in FIG. 11B. Incidentally, by supplying current to coil 75b of electromagnet 58a and generating a magnetic attraction as shown in FIG. 9A so that permanent magnets 58b and 58c are adsorbed using iron core 75a in the state shown in FIG. 11B, static gas bearing member 42' can be fixed to chamber 52. Further, it is desirable to control the movement of reticle stage RST and shutter 73A' so that shutter 73A' closes before the lower surface of reticle R and/or reticle stage RST moves off from through-hole 42a' of static gas bearing member 42'.

Next, main controller 20 exchanges reticle R' held by reticle stage RST to a new reticle R via a reticle carrier system (not shown), in a state where reticle stage RST is positioned at the predetermined loading position.

And, at the stage where the new reticle R is loaded on reticle stage RST, main controller 20 moves reticle stage RST above projection unit PU via drive system 34. Because static gas bearing member 42' will move into a state facing reticle stage RST and/or reticle R in the course of this movement, main controller 20 supplies current to coil 75b of electromagnet 58a of electromagnet/permanent magnet unit 58 and generates a magnetic repulsion in electromagnet/permanent magnet unit 58 as shown in FIG. 9B, so that static gas bearing member 42' is driven upward (refer to FIG. 11C).

Because static gas bearing member 42' moves closer to reticle R and reticle stage RST by this upward drive, main controller 20 operates vacuum pump 37' and gas supply device 39' at an appropriate timing, and furthermore makes shutter 73A' move into an opened state via shutter drive unit 73B' so that the inside of space 71' is set to a vacuum environment.

By the operations described above, the reticle exchange operation on reticle stage RST is completed.

Figure 12A:
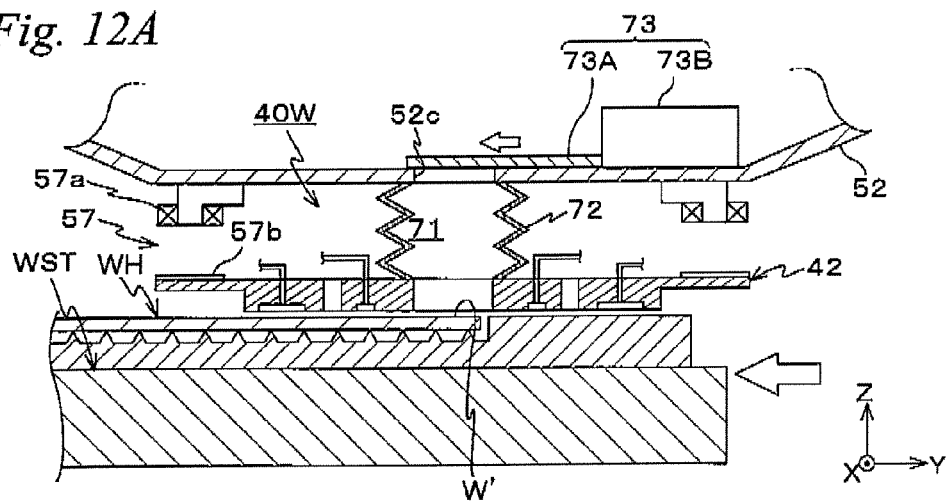
FIGS. 12A to 12C are views for explaining a wafer exchange operation of the exposure apparatus in the first embodiment.
Figure 12B:
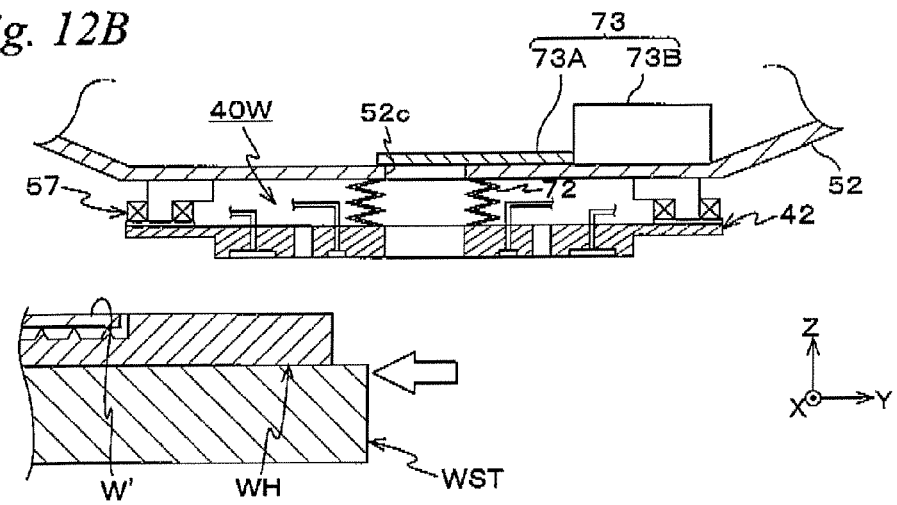

Next, an exchange operation of a wafer on wafer stage WST will be described. In this exchange operation, first of all, main controller 20 moves wafer stage WST via drive system 62 in the −Y direction toward a predetermined loading position (refer to FIG. 12A). During such movement of wafer stage WST, main controller 20 makes shutter 73A move into a closed state via a shutter drive unit 73B and stops the vacuum suction by vacuum pump 37 and the supply of compressed air by gas supply device 39. Further, substantially at the same time as this, main controller 20 supplies current to a coil of electromagnet 57a of electromagnet unit 57 and generates a magnetic attraction in electromagnet unit 57, which drives static gas bearing member 42 upward as shown in FIG. 12B. By this operation, magnetic material member 57b is adsorbed to electromagnet 57a, and static gas bearing member 42 will be fixed to chamber 52. Incidentally, it is desirable to control the movement of wafer stage WST and shutter 73A so that shutter 73A closes before the upper surface of wafer W and/or wafer stage WST moves away from through-hole 42a of static gas bearing member 42.

Next, main controller 20 exchanges wafer W' which has been exposed on wafer stage WST to a new wafer W via a wafer carrier system (not shown), in a state where wafer stage WST is positioned at the predetermined loading position.

Figure 12C:
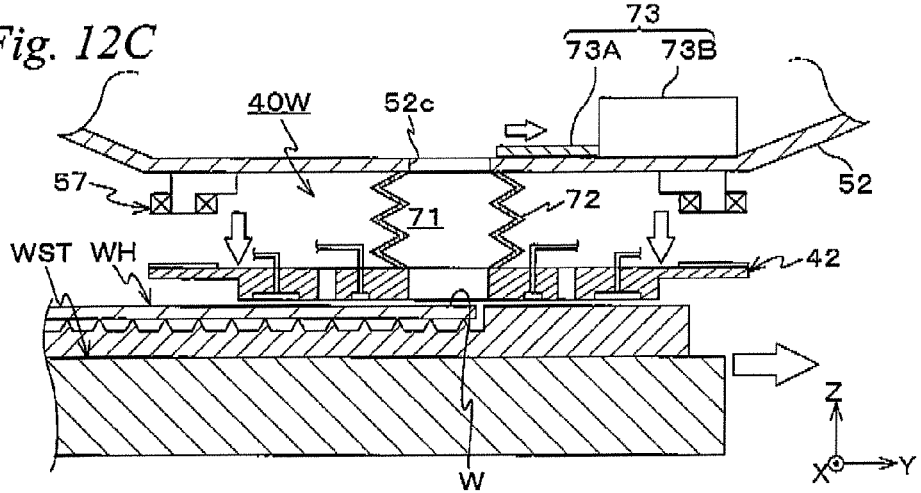

And, at the stage where the new wafer W is loaded on wafer stage WST, main controller 20 moves wafer stage WST below projection unit PU via drive system 62. Because static gas bearing member 42 will move into a state facing wafer stage WST and wafer W in the course of this movement, main controller 20 makes static gas bearing member 42 move downward as shown in FIG. 12C, by releasing the magnetic attraction of electromagnet unit 57. Further, substantially at the same time as this, main controller 20 operates vacuum pump 37 and gas supply device 39, and furthermore, sets space 71 to a vacuum environment by making shutter 73A move into an opened state via shutter drive unit 73B.

By the operations described above, the wafer exchange operation on wafer stage WST is completed. Now, with the reticle exchange operation previously described and the wafer exchange operation, either of the operations can be performed first, however, from the viewpoint of improving throughput, it is desirable to perform a part of the operations in parallel. This point is similar also in the second and the fourth embodiment, which will be described later in the description.

When the reticle exchange and the wafer exchange are completed in the manner described above, main controller 20 controls the position of wafer stage WST and reticle stage RST via drive system 62 and drive system 34 and detects a projected image of a reticle alignment mark (not shown) formed on reticle R on the wafer W surface using an aerial image measuring instrument (not shown) arranged on wafer stage WST, and based on the detection results and the measurement values of interferometers 82R and 82W, obtains the projection position of the reticle pattern image on the wafer W surface. That is, main controller 20 performs reticle alignment.

Next, main controller 20 drives wafer stage WST so that the aerial image measuring instrument is located just under alignment system ALG (refer to FIG. 10), and based on detection signals of alignment system ALG and the measurement values of wafer interferometer 82W at that time, indirectly obtains the relative distance of the projection position of the pattern image of reticle R on the wafer W surface and alignment system ALG, or more specifically, obtains the baseline of alignment system ALG.

When such base line measurement is completed, main controller 20 performs wafer alignment of the so-called EGA method whose details are disclosed in, for example, Kokai (Japanese Patent Unexamined Application Publication) No. 61-44429 bulletin (and the corresponding U.S. Pat. No. 4,780,617 description), and computes the position coordinates of all the shot areas on wafer W.

Then, main controller 20 performs exposure operation by the step-and-scan method in the following manner. More specifically, main controller 20 moves wafer stage WST to a scanning starting position (acceleration starting position) for exposure of the first shot area, while monitoring positional information from wafer interferometer 82W according to the positional information of each shot area on wafer W which was obtained as a result of wafer alignment, and also moves reticle stage RST to a scanning starting position (acceleration starting position) and performs scanning exposure on the first shot area. On this scanning exposure, main controller 20 performs Z position control and an attitude control of reticle R and wafer W, based on the measurement values of the reticle focus sensor (13a, 13b) and the wafer focus sensor (14a, 14b), respectively. Main controller 20 drives reticle stage RST and wafer stage WST in opposite directions mutually while performing Z position and attitude control of reticle R and wafer W, along with controlling the speed of both stages so that the velocity ratio of both stages accurately coincides with the projection magnification of projection optical system PO, and performs exposure (transfer of the reticle pattern). Accordingly, on the first shot area on wafer W, for example, a transferred image of the circuit pattern is formed. Incidentally, as an example, each shot area on wafer W has a size of 26 mm (width)*33 mm (length in the scanning direction).

When scanning exposure of the first shot area is completed in the manner described above, main controller 20 performs a stepping operation between shot areas so as to move wafer stage WST to a scanning starting position (acceleration starting position) for exposure of the second shot area. And scanning exposure of the second shot area is performed in a manner similar to the description above. Hereinafter, a similar operation is performed from the third shot area onward.

The stepping operation between shot areas and the scanning exposure operation to a shot area are repeated in the manner described above, and the pattern of reticle R is transferred onto all of the shot areas on wafer W by the step-and-scan method.

During the scanning exposure described above, because EUV light EL emitted from light source device 12 reaches wafer W passing through a vacuum environment such as space 71' formed by vacuum chamber 11, chamber 52, and seal unit 42R and space 71 formed by seal unit 42W, almost none of the EUV light EL is absorbed by other materials such as oxygen before the light reaches wafer W.

Figure 13:
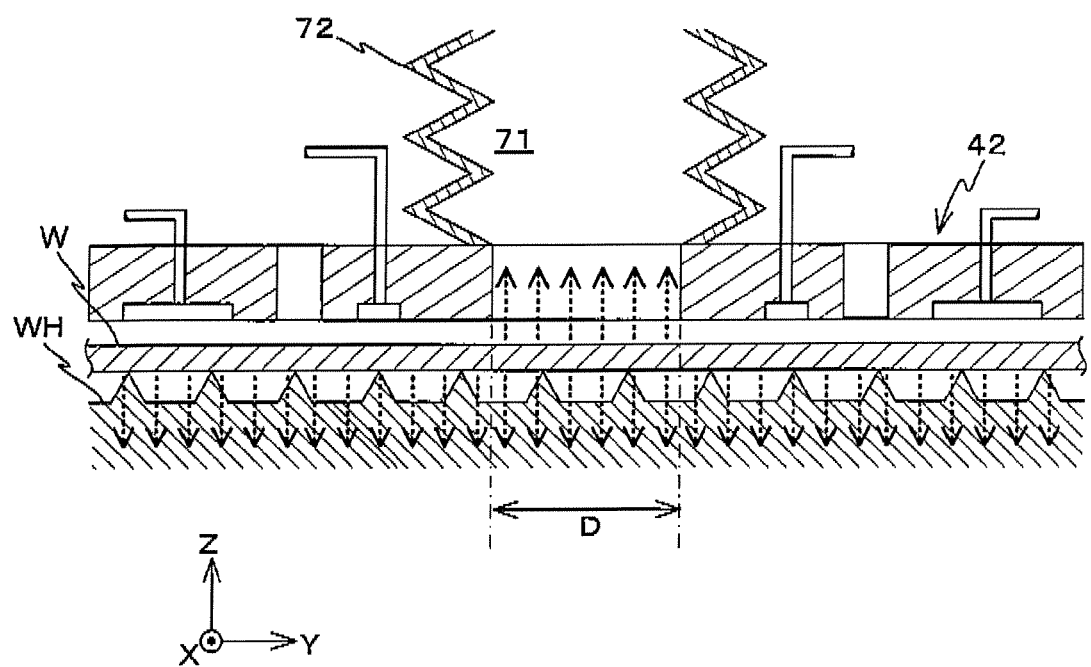
FIG. 13 is a view for explaining the operation of a vacuum suction holding by a space 71 and a wafer holder WH acting on a wafer.

Further, in the embodiment, as shown in FIG. 13, because wafer W is held by vacuum suction by wafer holder WH along with area D on the upper surface wafer W being set to a vacuum environment, the upper surface side and the lower surface side of wafer W are both under negative pressure, which can make the force acting on the upper surface and the lower surface of wafer W approximately equal. This allows the range (the range including the area where EUV light EL is irradiated) of area D on wafer W to be kept extremely flat.

As discussed in detail above, according to exposure apparatus 10 of the embodiment, seal unit 40W includes a loop shaped static gas bearing member 42, which is located on the outgoing side of EUV light EL from projection optical system PO and forms a predetermined clearance between wafer W and wafer holder WH placed in the vicinity of the lower end of chamber 52, and isolates the inside of chamber 52 (and the inside of space 71) from the outside. Accordingly, even if a vacuum chamber for housing wafer W, wafer holder WH, and wafer stage WST is not arranged as in the conventional method, a vacuum environment can be maintained in the periphery of the beam path of EUV light EL. This makes it possible to reduce the entire size of exposure apparatus 10. Further, because access to the vicinity of wafer stage WST will become easier, maintenance of wafer stage WST and the like can be performed easily. Further, even if the inside of chamber 52 and space 71 are isolated from the outside by seal unit 40W, because static gas bearing member 42 is configured of a transparent member, static gas bearing member 42 does not interfere with the irradiation of the detection beam of the wafer focus sensor (14a, 14b) placed exterior to static gas bearing member 42 on wafer W. This allows detection of surface position information of wafer W even while space 71 is formed with wafer W by seal unit 40W (for example, during exposure operation), therefore, by performing position control and the like of wafer W based on the surface position information, exposure with high precision becomes possible.

Further, in the case the whole wafer stage WST is housed in a vacuum chamber and the wafer focus sensor (14a, 14b) is also housed in the vacuum chamber, a risk occurs of the vacuum chamber itself being deformed by the difference in pressure inside and outside the vacuum chamber and the measurement accuracy of the wafer focus sensor (14a, 14b) deteriorating, however, in the embodiment, because neither wafer stage WST nor the wafer focus sensor (14a, 14b) is housed in a vacuum chamber, the deterioration of the measurement accuracy of the wafer focus sensor (14a, 14b) due to the reason above does not occur. Further, because the interferometer which measures the position of wafer stage WST is not arranged on the inner wall of the vacuum chamber, the deformation of the vacuum chamber by the difference in pressure inside and outside the vacuum chamber, or consequently, the deterioration of the measurement accuracy of the interferometer will not occur.

Further, because wafer stage WST and the whole wafer holder WH are not housed in the vacuum chamber, it is not necessary to prepare a vacuum compliant wafer stage and a wafer holder. That is, for example, in the case the whole wafer stage WST is housed in a vacuum chamber, a wafer holder by the electrostatic chuck method was often used as wafer holder WH, however, in the embodiment, the wafer holder by the electrostatic chuck method does not have to be used. Accordingly, it is possible to use a wafer holder by the vacuum chuck method, as in a light exposure apparatus or the like that uses light such as an ArF excimer laser. Further, of each section that configures wafer stage WST, because air pads or the like can be used for portions where a non-contact manner should be maintained, the degree of freedom in design increases, which makes a reduction in cost or the like possible.

Further, according to the embodiment, because wafer holder WH vacuum suctions wafer W and space 71 in seal unit 40W is also set to a vacuum environment, the section of wafer W sandwiched by wafer holder WH and seal unit 40W (the section on which EUV light EL is irradiated) becomes extremely flat. This makes it possible to carry out exposure with high precision.

Further, according to exposure apparatus 10 of the embodiment, seal unit 40R includes a loop shaped static gas bearing member, which is located on the incidence side of projection optical system PO of EUV light EL and forms a predetermined clearance between reticle R and reticle stage RST placed in the vicinity of the upper end section of chamber 12, and isolates the inside of the optical system chamber (and the inside of space 71') from the outside. Accordingly, even if a vacuum chamber for housing reticle R or reticle stage RST is not arranged as in the conventional method, a vacuum environment can be maintained in the periphery of the beam path of EUV light EL. This makes it possible to reduce the entire size of exposure apparatus 10. Further, because access to the vicinity of reticle stage RST will become easier, maintenance of reticle stage RST and the like can be performed easily. Further, even if the inside of chamber 52 and space 71' are isolated from the outside by seal unit 40R, because static gas bearing member 42' is configured of a transparent member, static gas bearing member 42' does not interfere with the irradiation of the detection beam of the reticle focus sensor (13a, 13b) placed exterior to static gas bearing member 42' on reticle R. This allows detection of surface position information of the patterned surface of reticle R even while space 71' is formed with reticle R by seal unit 40R (for example, during exposure operation), therefore, by performing position control and the like of reticle R based on the surface position information, exposure with high precision becomes possible.

Further, in the embodiment, by using a reticle holder by the vacuum chuck method as the reticle holder which holds the reticle, the section of reticle R on which EUV light is irradiated can be maintained extremely flat, similar to the wafer side.

Figure 14:
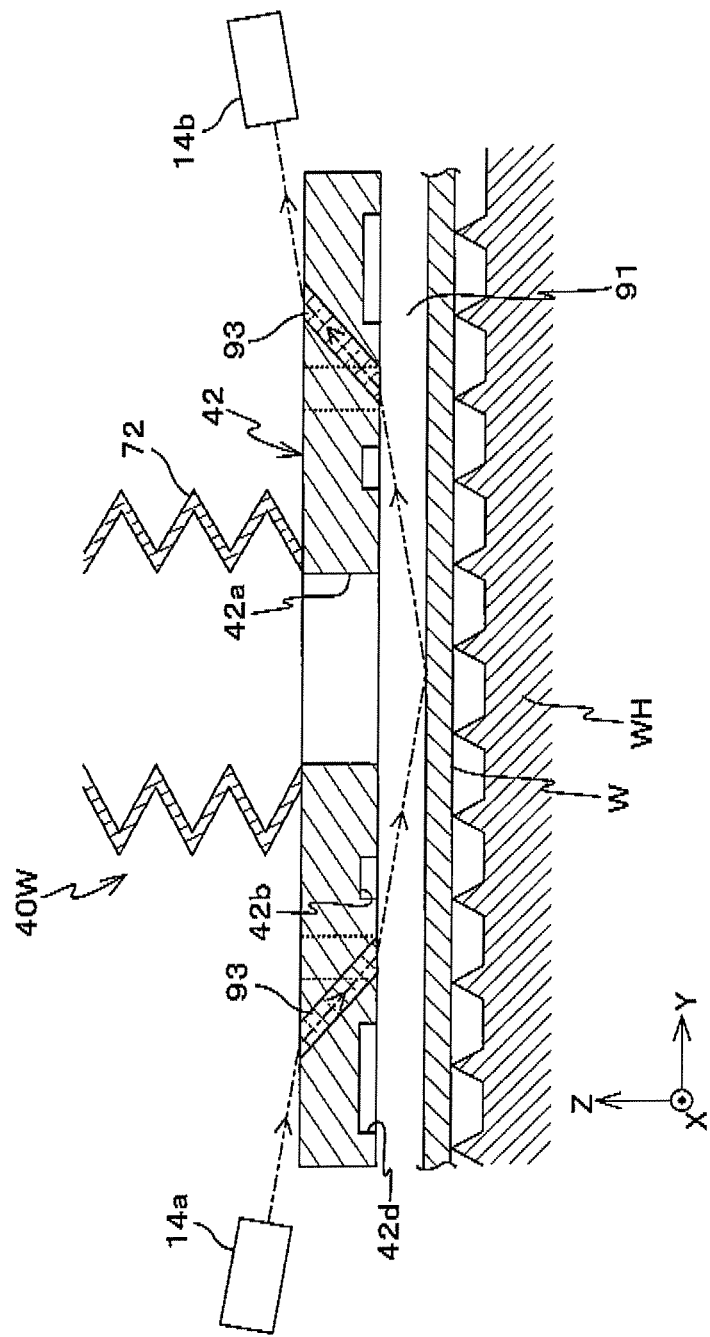
FIG. 14 is a view that shows a modified example.

Incidentally, in the embodiment above, the case has been described where the whole static gas bearing member 42 of seal unit 40W was made from a transparent member, however, the present invention is not limited to this, and for example, the static gas bearing member can be made so that only the section where the detection beam passes is made with a transparent member 93, as shown in FIG. 14. Further, static gas bearing member 42' of seal unit 40R can be made similarly, so that only a part of the static gas bearing member is made using a transparent member.

Figure 15:
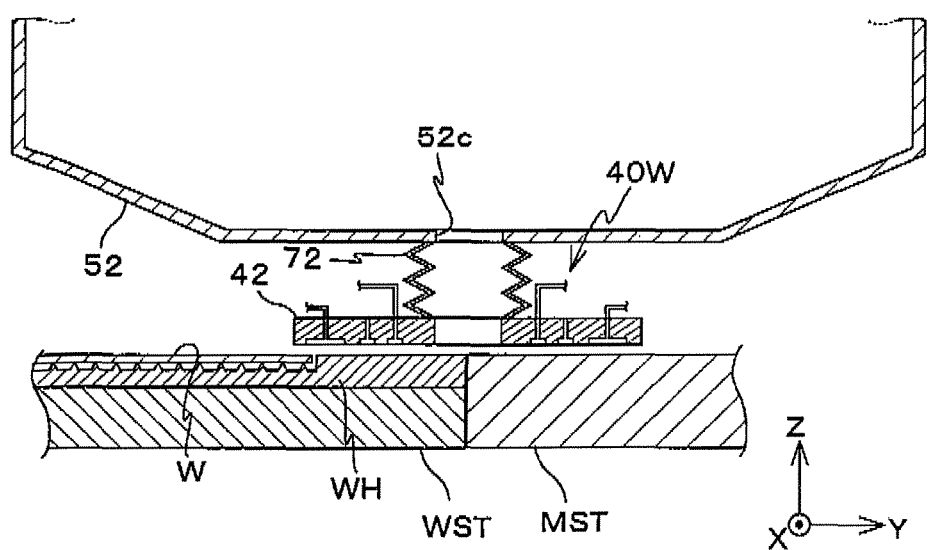
FIG. 15 is a view that shows a modified example of the static gas bearing member.

Incidentally, in the embodiment above, the case has been described where a configuration was employed in which opening 52c is set to a closed state using shutter unit 73 as an example so as to prevent gas flowing into chamber 52 from the outside when wafer exchange is performed, however, the present invention is not limited to this. For example, in the case exposure apparatus 10 is equipped with a measurement stage MST having measuring instruments (measuring members) used for various measurements separately from wafer stage WST as shown in FIG. 15, on wafer exchange, both stages WST and MST are made to move under static gas bearing member 42 while wafer stage WST and measurement stage MST are made to maintain a contact or proximity state as shown in FIG. 15. This constantly maintains a clearance between wafer stage WST and/or measurement stage MST and static gas bearing member 42 during the movement, which makes it possible to maintain the air tightness in space 71.

Further, regarding the reticle side, a stage different from reticle stage RST can be arranged, and on reticle exchange, in order to maintain air tightness in space 71', both stages can be made to move above static gas bearing member 42' while reticle stage RST and the different stage are made to maintain a contact or proximity state as shown in FIG. 14.

In the description so far, the case has been described where at least a part of static gas bearing member 42 of seal unit 40W and static gas bearing member 42Y of seal unit 40R are transparent, however, the present invention is not limited to this. For example, in the case static gas bearing members 42' and 42 do not become an obstacle during exposure and measurement using the reticle focus sensor (13a, 13b) and the wafer focus sensor (14a, 14b) is possible, for example, such as when the reticle focus sensor (13a, 13b) and the wafer focus sensor (14a, 14b) can be placed inside of chamber 52, static gas bearing members 42' and 42 can be formed with an opaque member (for example, metal and the like). In such a case, the range of choices of the material which make up static gas bearing members 42' and 42 widens, and as a result, cost reduction becomes possible.

A Second Embodiment

Next, a second embodiment of the present invention will be described, referring to FIGS. 16 to 24B. Here, the same reference numerals will be used for the same or similar sections as in the first embodiment previously described, and a detailed description thereabout will be omitted.

Figure 16:
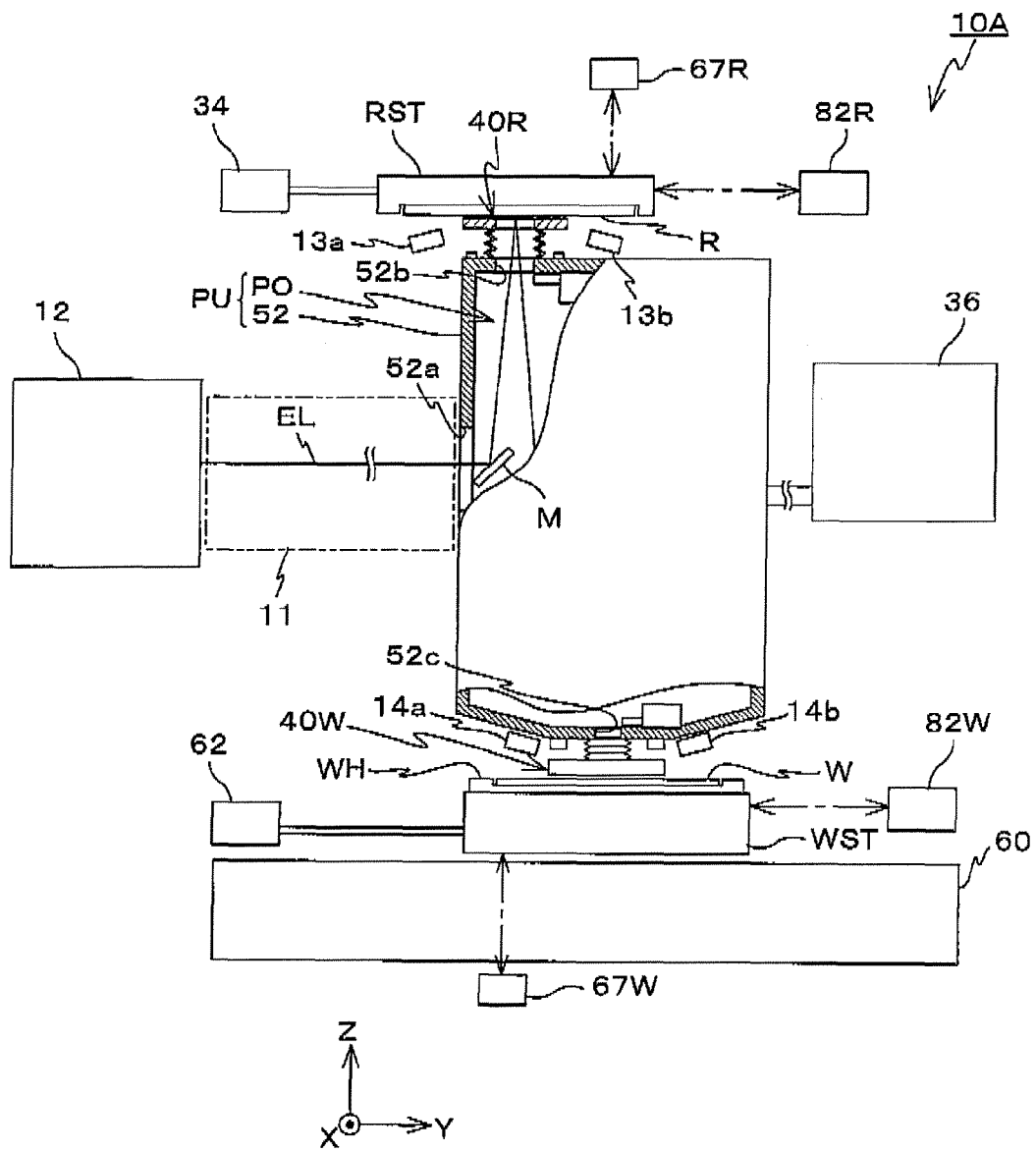
FIG. 16 is a view that schematically shows a configuration of an exposure apparatus of a second embodiment.
Figure 17:
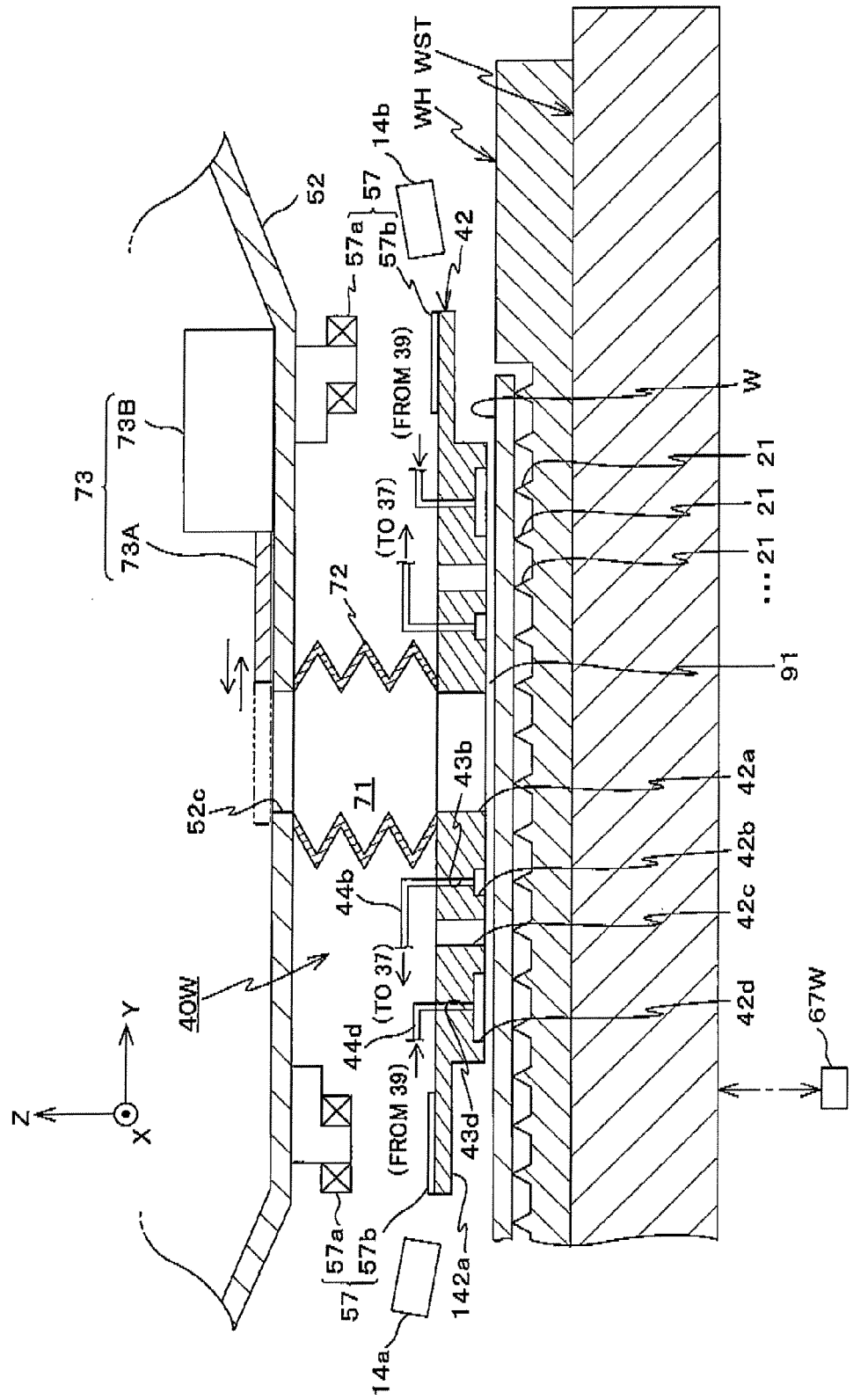
FIG. 17 is a longitudinal sectional view that shows a wafer side seal unit of the exposure apparatus in the second embodiment and its periphery.
Figure 18:
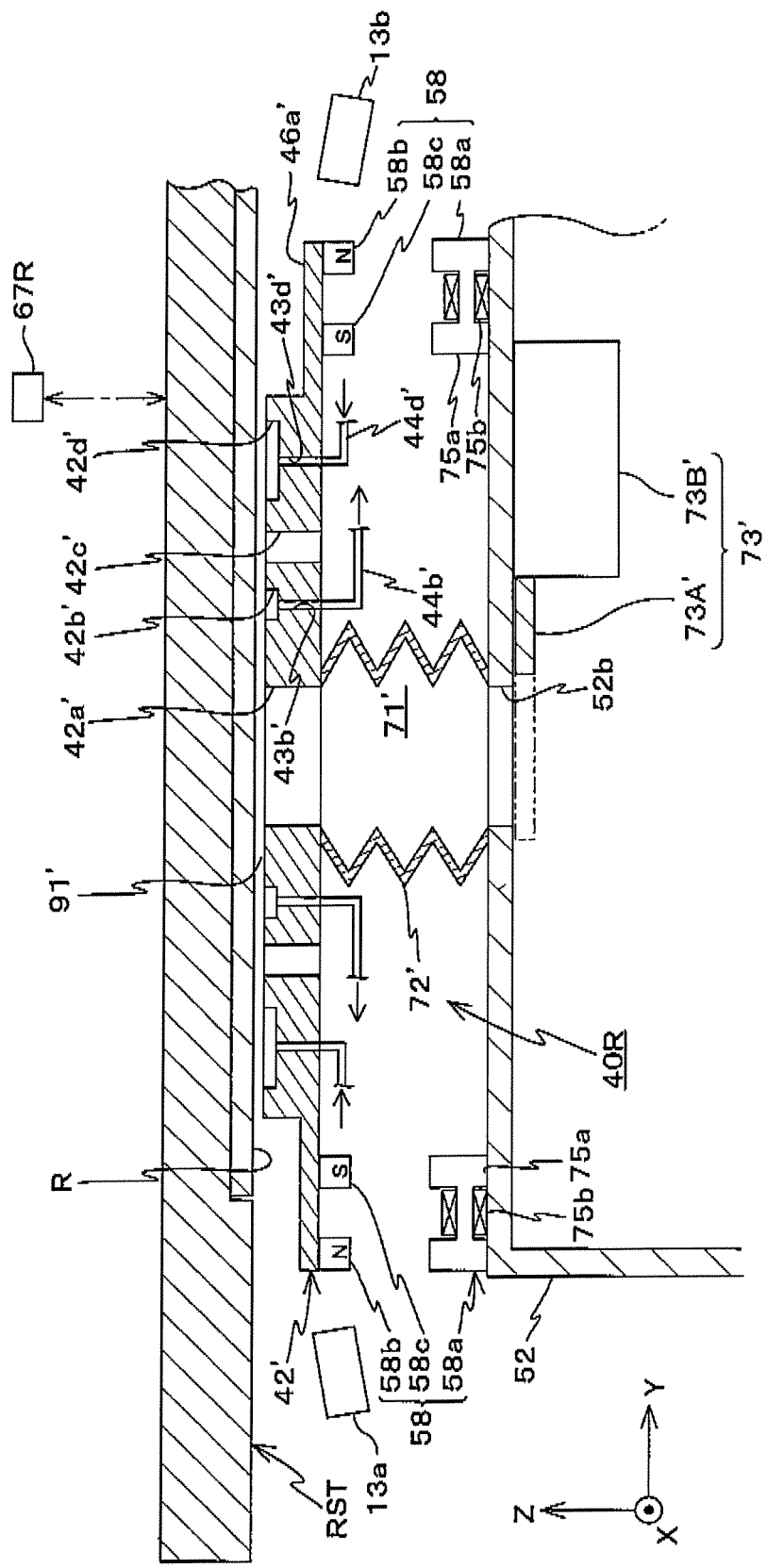
FIG. 18 is a longitudinal sectional view that shows a reticle side seal unit of the exposure apparatus in the second embodiment and its periphery.
Figure 19:
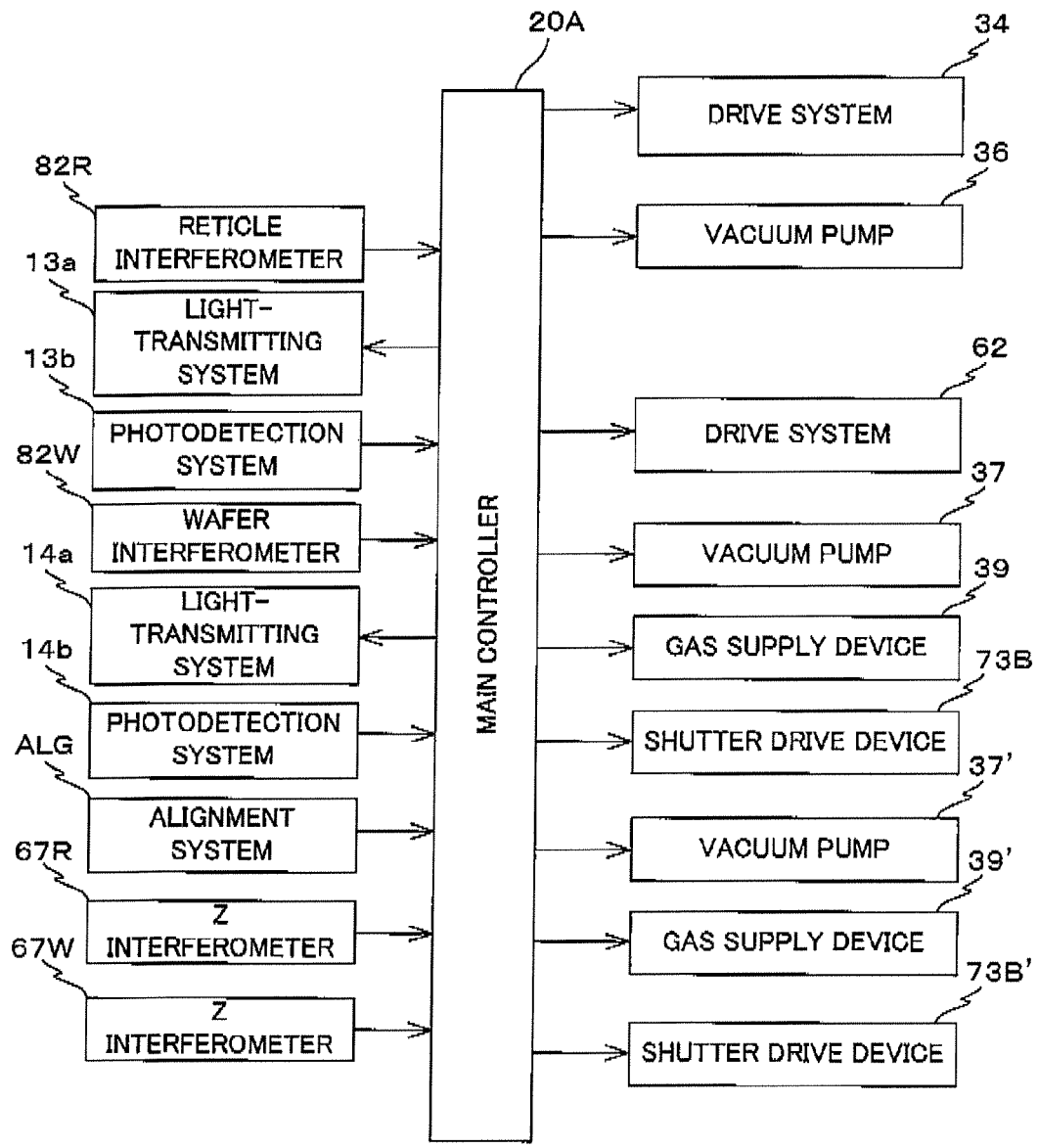
FIG. 19 is a block diagram that shows a control system of the exposure apparatus in the second embodiment.

FIG. 16 schematically shows the entire configuration of an exposure apparatus 10A of the second embodiment. Further, FIG. 17 shows a longitudinal sectional view of a seal unit 40W of the wafer side and its periphery, equipped in exposure apparatus 10A. Further, FIG. 18 shows a longitudinal sectional view of a seal unit 40R of the reticle side and its periphery, equipped in exposure apparatus 10A. Further, FIG. 19 is a block diagram showing an arrangement of a control system in exposure apparatus 10A.

Similar to exposure apparatus 10, exposure apparatus 10A transfers the entire circuit pattern of a reticle R onto each of a plurality of shot areas on a wafer W by the step-and-scan method, by relatively scanning reticle R and wafer W in a one-dimension direction (the Y-axis direction) with respect to a projection unit FU while projecting a part of the circuit pattern formed on reticle R via a projection optical system PO in projection unit PU on wafer W.

As it can be seen when comparing FIG. 16 and FIG. 1, exposure apparatus 10A is basically configured similar to exposure apparatus 10 of the first embodiment previously described. However, in exposure apparatus 10A, static gas bearing member 42' configuring seal unit 40R and static gas bearing member 42 configuring seal unit 40W are both made from a material other than a transparent member, which is different from exposure apparatus 10. Because of this, in exposure apparatus 10A, during exposure, the Z position or the like of reticle R and wafer W cannot be detected using a reticle focus sensor (13a, 13b) and a wafer focus sensor (14a, 14b), respectively. Therefore, in exposure apparatus 10A, a method is employed where the surface position information (unevenness information) of the reticle and the wafer is measured beforehand prior to exposure, and Z position and inclination control of reticle R (reticle stage RST) and wafer W (wafer stage WST) is performed on exposure, using the surface position information which has been measured.

In exposure apparatus 10A, in order to realize the Z position and inclination control described above, a Z interferometer 7R is arranged above reticle stage RST as shown in FIGS. 16 and 18, and a Z interferometer 67W is arranged below wafer stage WST as shown in FIGS. 16 and 17. And, in exposure apparatus 10A, the Z position of reticle stage RST (reticle R) can be measured by Z interferometer 67R, and the Z position of wafer stage WST (reticle W) can also be measured by Z interferometer 67W. The measurement values of Z interferometer 67R and 67W are supplied to a main controller 20A (refer to FIG. 19).

The configuration of other sections is similar to exposure apparatus 10 of the first embodiment previously described.

Next, an operation in an exposure process by exposure apparatus 10A of the second embodiment configured in the manner described above will be described, referring to FIGS. 20A to 24. Incidentally, as a premise, reticle stage RST is to hold a reticle R' which has been exposed, and wafer stage WST is to hold a wafer W' which has been exposed.

Figure 20A:
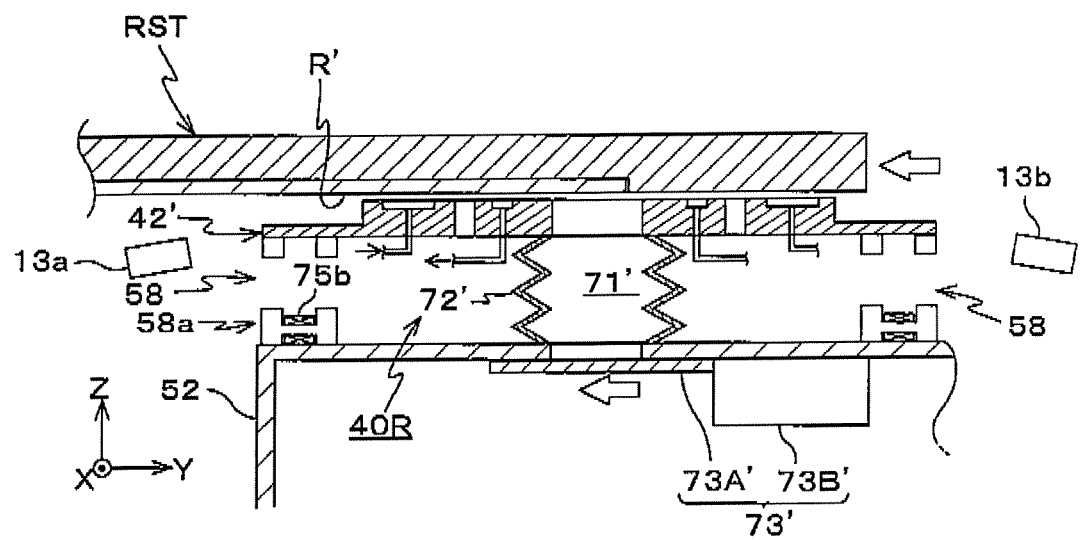
FIGS. 20A and 20B are views (No. 1) for explaining a reticle exchange operation of the exposure apparatus in the second embodiment.
Figure 20B:
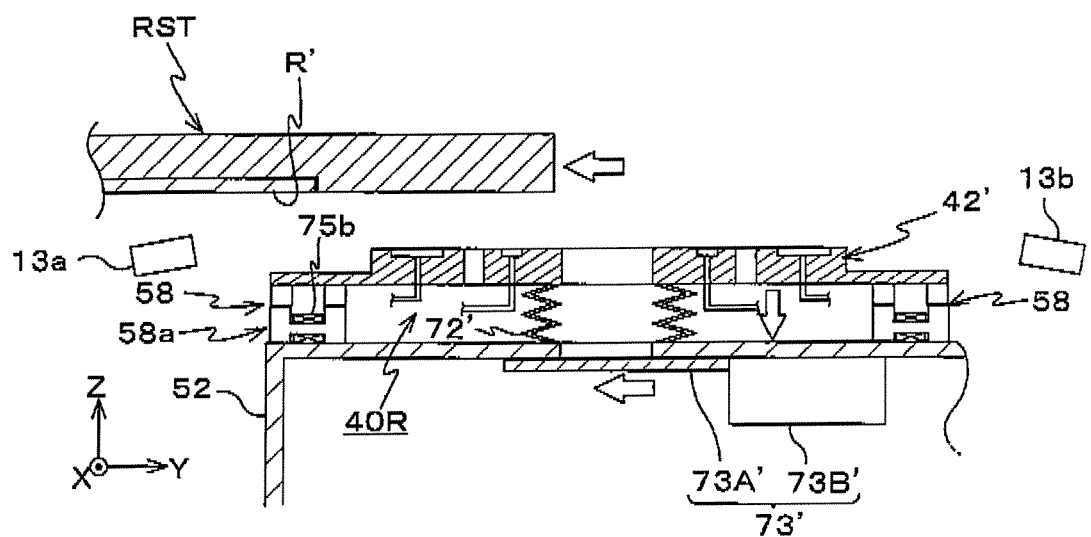

First of all, an exchange operation of a reticle on reticle stage RST and a measurement operation (a mapping operation) by the reticle focus sensor (13a, 13b) will be described. In this exchange operation, first of all, main controller 20A moves reticle stage RST in the −Y direction toward a predetermined loading position (refer to FIG. 20A) as is previously described. During such movement of reticle stage RST in the −Y direction, main controller 20A makes shutter 73A' move into a closed state via a shutter drive unit 73B' and stops the vacuum suction by vacuum pump 37' and the supply of compressed air by gas supply device 39'. By this operation, static gas bearing member 42' moves downward due to its self-weight, as shown in FIG. 20B. Incidentally, by supplying current to coil 75b of electromagnet 58a and generating a magnetic attraction in electromagnet/permanent magnet unit 58, and adsorbing permanent magnets 58b and 58c using iron core 75a in the state shown in FIG. 20B, static gas bearing member 42' can be fixed to chamber 52.

Next, main controller 20A exchanges reticle R' held by reticle stage RST to a new reticle R via a reticle carrier system (not shown), in a state where reticle stage RST is positioned at the predetermined loading position.

Figure 21A:
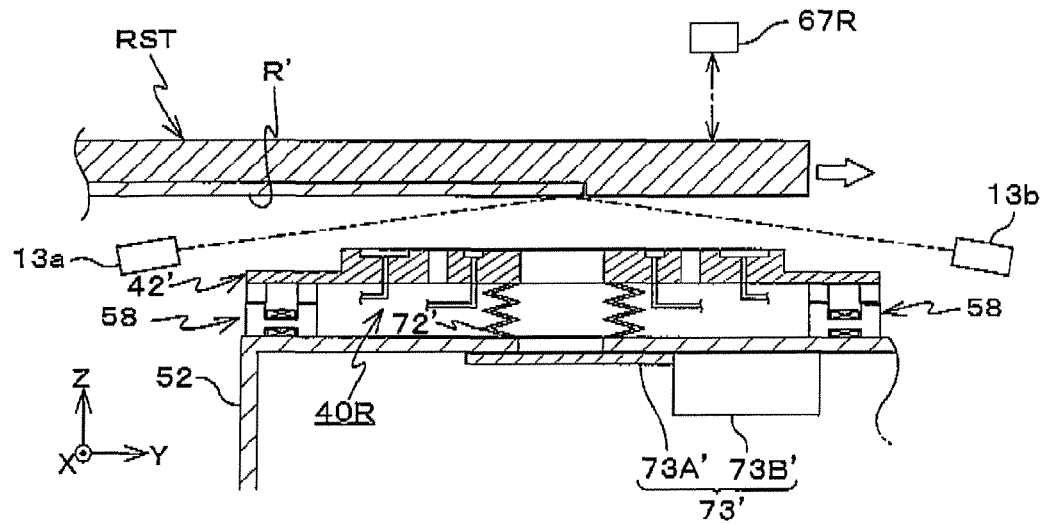
FIGS. 21A and 21B are views (No. 2) for explaining a reticle exchange operation of the exposure apparatus in the second embodiment.

And, at the stage where the new reticle R is loaded on reticle stage RST, main controller 20A moves reticle stage RST above projection unit PU via drive system 34. In this case, because static gas bearing member 42' has moved to the lower side (the −Z side) as shown in FIG. 20B, the detection beam of the reticle focus sensor (13a, 13b) can be irradiated on the lower surface of reticle R as shown in FIG. 21A, without static gas bearing member 42' interfering with the irradiation. Accordingly, main controller 20A measures positional information of the pattern surface of reticle R in the Z-axis direction, using the reticle focus sensor (13a, 13b), while moving reticle stage RST in the +Y direction from the position shown in FIG. 21A and monitoring the measurement values of reticle interferometer 82R and the measurement values of Z interferometer 67R. And, by this operation, surface position information on the entire surface of the patterned surface of reticle R, or more specifically, the Z position and the inclination (rotation quantity in the θx and θy directions) with respect to the XY plane can be obtained.

Then, main controller 20A relates the measurement values of interferometers 82R and 67R to the measurement values of the reticle focus sensor (13a, 13b), which serve as mapping data, and stores the information in a memory (not shown).

Figure 21B:
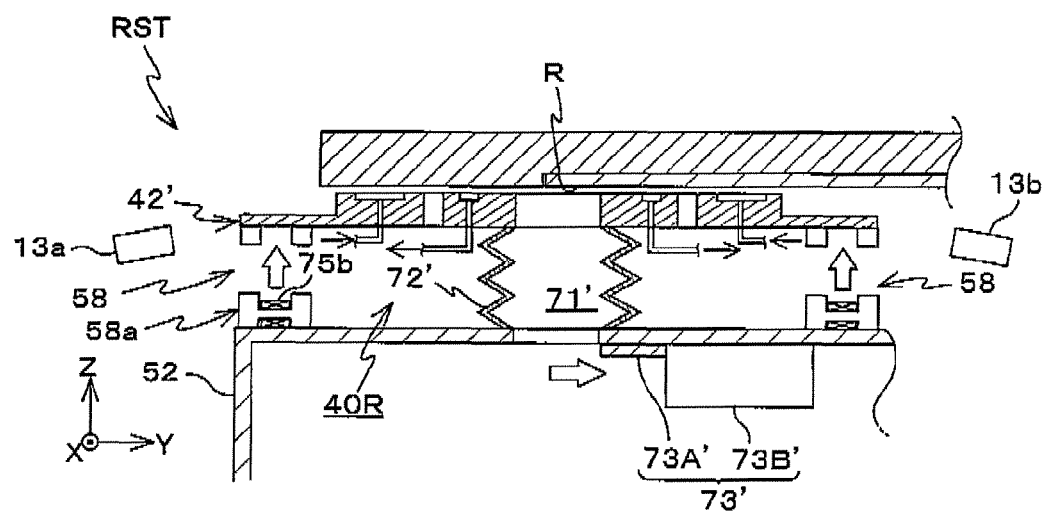

At the stage when the measurement of reticle R has been completed, reticle stage RST has been moved to the position shown in FIG. 21B. In this state, main controller 20A supplies current to coil 75b of electromagnet 58a of electromagnet/ permanent magnet unit 58, and generates a magnetic repulsion in electromagnet/permanent magnet unit 58 so that static gas bearing member 42' is driven upward (refer to FIG. 21B).

Because static gas bearing member 42' moves closer to reticle R and reticle stage RST by this upward drive, main controller 20A operates vacuum pump 37' and gas supply device 39' at an appropriate timing, and furthermore makes shutter 73A' move into an opened state via shutter drive unit 73B' so that the inside of space 71' is set to a vacuum environment.

By the operations described above, the reticle exchange operation on reticle stage RST and the measurement operation (the mapping operation) by the reticle focus sensor (13a, 13b) are completed.

Figure 22A:
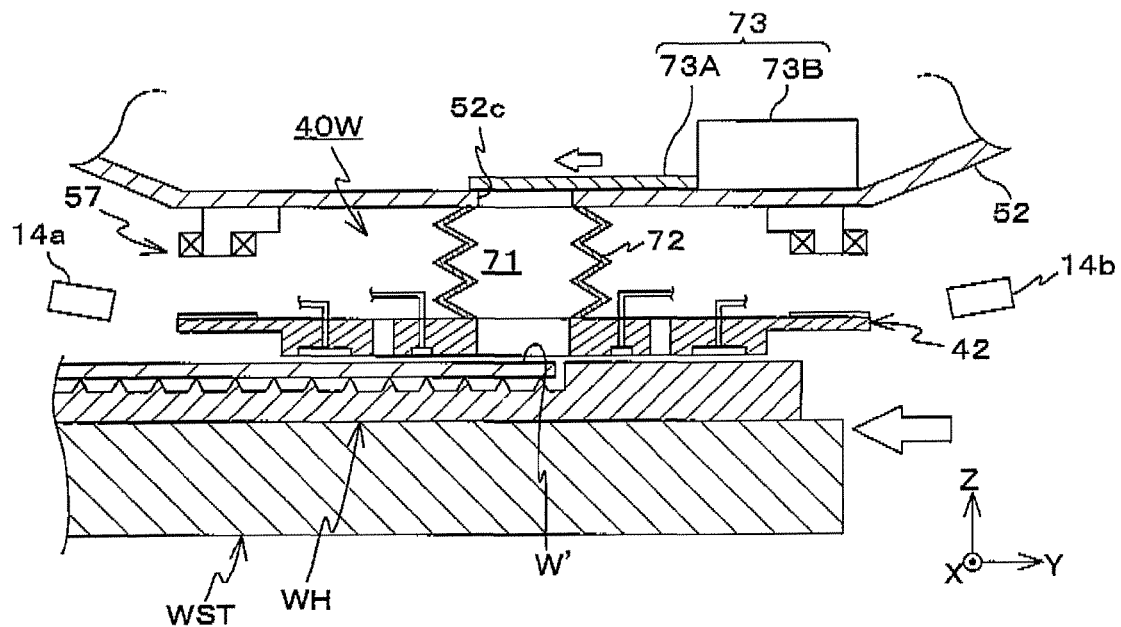
FIGS. 22A and 22B are views (No. 1) for explaining a wafer exchange operation of the exposure apparatus in the second embodiment.
Figure 22B:
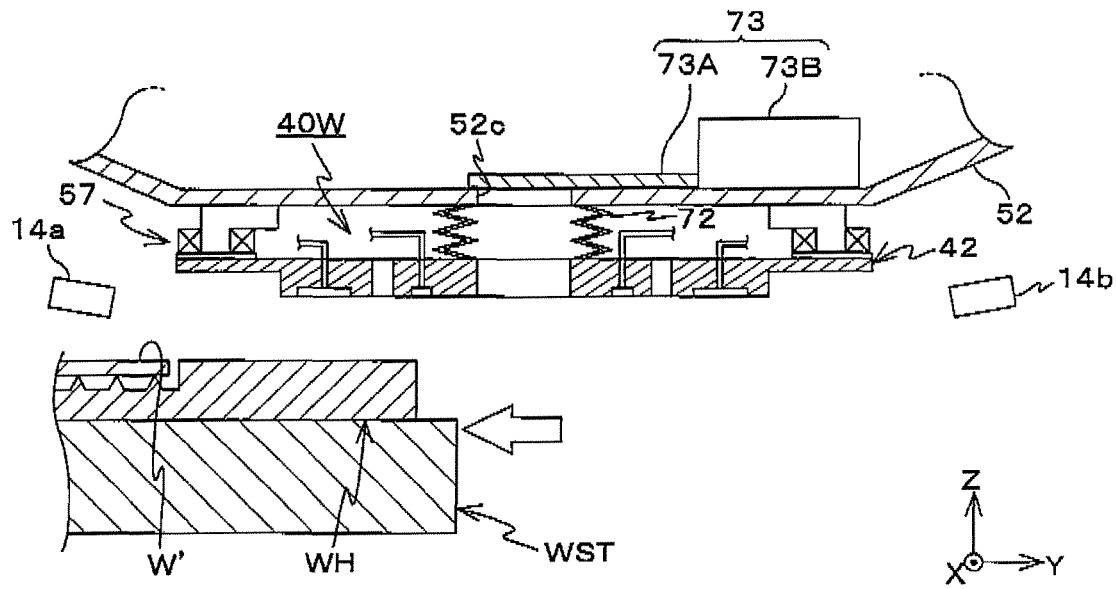

Next, an exchange operation of a wafer on wafer stage WST and a measurement operation (a mapping operation) by the wafer focus sensor (14a, 14b) will be described. In this exchange operation, first of all, main controller 20A moves wafer stage WST via drive system 62 in the −Y direction toward a predetermined loading position (refer to FIG. 22A). During such movement of wafer stage WST, main controller 20SA makes shutter 73A move into a closed state via a shutter drive unit 73B and stops the vacuum suction by vacuum pump 37 and the supply of compressed air by gas supply device 39. Further, substantially at the same time as this, main controller 20A supplies current to a coil of electromagnet 57a of electromagnet unit 57 and generates a magnetic attraction between electromagnet 57 and magnet material member 57b, which drives static gas bearing member 42 upward as shown in FIG. 22B. By this operation, magnetic material member 57b is adsorbed to electromagnet 57a, and static gas bearing member 42 will be fixed to chamber 52.

Next, main controller 20A exchanges wafer W' which has been exposed on wafer stage WST to a new wafer W via a wafer carrier system (not shown), in a state where wafer stage WST is positioned at the predetermined loading position.

Figure 23A:
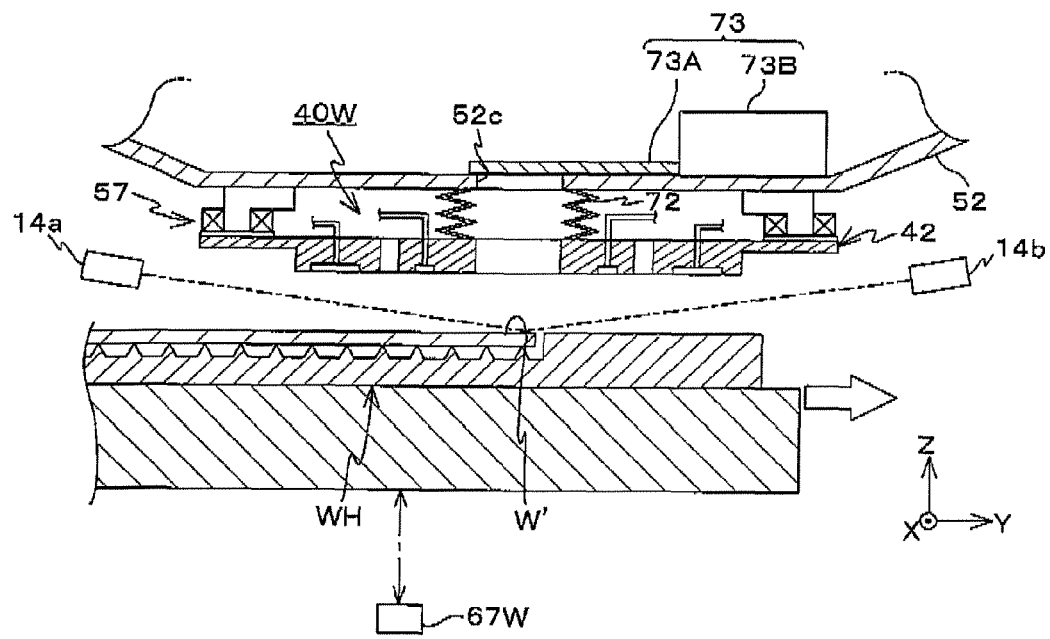
FIGS. 23A and 23B are views (No. 2) for explaining a wafer exchange operation of the exposure apparatus in the second embodiment.
Figure 24A:
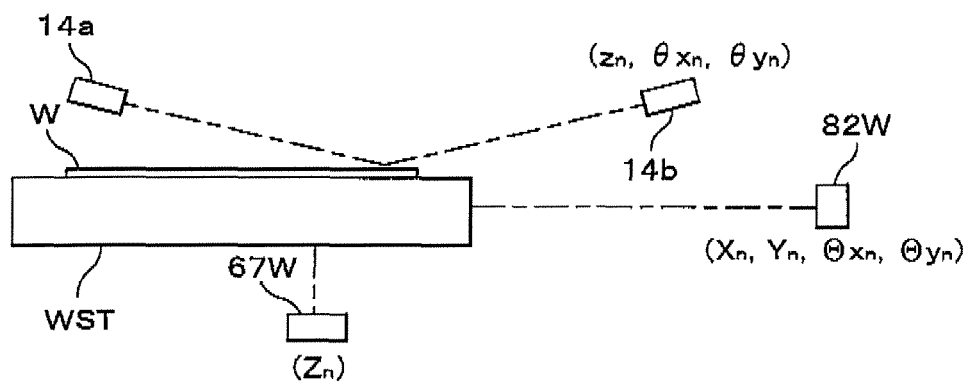
FIG. 24A is a view for explaining mapping data stored in memory that the exposure apparatus of the second embodiment comprises.

And, at the stage where the new wafer W is loaded on wafer stage WST, main controller 20A moves wafer stage WST below projection unit PU via drive system 62. In this case, because static gas bearing member 42 has been moved upward as shown in FIG. 22B, the detection beam of the wafer focus sensor (14a, 14b) can be irradiated on the upper surface of wafer W without static gas bearing member 42 interfering with the irradiation as shown in FIG. 23A. Accordingly, main controller 20A measures positional information of the surface of wafer W in the Z-axis direction using the wafer focus sensor (14a, 14b), while moving wafer stage WST within the XY plane from the position shown in FIG. 23A and monitoring the measurement values of wafer interferometer 82W and the measurement values of Z interferometer 67W. And, by this operation, surface position information on the entire surface of the surface of wafer W, or more specifically, the Z position and the inclination (rotation quantity in the θx and θy directions) with respect to the XY plane can be obtained. Then, main controller 20A relates the measurement values of interferometers 82W and 67W to the measurement values of the wafer focus sensor (14a, 14b), which serve as mapping data, and stores the information in the memory (not shown). This mapping data, for example, is an associated data of the X position (referred to as $X_n$) and Y position (referred to as $Y_n$) of wafer stage WST measured by wafer interferometer 82W, the rotation around the X-axis (referred to as $\Theta x_n$) and the rotation around the Y-axis (referred to as $\Theta y_n$) measured by wafer interferometer 82W, the Z position of wafer stage WST (referred to as $Z_n$) measured by Z interferometer 67W, the Z position of the wafer W surface (referred to as $z_n$), the rotation around the X-axis (referred to as $\theta x_n$) and the rotation around the Y-axis (referred to as $\theta y_n$) measured by the wafer focus sensor (14a, 14b), as shown in FIG. 24A.

Figure 23B:
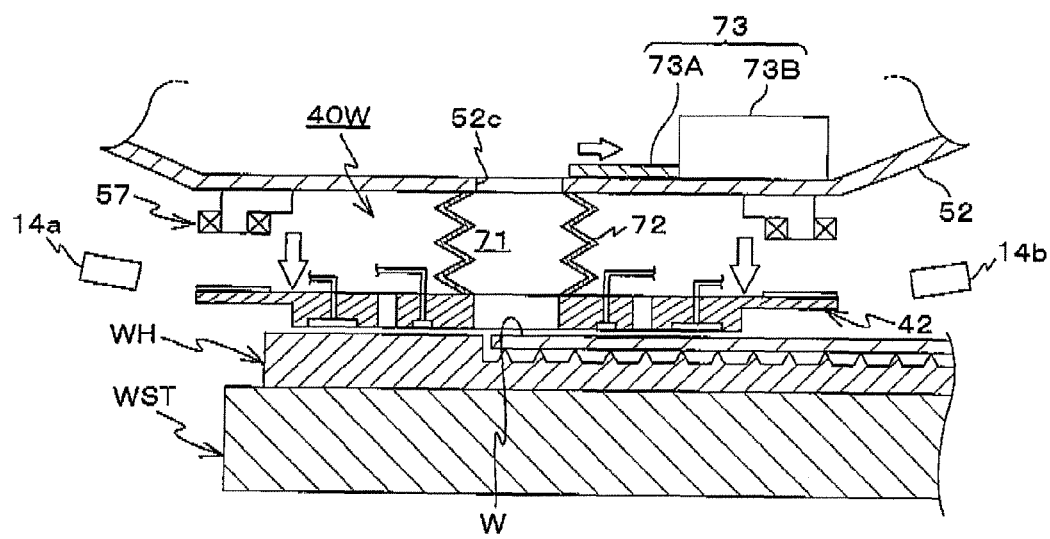

Because wafer stage WST has been moved to the position in FIG. 23B at the stage when the measurement of surface position information of wafer W has been completed, main controller 20A make static gas bearing member 42 move downward as shown in FIG. 23B by releasing the magnetic attraction of electromagnet unit 57. Further, substantially at the same time as this, main controller 20A operates vacuum pump 37 and gas supply device 39, and furthermore, sets space 71 to a vacuum environment by making shutter 73A move into an opened state via shutter drive unit 73B.

By the operations described above, the wafer exchange operation on wafer stage WST and the measurement operation (the mapping operation) with the wafer focus sensor (14a, 14b) are completed.

When the reticle exchange, the wafer exchange, and the mapping operation are completed in the manner described above, main controller 20A performs a series of preparatory operations for exposure which includes reticle alignment, baseline measurement of alignment system ALG, wafer alignment by the EGA method and the like, in a procedure similar to the ones described earlier.

When the series of preparatory operations are completed, then, as is previously described, main controller 20A performs exposure operation by the step-and-scan method. More specifically, main controller 20A moves wafer stage WST to a scanning starting position (acceleration starting position) for exposure of the first shot area, while monitoring positional information from wafer interferometer 82W according to the positional information of each shot area on wafer W which was obtained as a result of wafer alignment, and also moves reticle stage RST to a scanning starting position (acceleration starting position) and performs scanning exposure on the first shot area. Accordingly, on the first shot area on wafer W, a transferred image of the circuit pattern is formed.

Now, the Z position control and attitude control of reticle R and wafer W while the exposure above of the first shot area is being performed will be described, taking the control of wafer stage WST for an example. Incidentally, in order to simplify the description, the following description will be made on the assumption that the Z position of the patterned surfaces of reticle R is maintained always constant and the attitude is also constant (e.g., the inclination to the XY plane is approximately 0), and that the projection position of the pattern of reticle R on wafer W is invariable.

Figure 24B:
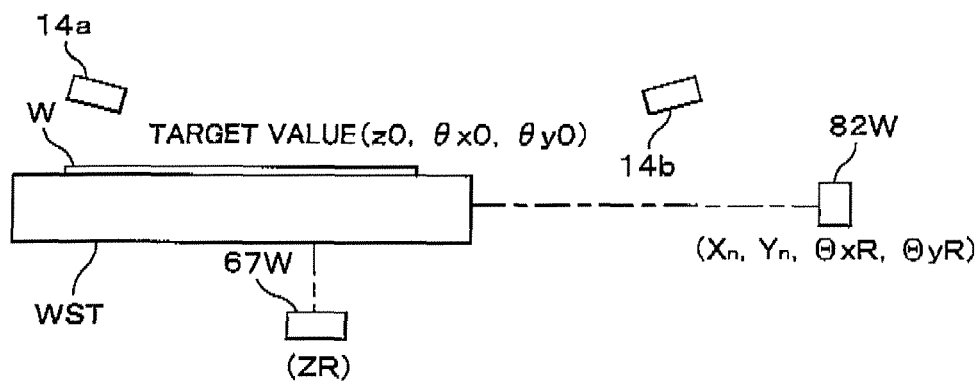
FIG. 24B is a view for explaining a control method of a wafer stage based on the mapping data.

In the embodiment, in order to maintain a vacuum environment of the optical path of EUV light EL during scanning exposure, static gas bearing member 42 of seal unit 40W is located in the vicinity of wafer W, as shown in FIG. 17. Because of this, the Z position and attitude of wafer W cannot be measured by irradiating the detection beam of the wafer focus sensor (14a, 14b) on the wafer W surface during the exposure operation. Accordingly, as shown in FIG. 24B, only the measurement that uses wafer interferometer 82W and Z interferometer 67W can be performed during the exposure. Therefore, during the scanning exposure, main controller 20A performs Z position control and attitude control of wafer W using the associated mapping data of the measurement values of interferometers 82W and 67W and the measurement values of the wafer focus sensor (14a, 14b), and controls wafer stage WST so that the wafer W surface in the area where EUV light EL is irradiated, or more specifically, in the projection area of the reticle pattern, coincides with the image plane of projection optical system PL (located within the focal depth). In this case, the target value of the Z position of the wafer W surface is z0 (refer to FIG. 24B), and the target value of the attitude is to be (θx0, θy0).

To be more specific of this control of wafer stage WST, in the case the XY position of wafer stage WST is $(X_n, Y_n)$, the data related to the Z position control in the mapping data corresponding to this XY position is measurement value $z_n$ of the wafer focus sensor (14a, 14b) and measurement value $Z_n$ of Z interferometer 67W, as shown in FIG. 24A. Accordingly, in order to make the Z position of the wafer W surface coincide with target value z0, main controller 20A controls the movement of wafer stage WST so that when the XY position of wafer stage WST is $(X_n, Y_n)$, the measurement value of Z interferometer 67W becomes value ZR, which is expressed as in formula (1) below.

$$z_n : Z_n = z0 : ZR$$

$$ZR = (Z_n * z0)/z_n \quad (1)$$

Similarly, of the mapping data corresponding to the XY position of wafer stage WST, the data related to the attitude of wafer W is measurement value $(\theta x_n, \theta y_n)$ of the wafer focus sensor (14a, 14b) and measurement value $(\Theta xn, \Theta y_n)$ of wafer interferometer 82W shown in FIG. 24A. Accordingly, similar to the Z position control described above, in order to make the inclination (rotation around the X-axis) of the wafer W surface coincide with the target value (θx0, θy0), main controller 20A controls wafer stage WST based on the mapping data and the measurement values of wafer interferometer 82W so that the measurement values of wafer interferometer 82W become value (ΘxR, ΘyR), which are expressed as in formulas (2) and (3) below.

$$\Theta xR = (\Theta x_n * \theta x0)/\theta x_n \quad (2)$$

$$\Theta yR = (\Theta y_n * \theta y0)/\theta y_n \quad (3)$$

Incidentally, as for the reticle R side as well, because mapping data similar to the wafer side is obtained using the reticle focus sensor (13a, 13b), main controller 20A actually performs position control of reticle R via drive system 34 similar to the wafer stage WST side, based on the mapping data and the measurement values of reticle interferometer 82R and Z interferometer 67R, so that the distance between chamber 52 and the patterned surface of reticle R during exposure is maintained always constant (so that the patterned surface of reticle R within the illumination area of EVL light is positioned with the object plane of projection optical system PL). Incidentally, in the case a change of projection position (including the XY direction) of the pattern image on wafer W occurs with the position control of reticle R described above, the position control of wafer W should be performed adding the change to the control.

When scanning exposure of the first shot area is completed in the manner described above, main controller 20A performs a stepping operation between shot areas so as to move wafer stage WST to a scanning starting position (acceleration starting position) for exposure of the second shot area, and hereafter, alternately repeats a scanning exposure operation which is accompanied by Z position control and attitude control of reticle R and wafer W and the stepping operation between shot areas. In the manner described above, in exposure apparatus 10A, the pattern of reticle R is transferred onto all the shot areas on wafer W by the step-and-scan method.

As discussed in detail above, according to exposure apparatus 10A of the second embodiment, because electromagnet unit 57 moves static gas bearing member 42 to a position where it does not interfere with the beam path of the detection beam of the wafer focus sensor (14a, 14b), by performing the detection operation of the surface position information of the wafer with the wafer focus sensor (14a, 14b) in this state, static gas bearing member 42 will not interfere with the detection operation of the wafer focus sensor (14a, 14b). Accordingly, even if seal unit 40W is arranged in the vicinity of wafer W, the surface position information of wafer W can be detected, therefore, by performing position control or the like of wafer W based on the surface position information, it becomes possible realize exposure with high precision.

Further, in the second embodiment, because detection of the surface position information of wafer W is performed at the position where EUV light EL is irradiated at the time of exposure, exposure with high precision can be realized also from this point.

Further, according to exposure apparatus 10A of the second embodiment, because electromagnet/permanent magnet unit 58 moves static gas bearing member 42' to a position where it does not interfere with the beam path of the detection beam of the reticle focus sensor (13a, 13b), by performing the detection of the surface position information of the reticle with the reticle focus sensor (13a, 13b) in this state, static gas bearing member 42' will not interfere with the detection operation of the reticle focus sensor (13a, 13b). Accordingly, even if seal unit 40R is arranged in the vicinity of reticle R, the surface position information of reticle R can be detected, therefore, by performing position control or the like of reticle R based on the surface position information, it becomes possible realize exposure with high precision.

Further, in the second embodiment, because detection of the surface position information of reticle R is performed at the position where EUV light EL is irradiated at the time of exposure, exposure with high precision can be realized also from this point.

Further, according to the second embodiment, because the inside of chamber 52 and space 71' are isolated from the outside by seal unit 40R, even if a vacuum chamber for housing reticle R and reticle stage RST are not arranged as in the conventional method, a vacuum environment can be maintained in the periphery of the beam path of EUV light EL. This makes it possible to reduce the entire size of exposure apparatus 10A. Further, because access to the vicinity of reticle stage RST will become easier, maintenance of reticle stage RST and the like can be performed easily.

Further, according to the second embodiment, even if a vacuum chamber for housing wafer W, wafer holder WH, and wafer stage WST is not arranged as in the conventional method, a vacuum environment can be maintained in the periphery of the beam path of EUV light EL. This makes it possible to reduce the entire size of exposure apparatus 10A. Further, because access to the vicinity of wafer stage WST will become easier, maintenance of wafer stage WST and the like can be performed easily. Moreover, according to exposure apparatus 10A of the second embodiment, an effect similar to the first embodiment previously described can be obtained.

Incidentally, in the second embodiment above, the case has been described where mapping data is obtained using the reticle focus sensor (13a, 13b) on reticle exchange, and mapping data is obtained using the wafer focus sensor (14a, 14b) on wafer exchange, however, the present invention is not limited to this, and the mapping data can be obtained at other timings.

Incidentally, in the first and second embodiments described above, while the case has been described where the apparatus is equipped with electromagnet unit 57 which connects static gas bearing member 42 and chamber 52 by an electromagnetic force as a mechanism for fixing static gas bearing member 42 to chamber 52, other mechanisms can also be employed as long as the mechanism can connect chamber 52 and static gas bearing member 42. For example, a mechanism can be employed where the chamber 52 and static gas bearing member 42 are connected by vacuum suction force, or a mechanism by a mechanical connection can also be employed.

Further, the same applies for the reticle side, and various kinds of mechanisms that can move static gas bearing member 42' in the +Z direction instead of electromagnet/permanent magnet unit 58 can be employed, such as, for example, a mechanism that makes a drive force in the +Z direction act on static gas bearing member 42' by a gaseous blowout force, or a voice coil motor or the like.

Incidentally, in the first and second embodiments described above, while the case has been described where a wafer holder by the vacuum chuck method was employed as wafer holder WH, for example, a wafer holder by the electrostatic chuck method can also be employed.

Incidentally, in the first and second embodiments above, while the case has been described where the upper surface of wafer W and the upper surface of the section (the periphery section previously described) of wafer holder WH besides the section holding wafer W are substantially flush as shown in FIGS. 2, 17, and the like, a member different from wafer holder WH (such as, for example, a cover plate) that has a surface positioned substantially flush with the upper surface of wafer stage WST can be placed on wafer stage WST.

Incidentally, in the first and second embodiments described above, while the case has been described where static gas bearing members 42 and 42', exhaust grooves 42b and 42b', and gas supply grooves 42d and 42d' and the like have a loop shape, the sections above can also have a rectangular ring shape. Further, static gas bearing members 42 and 42', exhaust grooves 42b and 42b', and gas supply grooves 42d and 42d' only need to be a rough circular shape, and for example, can have a shape roughly resembling a letter C. Further, as wafer holder WH, for example, while the wafer holder has a rectangular shape in a planar view (when viewing from the +Z direction) as shown in FIG. 6, the wafer holder can also have a circular shape in a planar view (when viewing from the +Z direction).

A Third Embodiment

Next, a third embodiment of the present invention will be described, referring to FIGS. 25 to 34B. Here, the same reference numerals will be used for the same or similar sections as in the first embodiment previously described, and a detailed description thereabout will be omitted or simplified.

Figure 25:
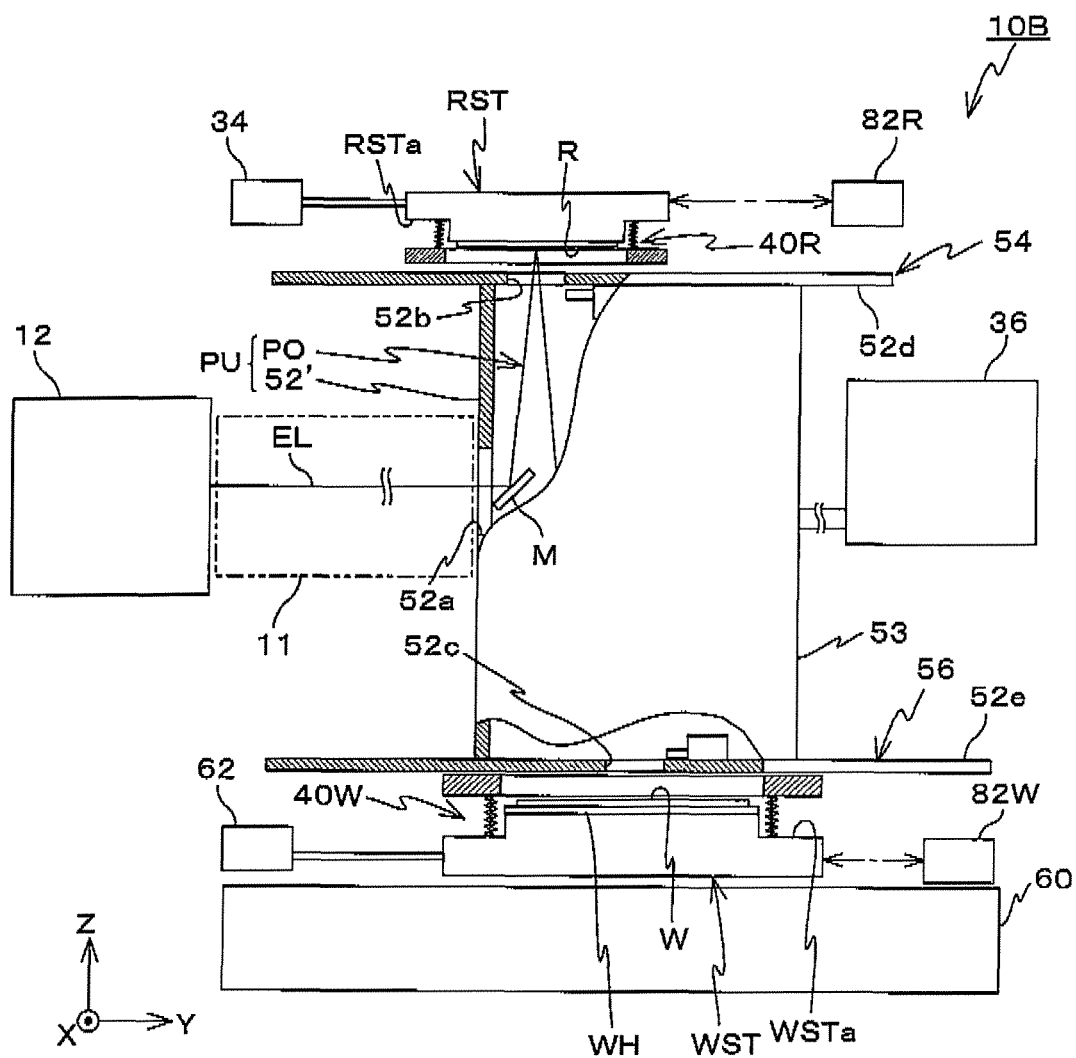
FIG. 25 is a view that schematically shows a configuration of an exposure apparatus of a third embodiment.

FIG. 25 schematically shows the entire configuration of an exposure apparatus 10B of the third embodiment. Similar to exposure apparatus 10 and 10A previously described, exposure apparatus 10B transfers the entire circuit pattern of a reticle R onto each of a plurality of shot areas on a wafer W by the step-and-scan method, by relatively scanning reticle R and wafer W in a one-dimension direction (the Y-axis direction) with respect to a projection optical system PO while projecting a part of the circuit pattern formed on reticle R via projection optical system PO on wafer W.

As it can be seen when comparing FIG. 25 and FIG. 1, exposure apparatus 10B is basically configured similar to exposure apparatus 10 of the first embodiment previously described. However, the configuration of seal unit 40R, seal unit 40W, and the section related with these units are different from exposure apparatus 10. In the description below, such different points will be mainly described.

As shown in FIG. 25, reticle stage RST has a sectional shape roughly of a letter T (an inverted convex shape), and in a section (stepped portion RSTa) one step lower in the +Z direction than the surface where the reticle is held, seal unit 40R is arranged in a state surrounding reticle R. Incidentally, the concrete configuration of seal unit 40R will be described in detail, later on in the description.

The position of reticle R in the Z-axis direction is measured by the reticle focus sensor (13a, 13b) configured of the multiple point focal point position detection system previously described, which includes light-transmitting system 13a (not shown in FIG. 25, refer to FIG. 30) irradiating a detection beam on the patterned surface from an oblique direction and photodetection system 13b (not shown in FIG. 25, refer to FIG. 30) receiving a detection beam reflected off the patterned surface of reticle R. Therefore, based on the measurement values of the reticle focus sensor (13a, 13b), not only the Z position of the patterned surface of reticle R but also the inclination (rotation quantity in the θx and θy directions) to the XY plane can be obtained. Incidentally, although it is omitted in FIG. 25 and the like, the reticle focus sensor (13a, 13b) is actually housed in a chamber 52'.

The measurement values of the reticle focus sensor (13a, 13b) are supplied to a main controller 20B (refer to FIG. 30) along with measurement values of reticle interferometer 82R, and main controller 20B drives reticle stage RST via drive system 34 so that the position control of reticle R in six dimensional directions is performed. Incidentally, the measurement values of reticle interferometer 82R and the reticle focus sensor (13a, 13b) can be used to control wafer stage WST. In this case, control of reticle stage RST does not have to be performed.

Projection unit PU includes chamber 52' and projection optical system PO, which is a catoptric system having a numerical aperture (N.A.) of, for example, 0.1, and has, for example, six pieces of catoptric elements (mirrors) housed in chamber 52'. The projection magnification of projection optical system PO is to be, for example, ¼ times. Chamber 52' is equipped with a cylindrical barrel section 53, an upper side plate 54 that has a rough rectangular shape in a planar view (when viewed from the +Z direction) and is fixed to the upper end of barrel section 53, and a lower side plate 56 that has a rough circular shape in a planar view (when viewed from the −Z direction) and is fixed to the lower end of barrel section 53. The periphery portion of upper side plate 54 and lower side plate 56 protruding from barrel section 53 are flange sections 52d and 52e, respectively. In the upper surface of upper side plate 54 and the lower surface of lower side plate 56, the degree of flatness is set extremely high. Incidentally, in the third embodiment, the upper wall (the wall on the +Z side) of chamber 52' is constituted by upper side plate 54, and the bottom wall of chamber 52' is constituted by lower side plate 56. In this case, in order to irradiate the detection beam from the reticle focus sensor (13a, 13b) previously described on the patterned surface of reticle R, at least a part of upper side plate 54 can be formed using a transparent member made of glass or the like.

Further, as shown in FIG. 25, in a part of the side wall (barrel section 53) of chamber 52', an opening 52a is formed, in a part of the upper wall (upper side plate 54), an opening 52b is formed, and in a part of the bottom wall (lower side plate 56), an opening 52c is formed.

In the embodiment, EUV light EL emitted from light source device 12 that has passed through the illumination optical system (except for mirror M) is incident on reticle R at a predetermined incidence angle, via opening 52a of chamber 52', mirror M, and opening 52b. Then, EUV light EL is reflected by reticle R, and by EUV light EL including the information of the pattern formed on reticle R being projected on wafer W via each of the catoptric elements (mirrors) configuring projection optical system PO and opening 52*c*, a ¼ reduced image of the pattern on reticle R is transferred (formed) on wafer W.

As shown in FIG. 25, wafer stage WST has a sectional shape which resembles an inverted T-shape (convex shape), and in a section (stepped portion WSTa) one step lower from the surface where wafer W (wafer holder WH) is held, seal unit 40W is arranged in a state surrounding wafer W. Incidentally, the concrete configuration of seal unit 40W will be described in detail, later on in the description.

On wafer stage WST, for example, a wafer holder WH by the vacuum chuck method (or the electrostatic chuck method) is mounted, and wafer W is held by suction by wafer holder WH. Positional information of wafer stage WST in directions of six degrees of freedom is constantly detected by a wafer interferometer 82W shown in FIG. 25, at a resolution of, for example, around 0.25 to 1 nm.

Further, positional information of wafer W in the Z-axis direction is measured, using a wafer focus sensor by an oblique incidence method. This wafer focus sensor is configured of the multiple point focal point position detection system previously described, which includes light-transmitting system 14*a* (not shown in FIG. 25, refer to FIG. 30) that irradiates a detection beam from an oblique direction to the upper surface of wafer W, and photodetection system 14*b* (not shown in FIG. 25, refer to FIG. 30) that receives a detection beam reflected off the wafer W surface. The measurement values of the wafer focus sensor (14*a*, 14*b*) are supplied to main controller 20B along with measurement values of wafer interferometer 82W, and main controller 20B controls drive system 62 so that the position control of wafer stage WST in six dimensional directions is performed. Incidentally, although it is omitted in FIG. 25 and the like, the wafer focus sensor (14*a*, 14*b*) is actually housed in chamber 52'. In this case, in order to irradiate the detection beam from the wafer focus sensor (14*a*, 14*b*) previously described on the wafer W surface, at least a part of lower side plate 56 can be formed, for example, using a transparent member made of glass or the like.

Incidentally, alignment system ALG can be housed in chamber 52'.

Next, seal unit 40W arranged in wafer stage WST will be described in detail, based on FIGS. 26 to 28. Seal unit 40W maintains the air tightness of the inside of chamber 52', and the space between wafer stage WST and the lower surface (the surface on the −Z side) of lower side plate 56 of chamber 52'. The lower end of seal unit 40W is connected to wafer stage WST in an air tight state, and the upper end surface faces the lower surface (the surface on the −Z side) of lower side plate 56 of chamber 52' via a predetermined clearance (minute distance).

Figure 26:
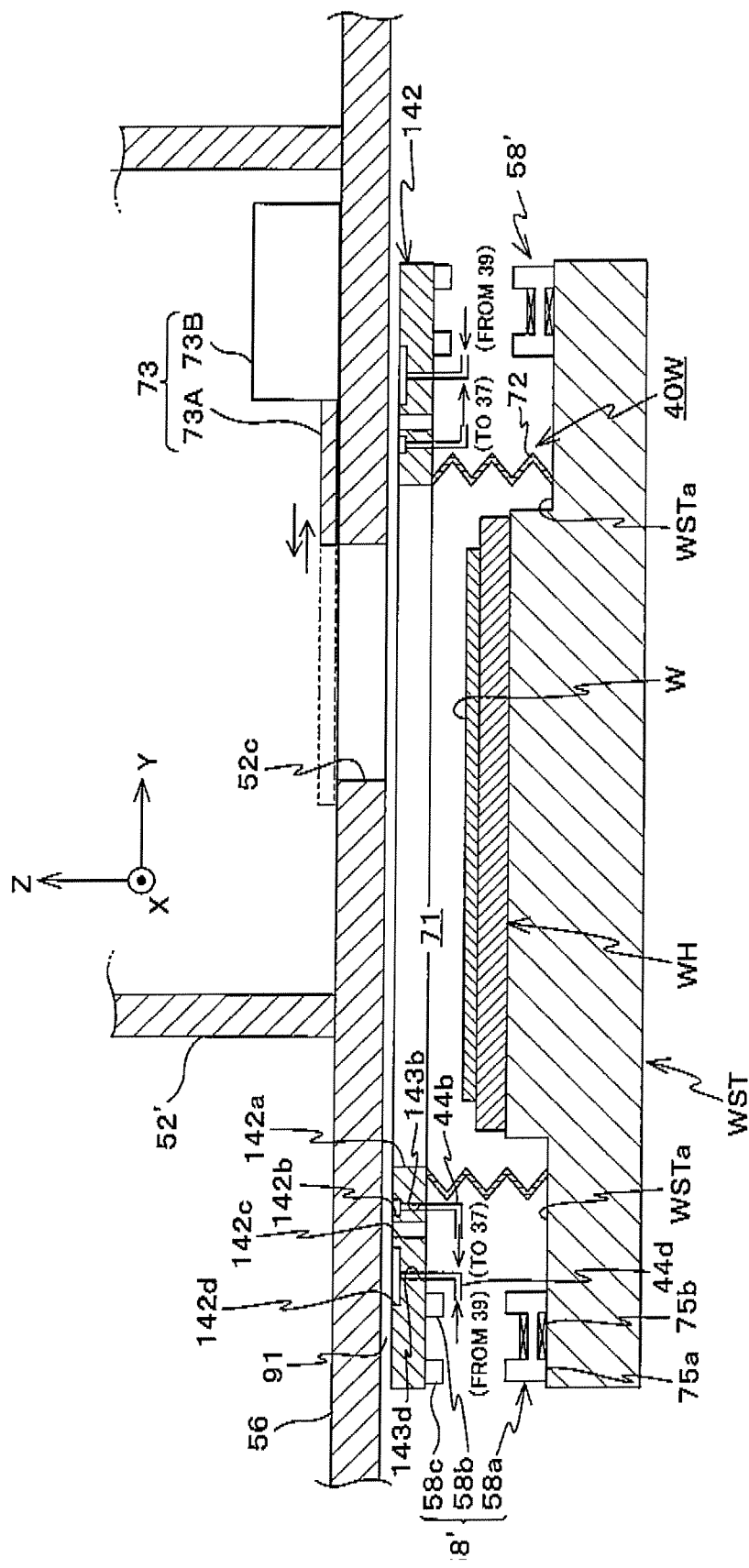
FIG. 26 is a longitudinal sectional view that shows a wafer side seal unit of the exposure apparatus in the third embodiment and its periphery.

FIG. 26 shows a partially sectioned view of the vicinity of seal unit 40W. Seal unit 40W is equipped with a static gas bearing member 142, a bellows 72 which connects the lower surface of static gas bearing member 142 and the upper surface of stepped portion WSTa of wafer stage WST in an air tight state, a plurality of electromagnet/permanent magnet units 58' arranged in between static gas bearing member 142 and wafer stage WST, and the like.

Figure 27:
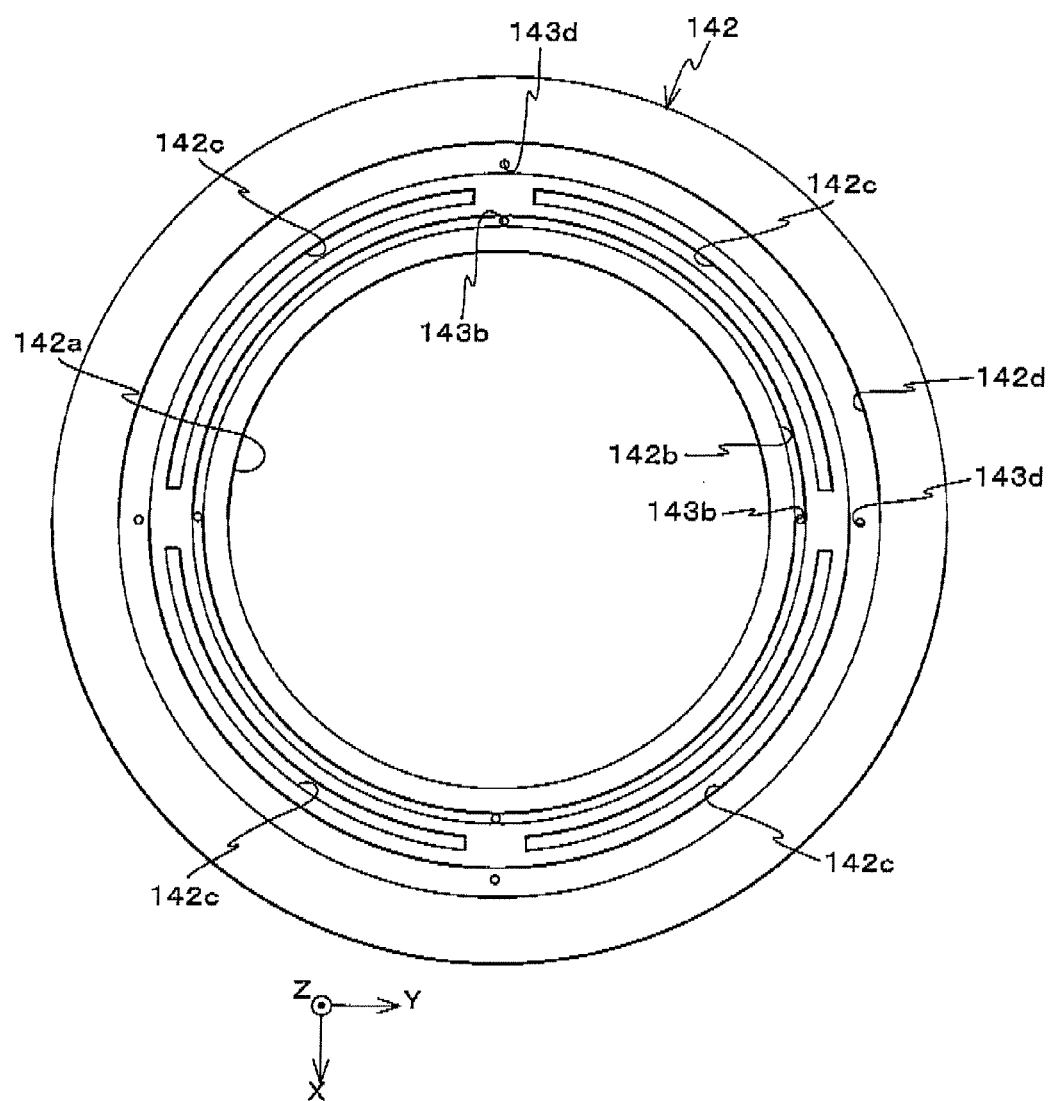
FIG. 27 is a bottom surface view of a static gas bearing member in FIG. 26.

As shown in FIG. 26 and FIG. 27, which is an upper surface view of static gas bearing member 142, static gas bearing member 142 is made from a member of a rough circular shape in a planar view (when viewing from the +Z direction), which has a through hole 142*a* penetrating in the Z-axis direction formed in the center. On the upper surface of static gas bearing member 142, in the same positional relation as static gas bearing member 42 previously described, loop shaped exhaust groove 42*b* of a predetermined depth, four open air sections 42*c*, and gas supply groove 42*d* of a predetermined depth are respectively formed.

As shown in FIG. 27, four exhaust lines 143*b* are formed at an equal interval (an equiangular interval) in a penetrating manner from the inner bottom surface (the surface on the −Z side) of exhaust groove 142*b* to the lower surface (a surface on the −Z side) of static gas bearing member 142. Further, to each exhaust line 143*b*, one end of exhaust pipe 44*b* is connected as shown in FIG. 26. The other end of this exhaust pipe 44*b* is connected to vacuum pump 37 (not shown in FIGS. 26 and 27, refer to FIG. 30).

Figure 28:
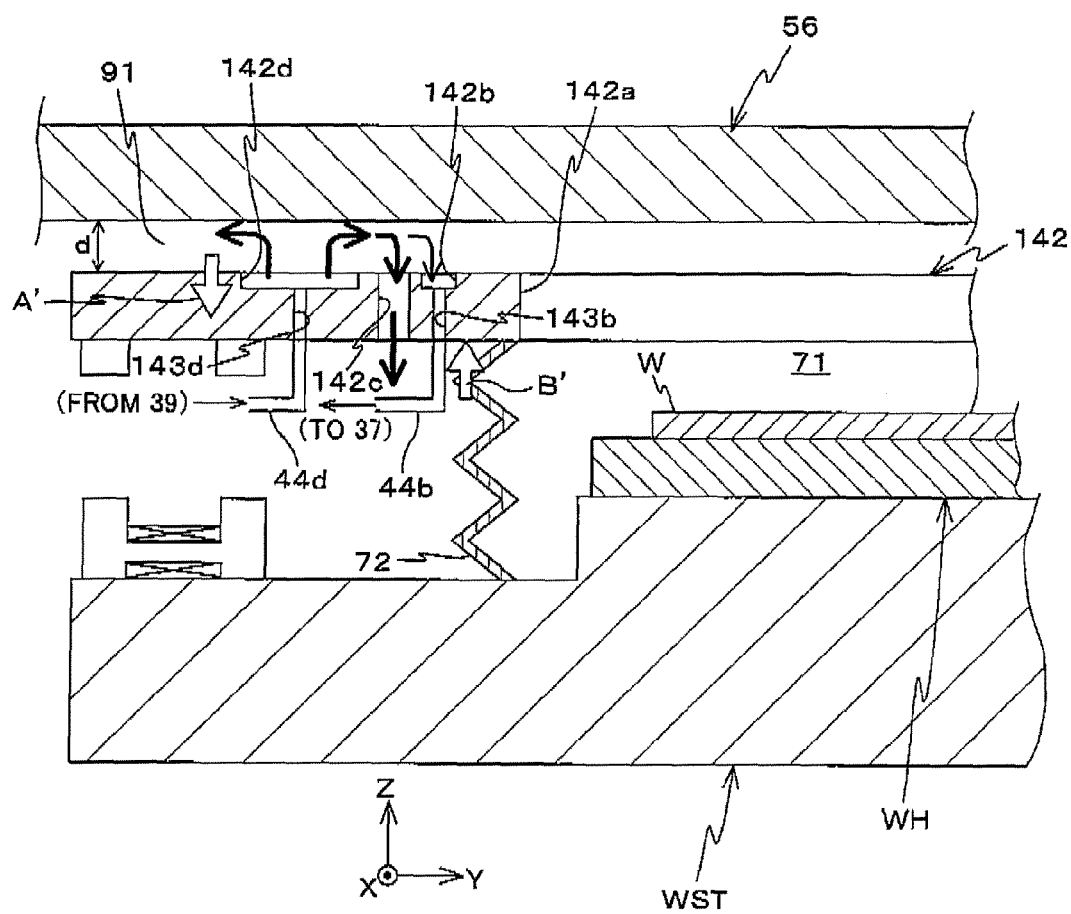
FIG. 28 is a view for explaining an operation of the static gas bearing member in FIG. 26.

Open air section 142*c*, for example, has a rough quarter arc shape in a planar view (when viewing from the +Z direction) as shown in FIG. 27, and is formed in a penetrating manner from the upper surface (the surface on the +Z side) to the lower surface (the surface on the −Z side) of static gas bearing member 42 (refer to FIG. 28).

Further, as shown in FIG. 27, four gas supply lines 143*d* are formed at an equal interval (an equiangular interval) in a penetrating manner from the inner bottom surface (the surface on the −Z side) of gas supply groove 142*d* to the lower surface (the surface on the −Z side) of static gas bearing member 142. To each gas supply line 143*d*, one end of gas supply pipe 44*d* is connected as shown in FIG. 26. The other end of gas supply pipe 44*d* is connected to gas supply device 39 (not shown in FIGS. 26 and 27, refer to FIG. 30).

As shown in FIG. 26, the upper end of bellows 72 is connected to static gas bearing member 142 in an air tight state in a state surrounding through-hole 142*a* of static gas bearing member 142, and the lower end is connected to the upper surface of stepped portion WSTa of wafer stage WST in an air tight state. Bellows 72 is arranged in a state surrounding wafer W and wafer holder WH. Further, bellows 72 is to perform expansion/contraction and deformation freely. This allows static gas bearing member 142 to be connected to wafer stage WST in an air tight state, in a state where at least a position in the Z-axis direction and an inclination (attitude) to the XY plane are in a variable state.

As shown in FIG. 26, electromagnet/permanent magnet unit 58' includes an electromagnet 58*a* arranged on the wafer stage WST side (the upper surface of stepped portion WSTa), and a pair of permanent magnets 58*b* and 58*c* arranged on the lower surface of static gas bearing member 142, and is configured similar to electromagnet/permanent magnet unit 58 previously described.

According to electromagnet/permanent magnet unit 58' configured in the manner described above, similar to electromagnet/permanent magnet unit 58 previously described, a magnetic attraction or a magnetic repulsion can be generated between iron core 75*a* and permanent magnets 58*b* and 58*c* depending on the direction of current supplied to coil 75*b* of electromagnet 58*a*, which gives a thrust force in the −Z direction or the +Z direction to static gas bearing member 142. As a matter of course, in a state where current is not supplied to coil 75*b*, the thrust of static gas bearing member 142 that electromagnet/permanent magnet unit 58' generates is zero.

In seal unit 40W configured in the manner described above, when compressed air is supplied from gas supply device 39 (refer to FIG. 30) via gas supply pipe 44*d* and gas supply line 143*d* as shown in FIG. 28, compressed air flows out from the entire gas supply groove 142*d* to the lower surface of lower side plate 56 of chamber 52'. This makes a force in the direction (a downward direction) indicated by an outlined arrow A' act on static gas bearing member 142 due to the static pressure in a gap (bearing clearance) 91, which is the gap between the upper surface (a bearing surface) of static gas bearing member 142 and the lower surface of lower side plate 56.

Meanwhile, the compressed air that blows out to the lower surface of lower side plate 56 flows toward the −Y direction (from the inner side of bearing clearance 91 towards the outer side) in FIG. 28 of bearing clearance 91 and toward the +Y direction (from the outer side of bearing clearance 91 towards the inner side), and most of the air which flows from the outer side of bearing clearance 91 toward the inner side passes through open air section 142c and is exhausted below static gas bearing member 142. Further, the air which was not exhausted from open air section 142c tries to flow furthermore toward the inner side of bearing clearance 91, however, such air is removed by vacuum suction by vacuum pump 37, via exhaust groove 142b, exhaust line 143b, and exhaust pipe 44b. In this case, by the vacuum suction force of vacuum pump 37, the vicinity of exhaust groove 142b moves to a negative pressure state, and a force in the direction (an upward direction) indicated by an outlined arrow B' will act on static gas bearing member 142.

More specifically, in the embodiment, even if wafer stage WST moves in directions of six degrees of freedom, bearing clearance 91 of a predetermined distance d (e.g., d is around 5 μm) between static gas bearing member 142 and the lower surface of lower side plate 56 is maintained by the balance between the downward force (static pressure (clearance internal pressure) in bearing clearance 91 and a force including the self-weight of static gas bearing member 142) and the upward force (a force by the difference of negative pressure which occurs due to vacuum suction and atmospheric pressure) that acts on static gas bearing member 142. Further, by the flow of gas in bearing clearance 91 shown in FIG. 28, the circulation of the gas between the inside and the outside of a space 71 (refer to FIG. 28) including the inside of bellows 72 and the inside of through hole 142a of static gas bearing member 142 is in a blocked state.

Referring back to FIG. 26, in chamber 52' a shutter unit 73 is arranged which includes a shutter 73A and a shutter drive device 73B which reciprocally drives shutter 73A in the +Y direction and the −Y-direction. In a "closed state" at the position where shutter 73A is shown in a phantom line, opening 52c of chamber 52' is closed, and the inside and the outside of chamber 52' move into a non-communication state (more specifically, a state is set where the gaseous flow from the outside into the inside of chamber 52' is blocked). Meanwhile, in an "opened state" at the position where shutter 73A is shown by a solid line, the inside and the outside of chamber 52' move into a communication state.

In the third embodiment, because the circulation of the gas between the inside and the outside of space 71 (refer to FIG. 26) including the inside of bellows 72 and the inside of through-hole 142a of static gas bearing member 142 is in a blocked state as described before, by vacuum suctioning the inside of chamber 52' with vacuum pump 36 (refer to FIG. 25) in a state where shutter 73A is set to an opened state, the inside of space 71 can be set to a vacuum environment along with the inside of chamber 52', and the vacuum environment can be maintained.

Incidentally, although the explanation lacks sequence, when wafer W is exposed, water stage WST moves in the X-axis direction and the Y-axis direction in a range of the same stroke or more than the diameter (e.g., 300 mm) of wafer W. Accordingly, lower side plate 56 has to be set around to a size where lower side plate 56 covers the range of movement of static gas bearing member 142.

Next, seal unit 40R will be described, referring to FIG. 29, which is a longitudinal sectional view of seal unit 40R. Seal unit 40R maintains the air tightness of the inside of chamber 52', and the space between reticle stage RST and upper side plate 54 of chamber 52'. The upper end of seal unit 40R is connected to the lower surface (the surface on the −Z side) of stepped portion RSTa in an air tight state, and the lower end surface faces the upper surface of upper side plate 54 via a minute distance (a predetermined clearance).

Incidentally, because seal unit 40R has almost the same configuration as that of seal unit 40W vertically reversed, the sections same or similar to seal unit 40W will be indicated by adding an "'"/to the same reference codes which were used when describing seal unit 40W, and the description thereabout will also be omitted. In seal unit 40R, instead of electromagnet/permanent magnet unit 58' configuring seal unit 40W, an electromagnet unit 57' is arranged.

Electromagnet unit 57' has an electromagnet 57a, which has a coil arranged on the lower surface (the surface on the −Z side) of stepped portion RSTa of reticle stage RST, and a magnetic material member 57b made from an iron plates or the like arranged at a position facing electromagnet 57a on the upper surface (the surface on the +Z side) of static gas bearing member 142', respectively. According to electromagnet unit 57' configured in the manner described above, by generating a magnetic force (a magnetic attraction) in electromagnet 57a and adsorbing magnetic material member 57b, static gas bearing member 142' can be fixed to reticle stage RST.

In seal unit 40R configured in the manner described above, when compressed air supplied from gas supply device 39' (refer to FIG. 30) blows out to the upper surface of upper side plate 54 from gas supply groove 142d' as in seal unit 40W previously described, an upward (the +Z direction) force acts on static gas bearing member 142' by the static pressure in the gap (bearing clearance 91') between the lower surface of static gas bearing member 142' and the upper surface of upper side plate 54. Meanwhile, the compressed air that blows out toward the upper surface of upper side plate 54 flows from the inner side of bearing clearance 91' toward the outer side, and toward the inner side from the outer side, however, most of the air which flows from the outer side toward the inner side passes through open air section 142c' and is exhausted above static gas bearing member 142'. Further, the air which was not exhausted from open air section 142c' furthermore tries to flow toward the inner side of bearing clearance 91', however, such air is removed by vacuum suction by a vacuum pump 37' (refer to FIG. 30), via exhaust groove 142b'. In this case, by the difference between the negative pressure occurring in the vicinity of exhaust groove 142b' due to the vacuum suction force of vacuum pump 37' and the atmospheric pressure, a downward force (the −Z direction) will act on static gas bearing member 142'.

More specifically, in the embodiment, even if reticle R (reticle stage RST) moves in directions of six degrees of freedom, bearing clearance 91 of a predetermined distance is constantly maintained between the lower surface of static gas bearing member 142' and the upper surface of upper side plate 54, by the balance between the upward force (a force including static pressure (clearance internal pressure) in bearing clearance 91') and the downward force (a force by the difference of negative pressure which occurs due to vacuum suction and atmospheric pressure and a force including the self-weight of static gas bearing member 142') that acts on static gas bearing member 142. Further, by the flow of gas in bearing clearance 91', the circulation of the gas via bearing clearance 91' between the inside and the outside of a space 71' (refer to FIG. 29) including the inside of bellows 72' and the inside of through hole 142a' of static gas bearing member 142' is in a blocked state.

Accordingly, by vacuum suctioning the inside of chamber 52' with vacuum pump 36 (refer to FIG. 25) in a state where shutter 73A' of shutter unit 73' (including shutter 73A' and shutter drive unit 73B' which drives shutter 73A') housed in chamber 52' is set to an opened state (the state indicated by a solid line in FIG. 29), the inside of space 71' can be set to a vacuum environment along with the inside of chamber 52', and the vacuum environment can be maintained.

Incidentally, in the case of the exposure operation which will be described later, reticle stage RST moves in the Y-axis direction in a range of the same stroke or more than the length of reticle R in the Y-axis direction. Accordingly, upper side plate 54 has to be set around to a size where upper side plate 54 covers the range of movement of static gas bearing member 142'.

Figure 30:
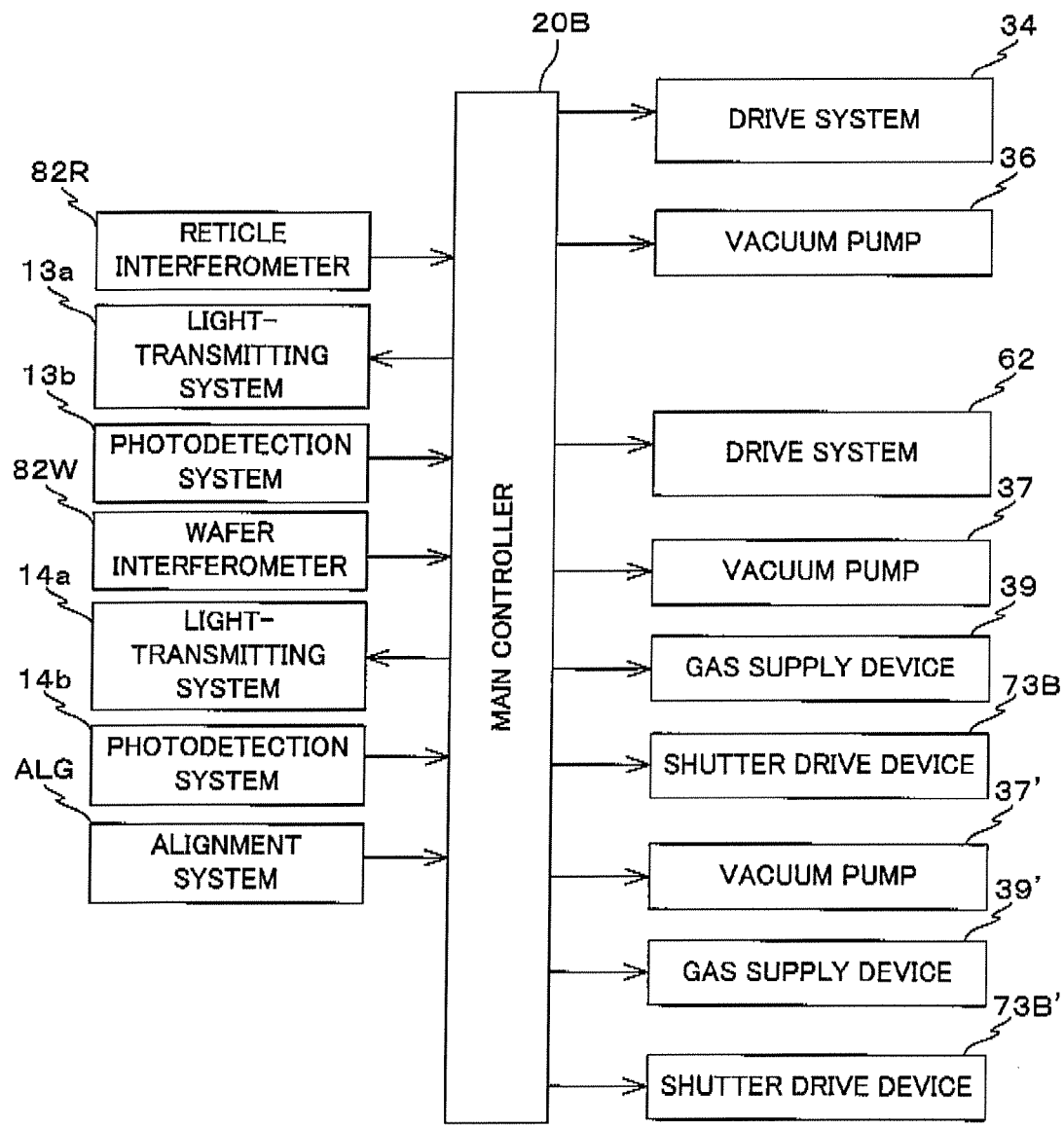
FIG. 30 is a block diagram that shows a control system of the exposure apparatus in the third embodiment.

FIG. 30 shows a control system of exposure apparatus 10B in the third embodiment. This control system is mainly configured of main controller 20B. Main controller 20B is configured including a so-called microcomputer (or workstation) consisting of a CPU (Central Processing Unit), ROM (Read Only Memory), RAM (Random Access Memory) and the like, and has overall control over the entire apparatus. The configuration and the like of other sections are the same as the first embodiment previously described.

Next, an operation in an exposure process by exposure apparatus 10B of the third embodiment configured in the manner described above will be described, referring to FIGS. 31A to 34B. Incidentally, as a premise, reticle stage RST is to hold a reticle R' which has been exposed, and wafer stage WST is to hold a wafer W' which has been exposed.

Figure 31A:
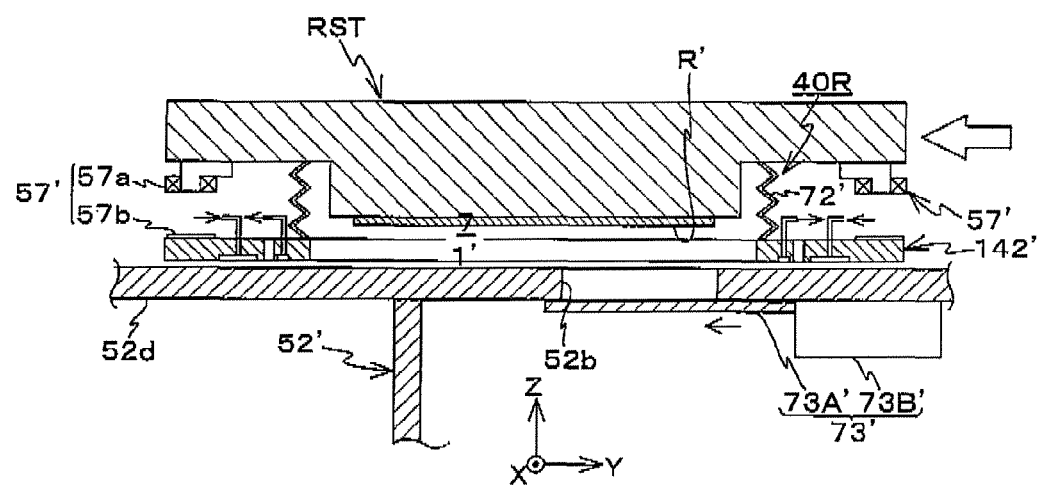
FIGS. 31A and 31B are views (No. 1) for explaining a reticle exchange operation of the exposure apparatus in the third embodiment.
Figure 31B:
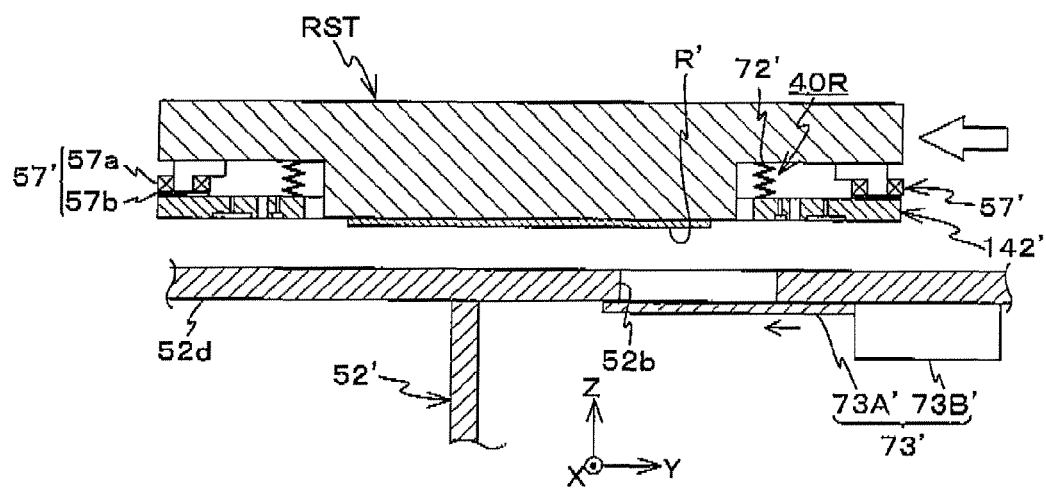

First of all, an exchange operation of a reticle on reticle stage RST will be described. In this exchange operation, first of all, main controller 20B moves reticle stage RST via drive system 34 in the −Y direction toward a predetermined loading position (refer to FIG. 31A). During such movement of reticle stage RST, main controller 20B makes shutter 73A' move into a closed state via a shutter drive unit 73B' and stops the vacuum suction by vacuum pump 37' and the supply of compressed air by gas supply device 39'. Further, substantially at the same time as this, main controller 20B supplies current to a coil of electromagnet 57a of electromagnet unit 57' and generates a magnetic attraction in electromagnet unit 57', which drives static gas bearing member 142' upward as shown in FIG. 31B. By this operation, magnetic material member 57b is adsorbed by electromagnet 57a, and static gas bearing member 142' will be fixed to reticle stage RST.

Figure 32A:
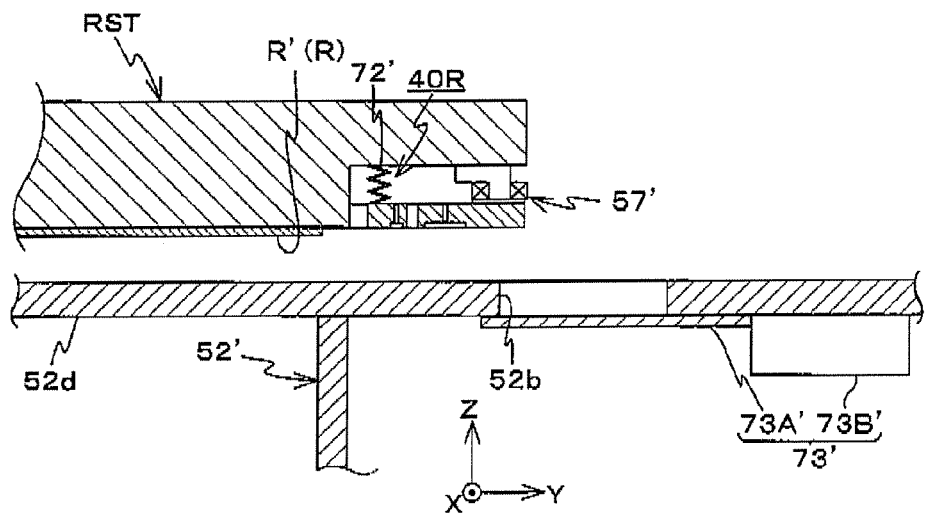
FIGS. 32A and 32B are views (No. 2) for explaining a reticle exchange operation of the exposure apparatus in the third embodiment.

Next, main controller 20B exchanges reticle R' held by reticle stage RST to a new reticle R via a reticle carrier system (not shown), in a state where reticle stage RST is positioned at a predetermined loading position shown in FIG. 32A.

Figure 32B:
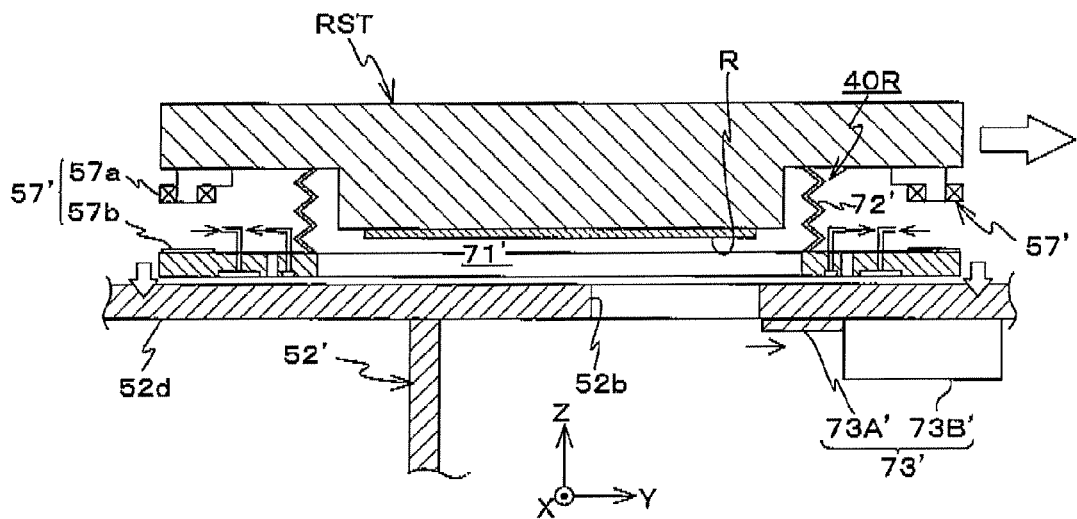

And, at the stage where a new reticle R has been loaded on reticle stage RST, main controller 20B moves reticle stage RST in the +Y direction. In the course of this movement, main controller 20B makes static gas bearing member 142' move downward by releasing the magnetic attraction of electromagnet unit 57', as shown in FIG. 32B. Further, substantially at the same time as this, main controller 20B operates vacuum pump 37' and gas supply device 39', and furthermore, sets space 71' to a vacuum environment by making shutter 73A' move into an opened state via shutter drive unit 73B'.

By the operations described above, the reticle exchange operation on reticle stage RST is completed.

Next, an exchange operation of a wafer on wafer stage WST will be described.

Figure 33A:
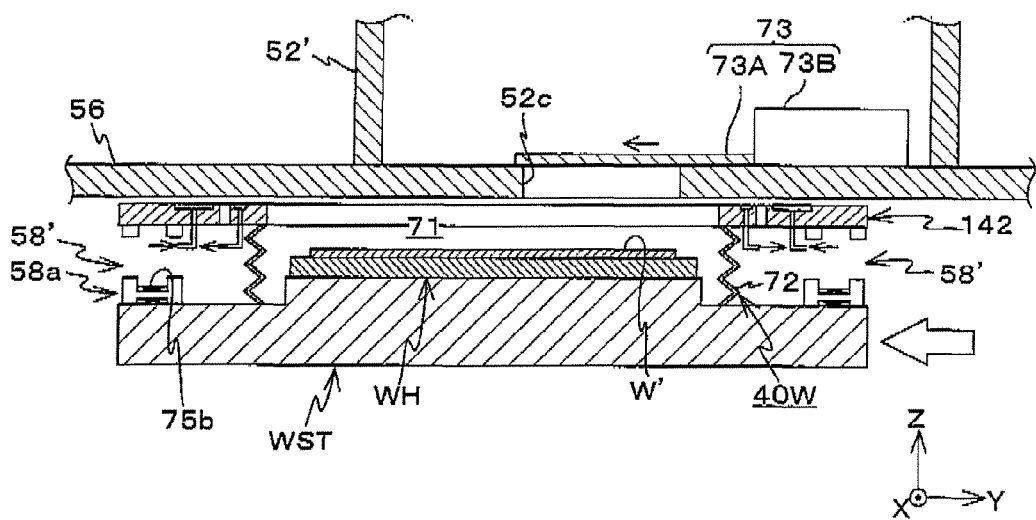
FIGS. 33A and 33B are views (No. 1) for explaining a wafer exchange operation of the exposure apparatus in the third embodiment.
Figure 33B:
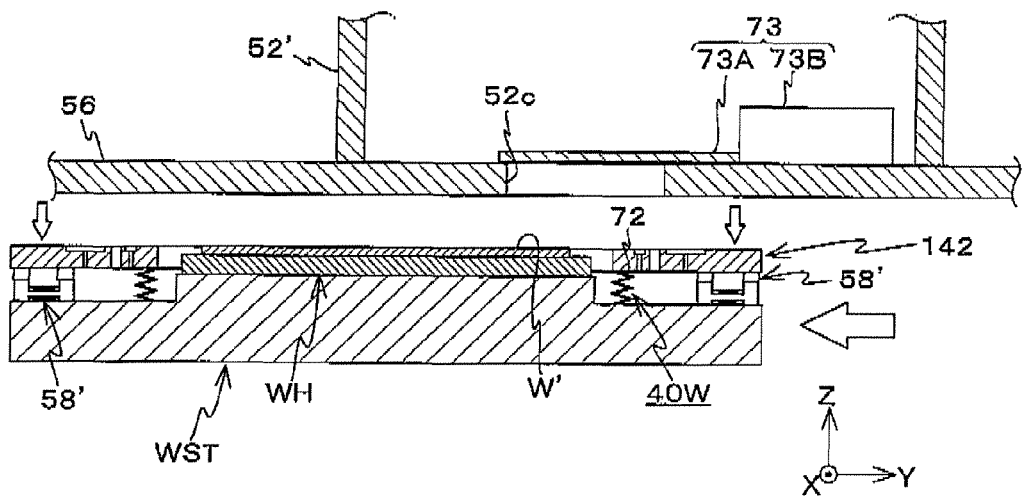

In this exchange operation, first of all, main controller 20B moves wafer stage WST via drive system 62 in the −Y direction toward a predetermined loading position (refer to FIG. 33A). During such movement of wafer stage WST, main controller 20B makes shutter 73A move into a closed state via a shutter drive unit 73B and stops the vacuum suction by vacuum pump 37 and the supply of compressed air by gas supply device 39. By this operation, static gas bearing member 14' moves downward due to its self-weight as shown in FIG. 33B. Incidentally, the position of static gas bearing member 142 can be fixed by supplying current to coil 75b of electromagnet 58a of electromagnet/permanent magnet unit 58' and generating a magnetic attraction, in the state shown in FIG. 33B.

Figure 34A:
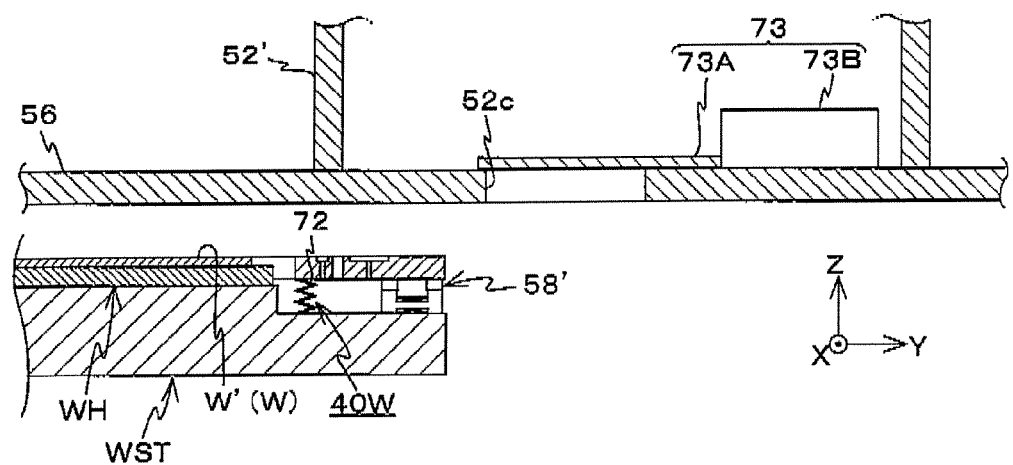
FIGS. 34A and 34B are views (No. 2) for explaining a wafer exchange operation of the exposure apparatus in the third embodiment.
Figure 34B:
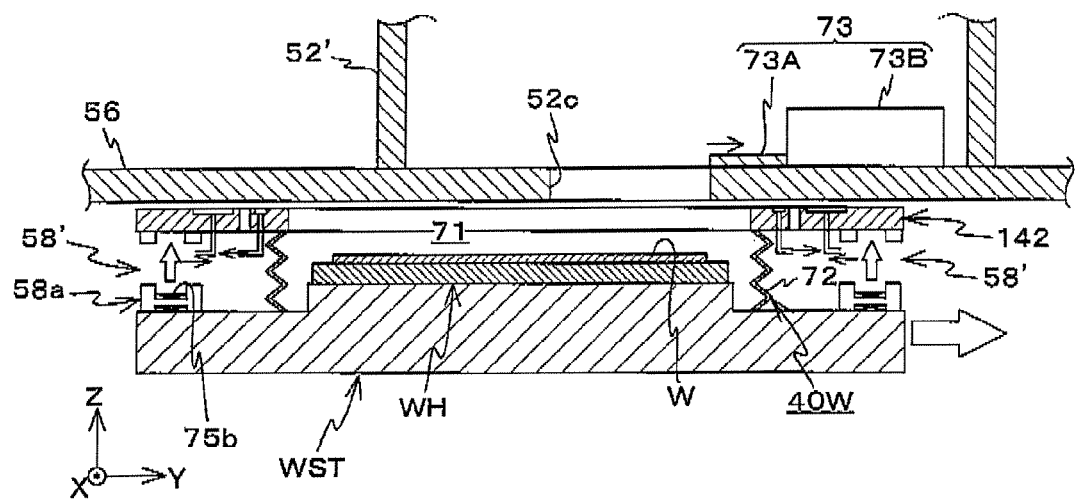

Next, main controller 20B exchanges wafer W' which has been exposed on wafer stage WST to a new wafer W via a wafer carrier system (not shown), in a state where water stage WST is positioned at the predetermined loading position shown in FIG. 34A.

And, at the stage where a new wafer W has been loaded on wafer stage WST, main controller 20B moves wafer stage WST in the +Y direction. In the course of this movement, main controller 20B supplies current to coil 75b of electromagnet 58a of electromagnet/permanent magnet unit 58' and generates a magnetic repulsion in electromagnet/permanent magnet unit 58' as shown in FIG. B4B, so that static gas bearing member 142 is driven upward (refer to FIG. 34B).

Because the upper surface of static gas bearing member 142 moves closer to the lower surface of lower side plate 56 by this upward drive, main controller 20B operates vacuum pump 37 and gas supply device 39 at an appropriate timing, and furthermore makes shutter 73A move into an opened state via shutter drive unit 73B so that the inside of space 71 is set to a vacuum environment.

By the operations described above, the wafer exchange operation on wafer stage WST is completed.

When the reticle exchange and the wafer exchange are completed in the manner described above, main controller 20B performs a series of preparatory operations for exposure such as reticle alignment, baseline measurement of alignment system ALG, and wafer alignment by the so-called EGA method, in a procedure similar to the ones described earlier.

When the series of preparatory operations are completed, then, as is previously described, main controller 20B performs exposure operation by the step-and-scan method. More specifically, main controller 20B moves wafer stage WST to a scanning starting position (acceleration starting position) for exposure of the first shot areas while monitoring positional information from wafer interferometer 82W according to the positional information of each shot area on wafer W which was obtained as a result of wafer alignment, and also moves reticle stage RST to a scanning starting position (acceleration starting position) and performs scanning exposure on the first shot area. Accordingly, on the first shot area on wafer W, a transferred image of the circuit pattern is formed.

When scanning exposure of the first shot area is completed in the manner described above, main controller 20B performs a stepping operation between shot areas so as to move wafer stage WST to a scanning starting position (acceleration starting position) for exposure of the second shot area, and hereafter, alternately repeats a scanning exposure operation to the shot areas and the stepping operation between shot areas. In the manner described above, in exposure apparatus 10B, the pattern of reticle R is transferred onto all the shot areas on wafer W by the step-and-scan method.

During the scanning exposure described above, because EUV light EL emitted from light source device 12 reaches wafer W passing through a vacuum environment such as space 71' formed by vacuum chamber 11, chamber 52, seal unit 42R and space 71 formed by seal unit 42W, almost none of the EUV light EL is absorbed by other materials such as oxygen before the light reaches wafer W.

As discussed in detail above, according to the third exposure apparatus 10B of the embodiment, seal unit 40W has a loop shaped static gas bearing member 142 which surrounds wafer W and whose end section (lower end section) on the opposite side of the side that faces (the lower surface of) lower side plate 56 of chamber 52' connects to wafer stage WST in an air tight state via bellows 72, and by the surface (the upper surface) on the side facing the lower surface of lower side plate 56 of static gas bearing member 142 forming a predetermined clearance between the lower surface of lower side plate 56, the inside of static gas bearing member 142, or more specifically, the inside of space 71 is isolated from the outside. Consequently, when shutter 73A is in an opened state, the inside of space 71 (more specifically, the periphery of wafer W) can be maintain to a vacuum environment. Accordingly, because the vacuum environment in the periphery of wafer W can be maintained even if wafer stage WST is not housed in a vacuum chamber or the like as it was conventionally, exposure with high precision can be realized while suppressing the complexity and the increase in size of the entire exposure apparatus. Further, because the volume of space 71 is small compared to the vacuum chamber described above, it does not require a long time to set the inside of space 71 to a vacuum environment, which makes it possible to suppress a decrease in throughput. Further, because wafer stage WST is not arranged inside a vacuum chamber, access to wafer stage WST will become easier, which makes it easier to perform maintenance.

Further, in the case the whole wafer stage WST is housed in a vacuum chamber, there are cases when an interferometer or the like for measuring the position of wafer stage WST is arranged on the inner wall of the vacuum chamber, and in such a case, a risk occurs of the vacuum chamber itself being deformed by the difference in pressure inside and outside the vacuum chamber and the measurement accuracy of the interferometer deteriorating, however, in the embodiment, because wafer stage WST is not housed in a vacuum chamber, the deterioration of the measurement accuracy of the interferometer due to the reason above does not occur.

Further, because the whole wafer stage WST and wafer holder are not housed in a vacuum chamber, of each section that configures wafer stage WST, air pads or the like can be used for portions where a non-contact manner should be maintained, which increases the degree of freedom in design, and makes reduction in cost or the like possible.

Further, according to the third exposure apparatus 10B of the embodiment, seal unit 40R has a loop shaped static gas bearing member 142' which surrounds reticle R and whose end section (upper end section) on the opposite side of the side that faces (the upper surface of) upper side plate 54 of chamber 52' connects to reticle stage RST in an air tight state via bellows 72', and by the surface (the lower surface) on the side facing the upper surface of upper side plate 54 of static gas bearing member 142' forming a predetermined clearance between the upper surface of upper side plate 54, the inside of static gas bearing member 142', or more specifically, the inside of space 71' is isolated from the outside. Consequently, when shutter 73A' is in an opened state, the inside of space 71' (more specifically, the periphery of reticle R) can be maintain to a vacuum environment. Accordingly, because the vacuum environment in the periphery of reticle R can be maintained even if reticle stage RST is not housed in a vacuum chamber or the like as it was conventionally, exposure with high precision can be realized while suppressing the complexity and the increase in size of the entire exposure apparatus. Further, because the volume of space 71' is small compared to the vacuum chamber described above, it does not require a long time to set the inside of space 71' to a vacuum environment, which makes it possible to suppress a decrease in throughput. Further, because reticle stage RST is not arranged inside a vacuum chamber, access to reticle stage RST will become easier, which makes it easier to perform maintenance.

A Fourth Embodiment

Next, a fourth embodiment of the present invention will be described, referring to FIGS. 35 to 44B. Here, the same reference numerals will be used for the same or similar sections as in the first embodiment or the third embodiment previously described, and a detailed description thereabout will be omitted or simplified.

Figure 35:
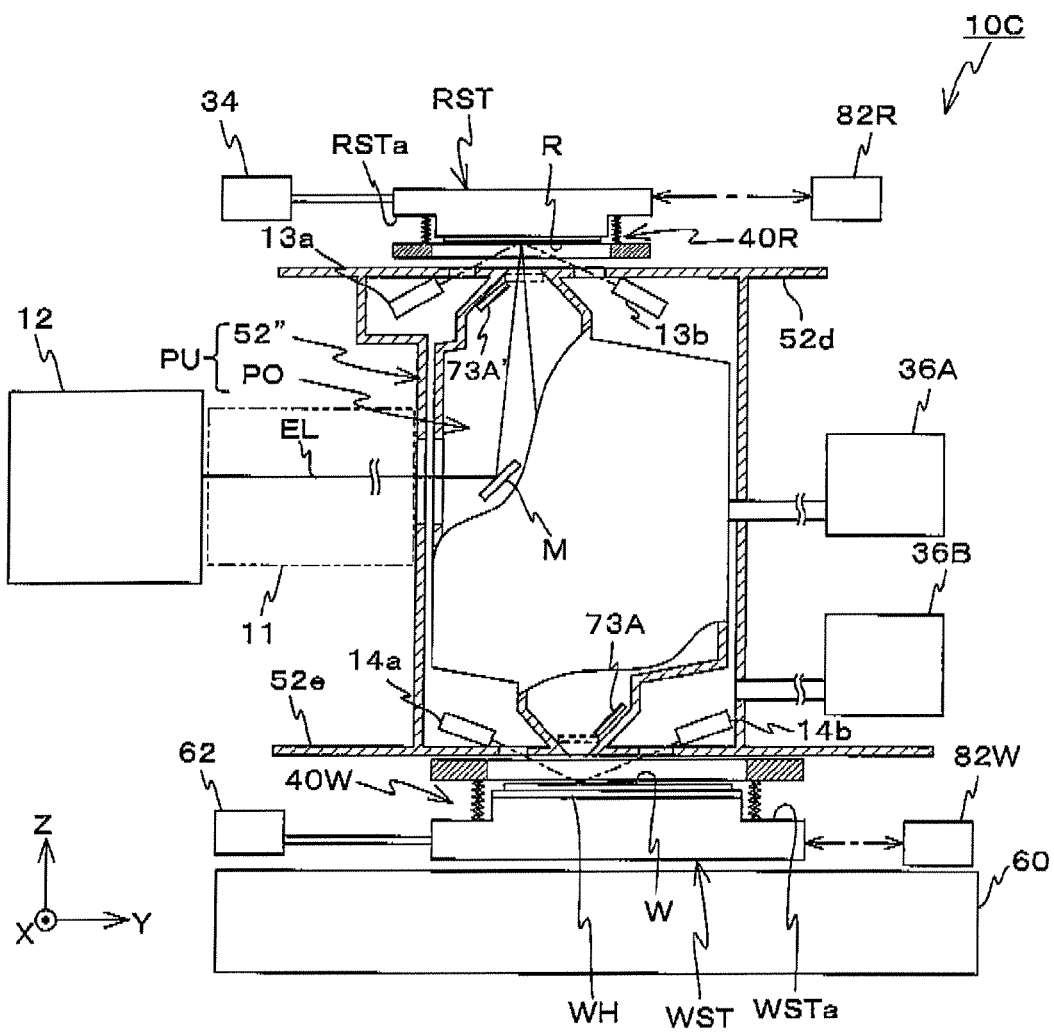
FIG. 35 is a view that schematically shows a configuration of an exposure apparatus of a fourth embodiment.
Figure 36:
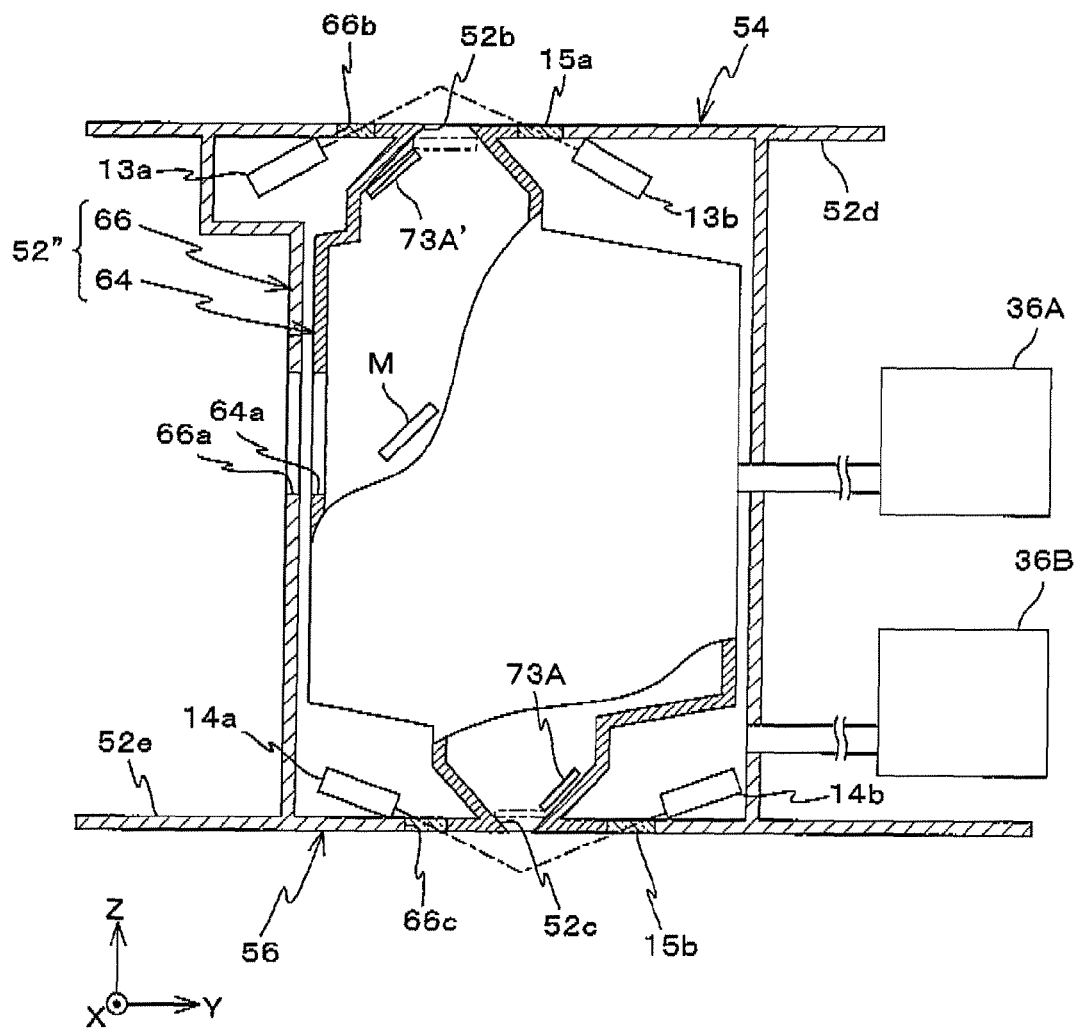
FIG. 36 is an enlarged view that shows a projection unit in FIG. 35.
Figure 37:
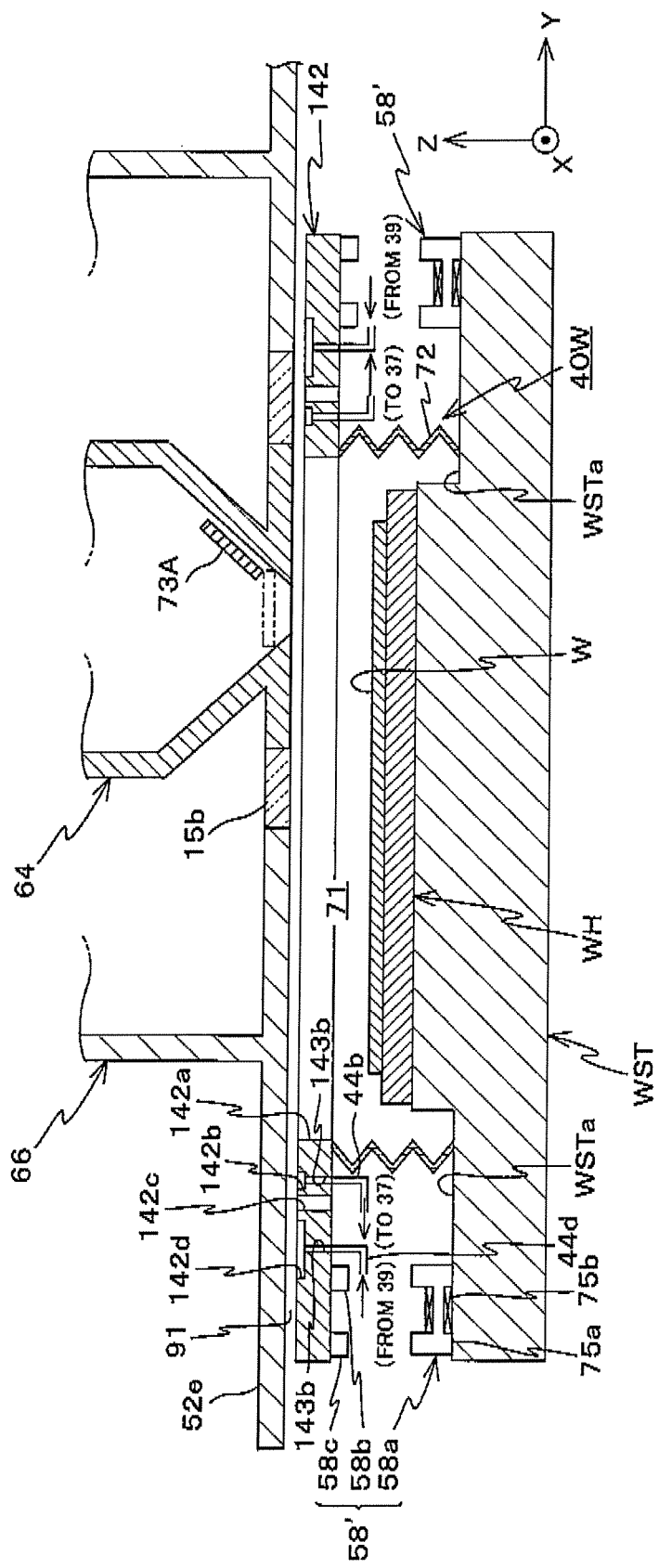
FIG. 37 is a longitudinal sectional view that shows a wafer side seal unit of the exposure apparatus in the fourth embodiment and its periphery.
Figure 38:
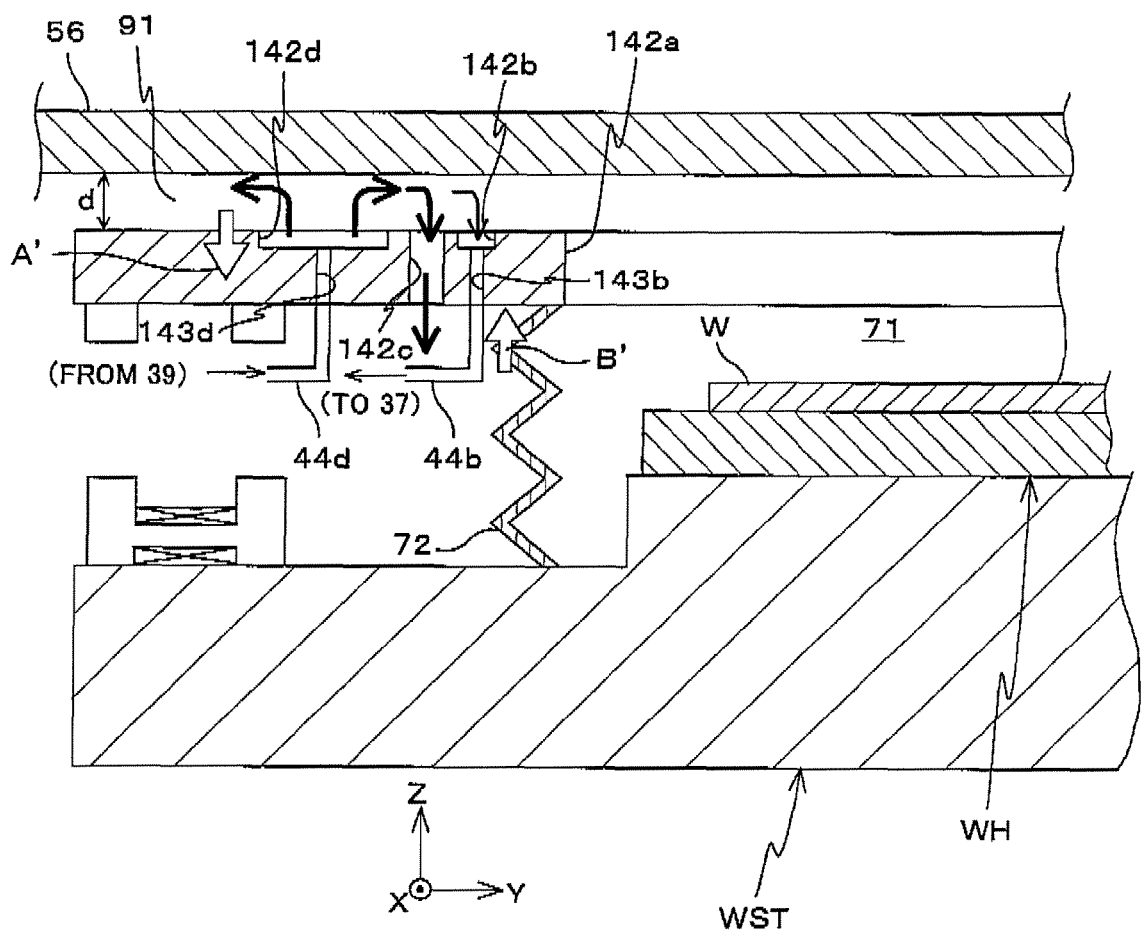
FIG. 38 is an enlarged view that shows a part of the left half section in FIG. 37.
Figure 39:
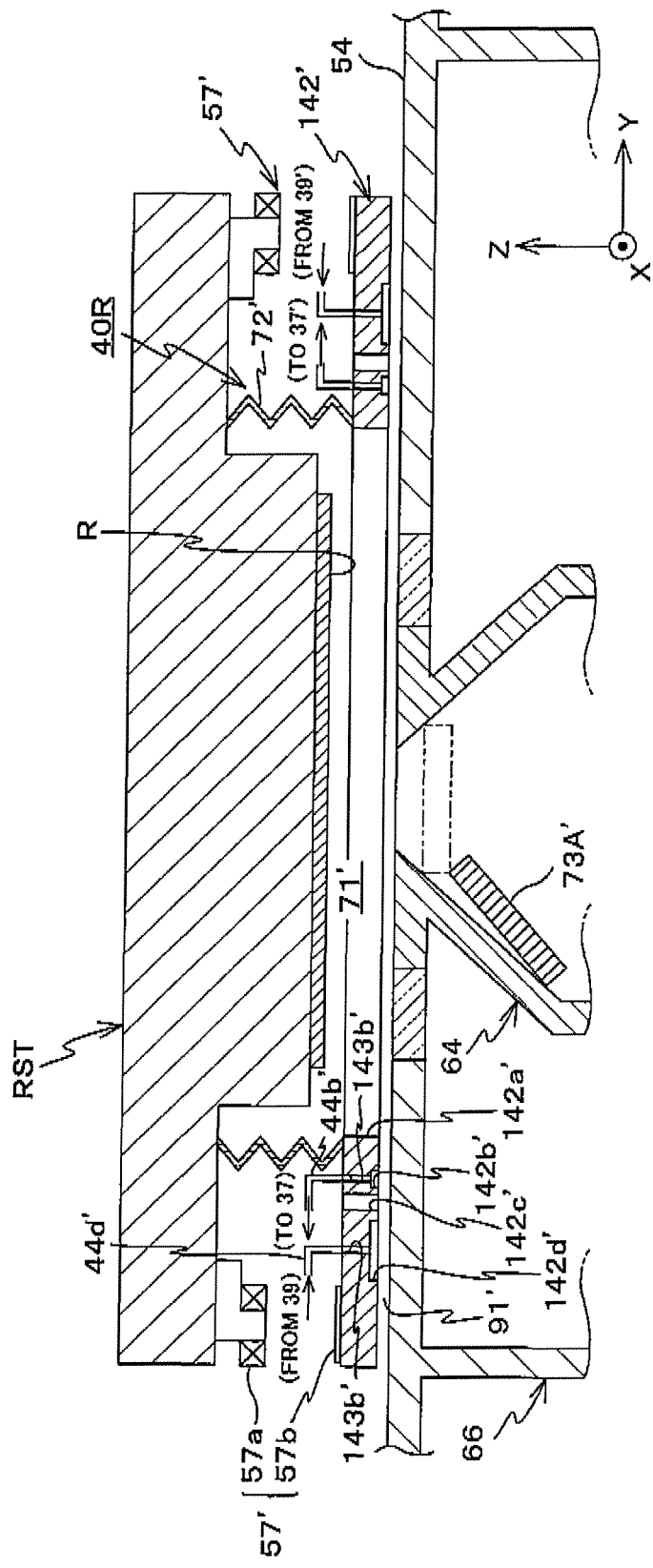
FIG. 39 is a longitudinal sectional view that shows a reticle side seal unit of the exposure apparatus in the fourth embodiment and its periphery.
Figure 40:
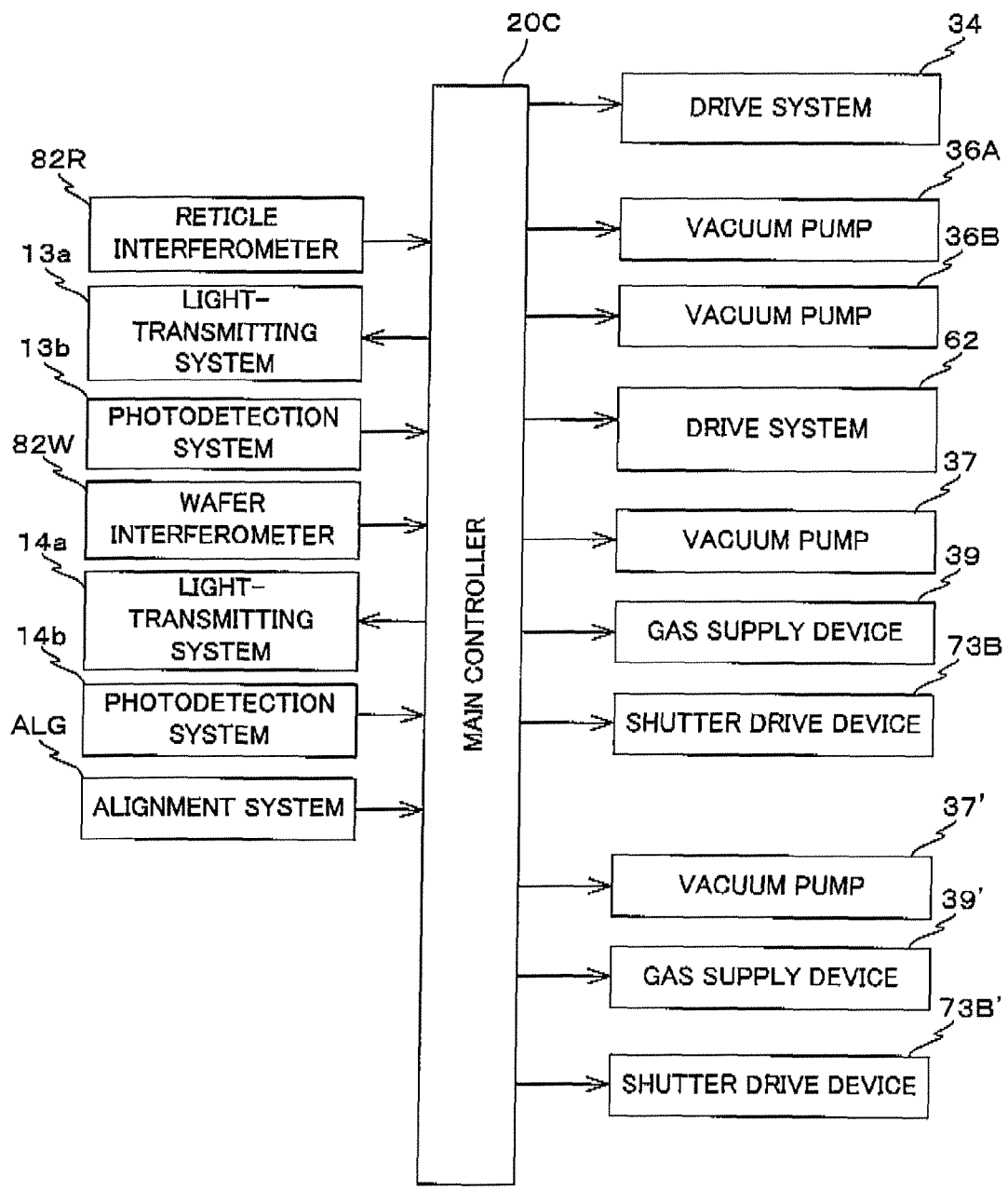
FIG. 40 is a block diagram that shows a control system of the exposure apparatus in the fourth embodiment.

FIG. 35 shows a schematic configuration of an exposure apparatus 10C related to the fourth embodiment. Further, FIG. 36 shows an enlarged view of a projection unit PU of exposure apparatus 10C. Further, FIG. 37 shows a wafer side seal unit of exposure apparatus 10C and its vicinity in a longitudinal sectional view, and FIG. 38 shows a part of the left half section of FIG. 37 in an enlarged view. Further, FIG. 39 shows a reticle side seal unit of exposure apparatus 10C and its vicinity in a longitudinal sectional view. Further, FIG. 40 is a block diagram showing an arrangement of a control system in exposure apparatus 10C.

Exposure apparatus 10C transfers the entire circuit pattern of a reticle R onto each of a plurality of shot areas on a wafer W by the step-and-scan method, by relatively scanning reticle R and wafer W in a one-dimension direction (in this case, a Y-axis direction) with respect to a projection optical system PO while projecting a part of the circuit pattern formed on reticle R via projection optical system PO on wafer W.

As it can be seen when comparing FIG. 35 and FIG. 1, exposure apparatus 10C is basically configured similar as a whole to exposure apparatus 10 of the first embodiment previously described. However, the configuration of projection unit PU, seal unit 40R, seal unit 40W, and the section related with these units are different from exposure apparatus 10. However, as it can be seen when comparing FIG. 35 and FIG. 25, each section including seal unit 40R and 40W of exposure apparatus 10C is configured similar to exposure apparatus 10B, except for projection unit PU. Accordingly, the description below will be focusing mainly on projection unit PU, which is the difference.

As shown in FIG. 35, projection unit PU is equipped with a projection optical system PO, and a chamber 52" having a double structure that houses projection optical system PO inside. As projection optical system PO, a reduction optical system is used with a numerical aperture (N.A.) of, for example, 0.1, and has, for example, six pieces of catoptric elements (mirrors), and having a projection magnification of, for example, ¼ times.

As shown in an enlarged view in FIG. 36, chamber 52" has a first vacuum chamber 64 in the inside and a second vacuum chamber 66 which houses the first vacuum chamber 64. The upper end of the first vacuum chamber 64 and the upper end of the second vacuum chamber 66 are arranged flush, and in upper side plate 54 which configures the top plate section, a circular opening 66b is formed that surrounds a flange section having a circular circumference arranged in the periphery of the upper end of the first vacuum chamber 64. The lower end of the first vacuum chamber 64 and the lower end of the second vacuum chamber 66 are arranged flush, and in lower side plate 56 which configures the bottom plate section, a circular opening 66c is formed that surrounds a flange section having a circular circumference arranged in the periphery of the lower end of the first vacuum chamber 64.

In the side wall, the upper end, and the lower end of the first vacuum chamber 64, openings 64a, 52b and 52c are formed, respectively. Further, in the vicinity of opening 52b inside first vacuum chamber 64, a shutter 73A' which can open/close opening 52b is arranged. Shutter 73A' is driven between a position shown by a solid line and a position shown by a phantom line in FIG. 36, by shutter drive unit 73B' (refer to FIG. 40). Similarly, in the vicinity of opening 52c inside first vacuum chamber 64, a shutter 73A which can open/close opening 52c is arranged. Shutter 73A is driven between a position shown by a solid line and a position shown by a phantom line in FIG. 36, by shutter drive unit 73B (refer to FIG. 40). Incidentally, in the description below, the state where shutters 73A and 73A' are shown by the phantom lines will be referred to as "a closed state", and the state where shutters 73A and 73A' are shown by the solid lines will be referred to as "an opened state".

In the side wall of the second vacuum chamber 66, an opening 66a is formed at a position corresponding to opening 64a. Further, in a gap between opening 66b formed in upper side plate 54 of the second vacuum chamber 66 and the flange section of the periphery of the upper end of the first vacuum chamber 64, for example, a loop shaped transparent member 15a made out of a material such as glass in which the detection beam of the reticle focus sensor (13a, 13b) can pass through is arranged. More specifically, upper side plate 54, transparent member 15a, and the upper end (the flange section) of the first vacuum chamber 64 configure a plate which appears to be a single plate with opening 52b formed about the center.

Similarly, in a gap between opening 66c formed in lower side plate 56 of the second vacuum chamber 66 and the flange section of the periphery of the lower end of the first vacuum chamber 64, for example, a loop shaped transparent member 15b made out of a material such as glass in which the detection beam of the wafer focus sensor (14a, 14b) can pass through is arranged. More specifically, lower side plate 56, transparent member 15b, and the lower end (the flange section) of the first vacuum chamber 64 configure a plate which appears to be a single plate with opening 52c formed about the center.

The section of upper side plate 54 projecting out from the side wall of the second vacuum chamber 66 serves as flange section 52d, which has a rough rectangular outer shape in a planar view (when viewed from the +Z direction). Further, the section of lower side plate 56 projecting out from the side wall of the second vacuum chamber 66 serves as flange section 52e, which has a rough circular outer shape in a planar view (when viewed from the −Z direction).

The flatness of the upper surface of chamber 52", or more specifically, the upper surface of the plate which appears to be a single plate including upper side plate 54 as is described above, and the flatness of the lower surface of chamber 52", or more specifically, the lower surface of the plate which appears to be a single plate including lower side plate 56 as is described above, are set extremely high.

Furthermore, a first vacuum pump 36A is connected to the first vacuum chamber 64, and a second vacuum pump 36B is connected to the second vacuum chamber 66. The first vacuum pump 36A sets the inside of the first vacuum chamber 64 to a high vacuum environment, and the second vacuum pump 36B sets the inside of the second vacuum chamber 66 to a rough vacuum environment (a negative pressure environment where the pressure is higher than the first vacuum chamber 64).

In the embodiment, EUV light EL emitted from light source device 12 that has passed through the illumination optical system (except for mirror M) is incident on reticle R at a predetermined incidence angle, via opening 66a of the second vacuum chamber 66, opening 64a of the first vacuum chamber 64, mirror M, and opening 52b. Then, EUV light EL is reflected by reticle R, and by EUV light EL including the information of the pattern formed on reticle R passing through each of the catoptric elements (mirrors) configuring projection optical system PO and being projected on wafer W via opening 52c, a ¼ reduced image of the pattern on reticle R is transferred (formed) on wafer W.

In exposure apparatus 10C, as shown in FIGS. 35 and 36, the reticle focus sensor (13a, 13b) is arranged inside projection unit FU (the second vacuum chamber 66). The reticle focus sensor (13a, 13b) includes a light-transmitting system 13a which irradiates a detection beam to the patterned surface (the lower surface) of reticle R from an oblique direction via transparent member 15a shown in FIG. 36, and a photodetection system 13b which receives the detection beam reflected off the patterned surface (the lower surface) of reticle R via transparent member 15a. As the reticle focus sensor (13a, 13b), the multiple point focal point position detection system previously described is used.

Further, as shown in FIGS. 35 and 36, the wafer focus sensor (14a, 14b) is arranged inside projection unit PU (the second vacuum chamber 66). The wafer focus sensor (14a, 14b) includes a light-transmitting system 14a which irradiates a detection beam to the upper surface of wafer W from an oblique direction via transparent member 15b shown in FIG. 36, and a photodetection system 14b which receives the detection beam reflected off the upper surface of wafer W via transparent member 15b. As the wafer focus sensor (14a, 14b), the multiple point focal point position detection system previously described is used.

As shown in FIGS. 37 and 40, seal unit 40W includes a static gas bearing member 142, bellows 72 which connects the lower surface of gas static bearing member 142 and the upper surface of stepped portion WSTa of wafer stage WST in an air tight state, and a plurality of electromagnet/permanent magnet units 58' arranged in between static gas bearing member 142 and wafer stage WST, and is configured similar to seal unit 40W of the third embodiment previously described (refer to FIGS. 26 and 30).

Accordingly, in seal unit 40W, when compressed air is supplied from gas supply device 39 (refer to FIG. 40) via gas supply pipe 44d and gas supply line 143d as shown in FIG. 38, compressed air flows out from the entire gas supply groove 142d to the lower surface of lower side plate 56 of chamber 52". This makes a force in the direction (a downward direction) indicated by an outlined arrow A' act on static gas bearing member 142 by the static pressure in a gap (bearing clearance) 91, which is the gap between the upper surface (a bearing surface) of static gas bearing member 142 and the lower surface of lower side plate 56.

Meanwhile, the compressed air that blows out to the lower surface of lower side plate 56 flows toward the −Y direction (from the inner side of bearing clearance 91 towards the outer side) in FIG. 38 of bearing clearance 91 and toward the +Y direction (from the outer side of bearing clearance 91 towards the inner side), and most of the air which flows from the outer side of bearing clearance 91 toward the inner side passes through open air section 142c and is exhausted below static gas bearing member 142. Further, the air which was not exhausted from open air section 142c tries to flow furthermore toward the inner side of bearing clearance 91, however, such air is removed by vacuum suction by vacuum pump 37, via exhaust groove 142b, exhaust line 143b, and exhaust pipe 44b. In this case, by the vacuum suction force of vacuum pump 37, the vicinity of exhaust groove 142b moves to a negative pressure state, and a force in the direction (an upward direction) indicated by an outlined arrow B' will act on static gas bearing member 142.

More specifically, in the embodiment, even if wafer stage WST moves in directions of six degrees of freedom, bearing clearance 91 of a predetermined distance d (e.g. d is around 5 μm) between static gas bearing member 142 and the lower surface of lower side plate 56 is maintained by the balance between the downward force (static pressure (clearance internal pressure) in bearing clearance 91 and a force including the self-weight of static gas bearing member 142') and the upward force (a force by the difference of negative pressure which occurs due to vacuum suction and atmospheric pressure) that acts on static gas bearing member 142. Further, by the flow of gas in bearing clearance 91 shown in FIG. 38, the circulation of the gas between the inside and the outside of a space 71 (refer to FIG. 38) including the inside of bellows 72 and the inside of through hole 142a of static gas bearing member 142 is in a blocked state.

In the fourth embodiment, because the circulation of the gas between the inside and the outside of space 71 (refer to FIG. 37) is in a blocked state as is previously described, by vacuum suctioning the inside of first vacuum chamber 64 by vacuum pump 36A (refer to FIG. 35) in a state where shutter 73A is set to an opened state, the inside of space 71 can be set to a vacuum environment along with the inside of the first vacuum chamber 64, and the vacuum environment can be maintained.

Incidentally, although the explanation lacks sequence, when wafer W is exposed, wafer stage WST moves in the X-axis direction and the Y-axis direction in a range of the same stroke or more than the diameter (e.g., 300 mm) of wafer W. Accordingly, lower side plate 56 has to be set around to a size where lower side plate 56 covers the range of movement of static gas bearing member 142.

Figure 29:
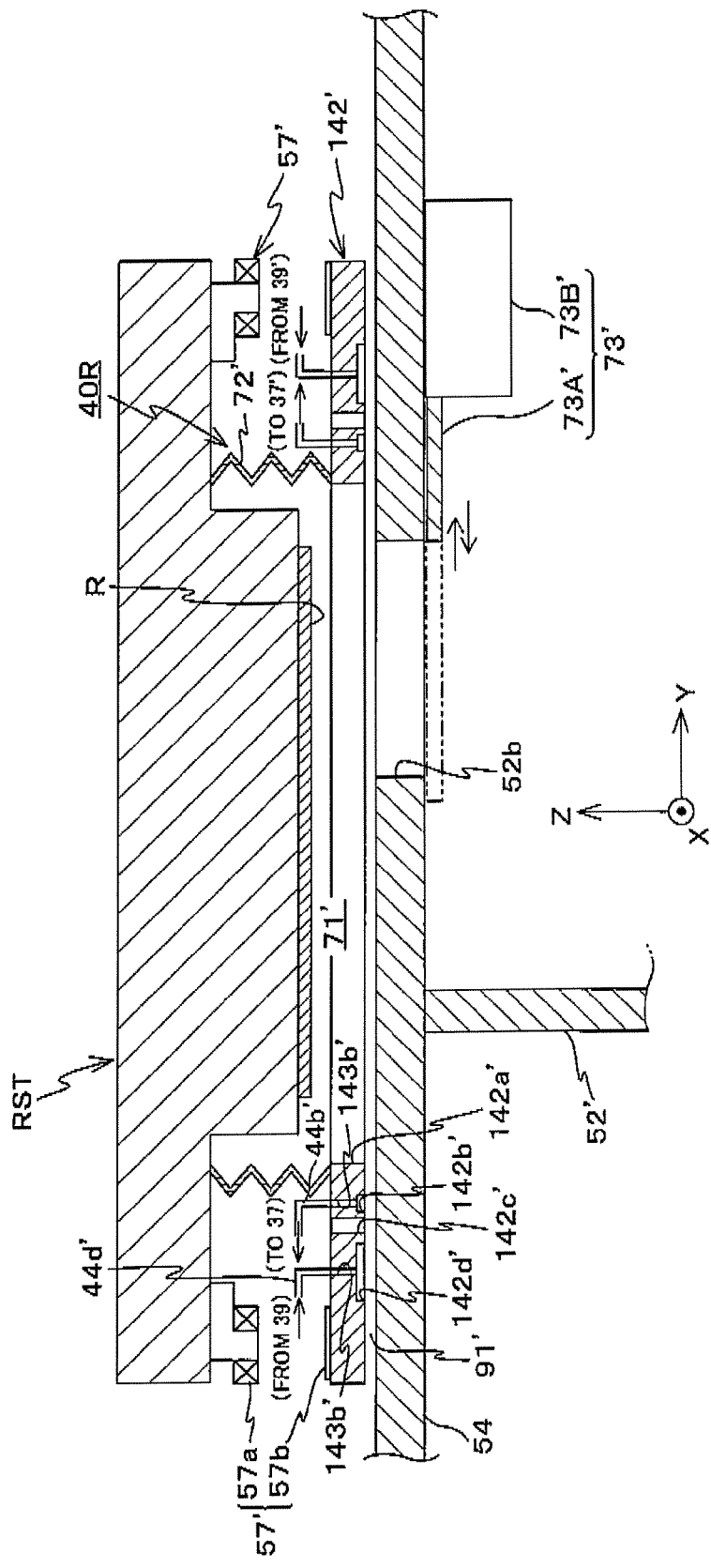
FIG. 29 is a longitudinal sectional view that shows a reticle side seal unit of the exposure apparatus in the third embodiment and its periphery.

As shown in FIGS. 39 and 40, seal unit 40R is configured similar to seal unit 40R of the third embodiment previously described (refer to FIGS. 29, 30 and the like). Incidentally, also in the fourth embodiment, because seal unit 40R has almost the same configuration as that of seal unit 40W vertically reversed, the sections same or similar to seal unit 40W will be indicated by adding an "'" to the same reference codes which were used when describing seal unit 40W.

Accordingly, in seal unit 40R, when compressed air supplied from gas supply device 39' (refer to FIG. 40) blows out to the upper surface of upper side plate 54 of chamber 52" from gas supply groove 142d' as in seal unit 40W previously described, an upward (the +Z direction) force acts on static gas bearing member 142' by the static pressure in the gap (bearing clearance 91') between the lower surface of static gas bearing member 142' and the upper surface of upper side plate 54. Meanwhile, the compressed air that blows out toward the upper surface of upper side plate 54 flows from the inner side of bearing clearance 91' toward the outer side, and toward the inner side from the outer side, however, most of the air which flows from the outer side toward the inner side passes through open air section 142c' and is exhausted above static gas bearing member 142'. Further, the air which was not exhausted from open air section 142c' furthermore tries to flow toward the inner side of bearing clearance 91', however, such air is removed by vacuum suction by a vacuum pump 37' (refer to FIG. 40), via exhaust groove 142b'. In this case, by the difference between the negative pressure occurring in the vicinity of exhaust groove 142b' due to the vacuum suction force of vacuum pump 37' and the atmospheric pressure, a downward force (the −Z direction) will act on static gas bearing member 142.

More specifically, in the embodiment, even if reticle R (reticle stage RST) moves in directions of six degrees of freedom, bearing clearance 91' of a predetermined distance is maintained between the lower surface of static gas bearing member 142' and the upper surface of upper side plate 54, by the balance between the upward force (a force including static pressure (clearance internal pressure) in bearing clearance 91') and the downward force (a force by the difference of negative pressure which occurs due to vacuum suction and atmospheric pressure and a force including the self-weight of static gas bearing member 142') that acts on static gas bearing member 142. Further, by the flow of gas in bearing clearance 91', the circulation of the gas via bearing clearance 91' between the inside and the outside of a space 71' (refer to FIG. 39) including the inside of bellows 72' and the inside of through hole 142a' of static gas bearing member 142' is in a blocked state.

Accordingly, by vacuum suctioning the inside of first vacuum chamber 64 by vacuum pump 36A (refer to FIG. 35) in a state where shutter 73A' is set to an opened state, the inside of space 71' can be set to a vacuum environment along with the inside of the first vacuum chamber 64, and the vacuum environment can be maintained.

Incidentally, in the case of the exposure operation which will be described later, reticle stage RST moves in the Y-axis direction in a range of the same stroke or more than the length of reticle R in the Y-axis direction. Accordingly, upper side plate 54 has to be set around to a size where upper side plate 54 covers the range of movement of static gas bearing member 142'.

The control system of exposure apparatus 10C shown in FIG. 40 is mainly configured of main controller 20C. Main controller 20C is configured including a so-called microcomputer (or workstation), and has overall control over the entire apparatus. The configuration of other sections is similar to exposure apparatus 10 of the first embodiment previously described, or to exposure apparatus 10B of the third embodiment previously described.

Next, an operation in an exposure process by exposure apparatus 10C of the fourth embodiment configured in the manner described above will be described, referring to FIGS. 41A to 44B. Incidentally, as a premise, reticle stage RST is to hold a reticle R' which has been exposed, and wafer stage WST is to hold a wafer W' which has been exposed.

Figure 41A:
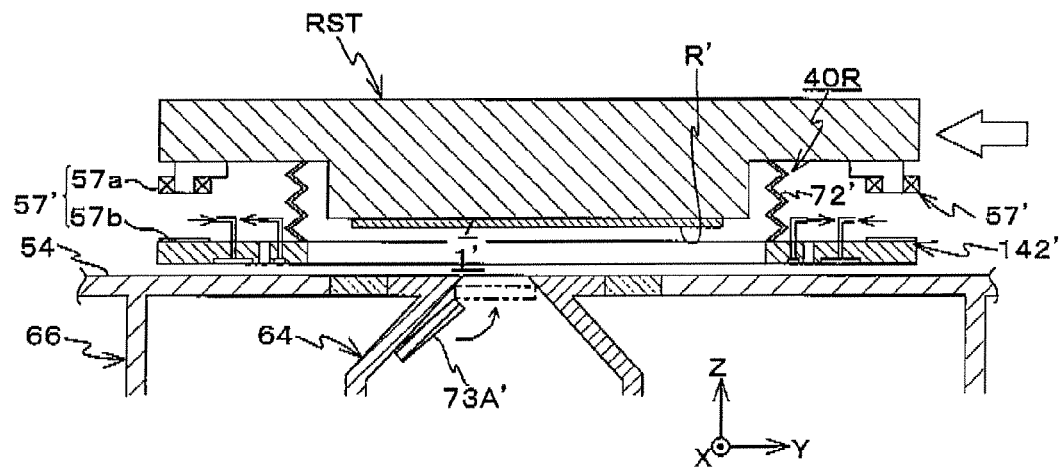
FIGS. 41A and 41B are views (No. 1) for explaining a reticle exchange operation of the exposure apparatus in the fourth embodiment.
Figure 41B:
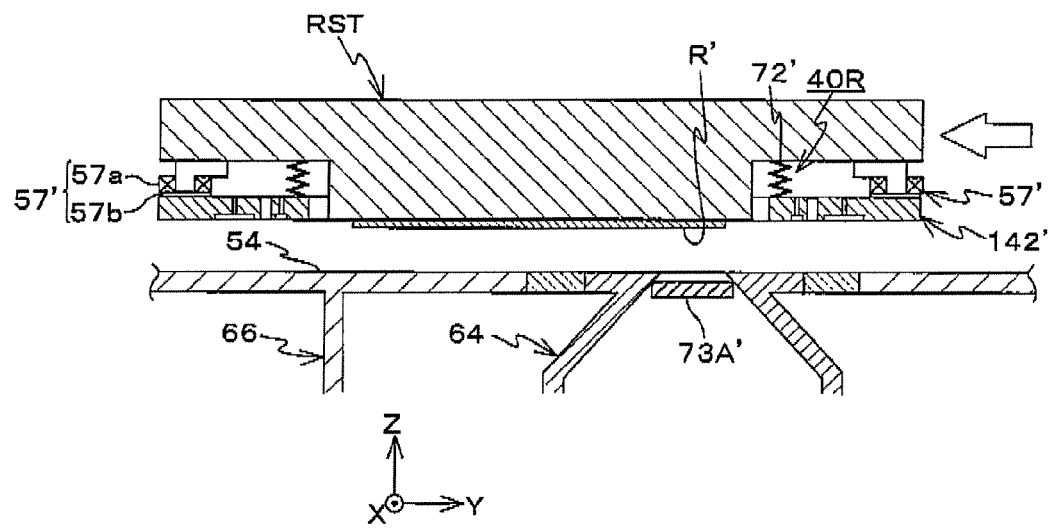

First of all, an exchange operation of a reticle on reticle stage RST will be described. In this exchange operation, first of all, main controller 20C moves reticle stage RST via drive system 34 in the −Y direction toward a predetermined loading position (refer to FIG. 41A). During such movement of reticle stage RST, main controller 20C makes shutter 73A' move into a closed state via a shutter drive unit 73B' and stops the vacuum suction by vacuum pump 37' and the supply of compressed air by gas supply device 39'. Further, substantially at the same time as this, main controller 20C supplies current to a coil of electromagnet 57a of electromagnet unit 57' and generates a magnetic attraction in electromagnet unit 57', which drives static gas bearing member 42' upward as shown in FIG. 41B By this operation, magnetic material member

57b is adsorbed by electromagnet 57a, and static gas bearing member 142' will be fixed to reticle stage RST.

Figure 42A:
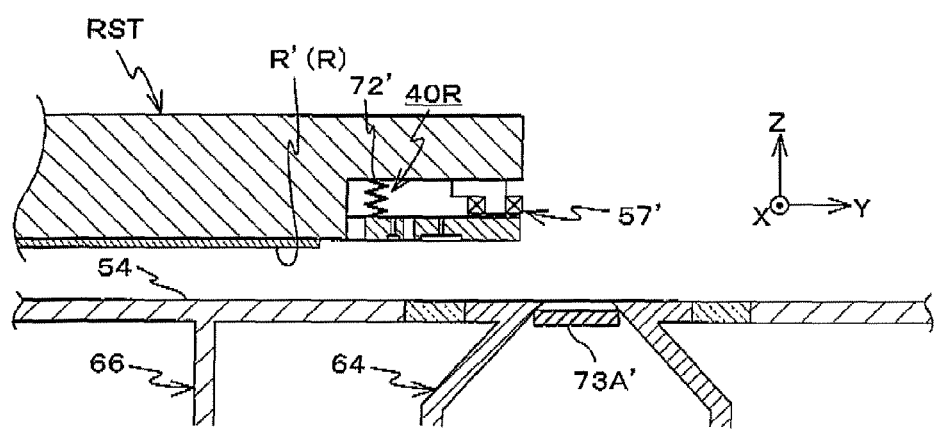
FIGS. 42A and 42B are views (No. 2) for explaining a reticle exchange operation of the exposure apparatus in the fourth embodiment.

Next, main controller 20C exchanges reticle R' held by reticle stage RST to a new reticle R via a reticle carrier system (not shown), in a state where reticle stage RST is positioned at a predetermined loading position shown in FIG. 42A.

Figure 42B:
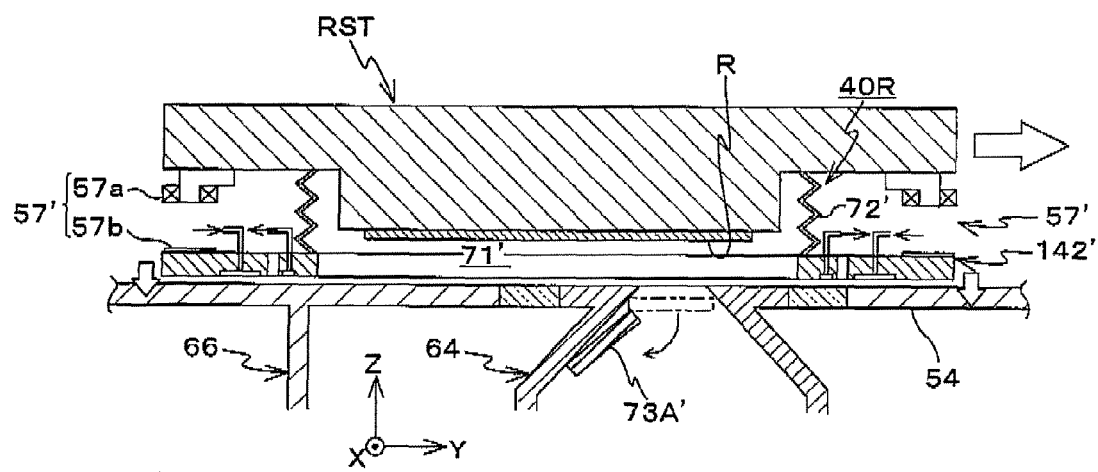

And, at the stage where a new reticle R has been loaded on reticle stage RST, main controller 20C moves reticle stage RST in the +Y direction. In the course of this movement, main controller 20C makes static gas bearing member 142' move downward by releasing the magnetic attraction of electromagnet unit 57', as shown in FIG. 42B. Further, substantially at the same time as this, main controller 20C operates vacuum pump 37' and gas supply device 39', and furthermore, sets space 71' to a vacuum environment by making shutter 73A' move into an opened state via shutter drive unit 73B'.

By the operations described above, the reticle exchange operation on reticle stage RST is completed.

Figure 43A:
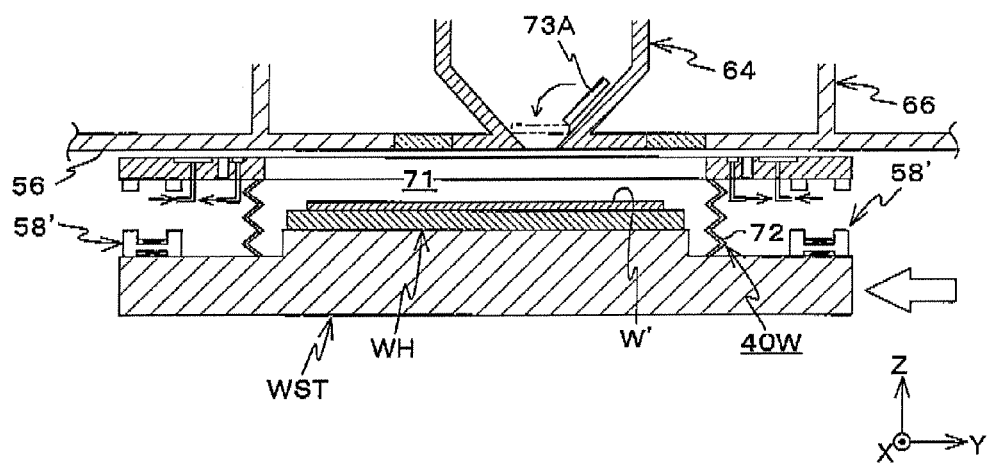
FIGS. 43A and 43B are views (No. 1) for explaining a wafer exchange operation of the exposure apparatus in the fourth embodiment.
Figure 43B:
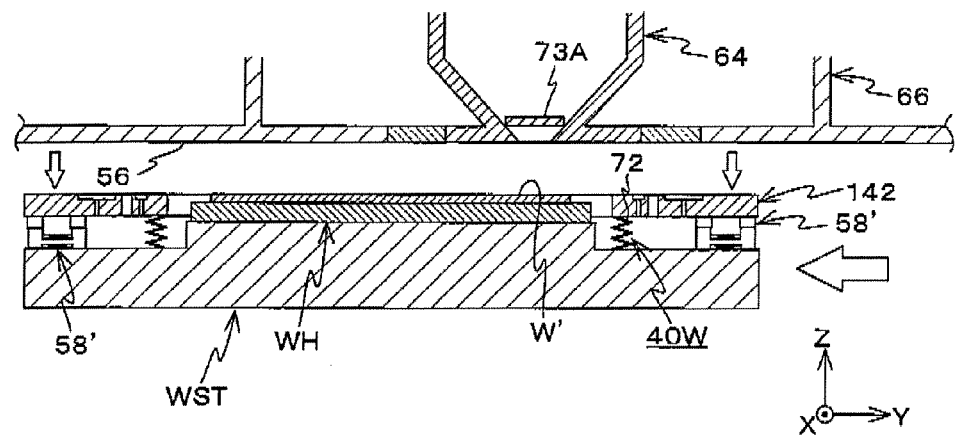

Next, an exchange operation of a wafer on wafer stage WST will be described. In this exchange operation, first of all, main controller 20C moves wafer stage WST via drive system 62 in the −Y direction toward a predetermined loading position (refer to FIG. 43A). During such movement of wafer stage WST, main controller 20C makes shutter 73A move into a closed state via a shutter drive unit 73B and stops the vacuum suction by vacuum pump 37 and the supply of compressed air by gas supply device 39. By this operation, static gas bearing member 142 moves downward due to its self-weight as shown in FIG. 43B. Incidentally, the position of static gas bearing member 142 can be fixed by supplying current to coil 75b of electromagnet 58a of electromagnet/permanent magnet unit 58' and generating a magnetic attraction, in the state shown in FIG. 43B.

Figure 44A:
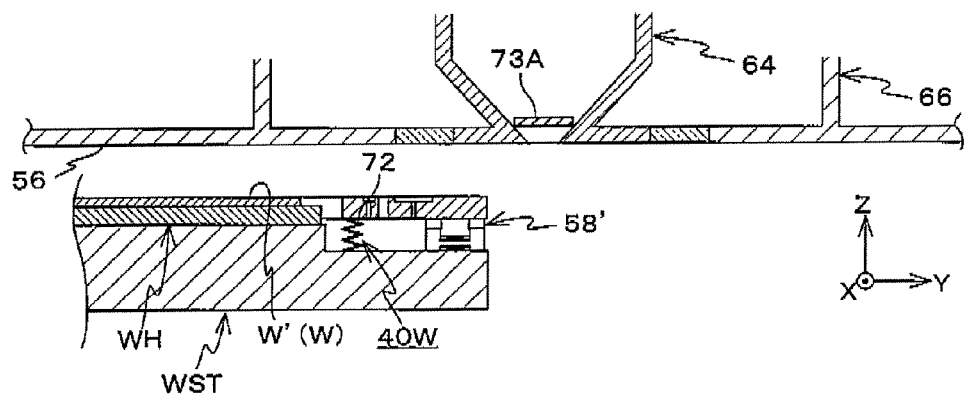
FIGS. 44A and 44B are views (No. 2) for explaining a wafer exchange operation of the exposure apparatus in the fourth embodiment.
Figure 44B:
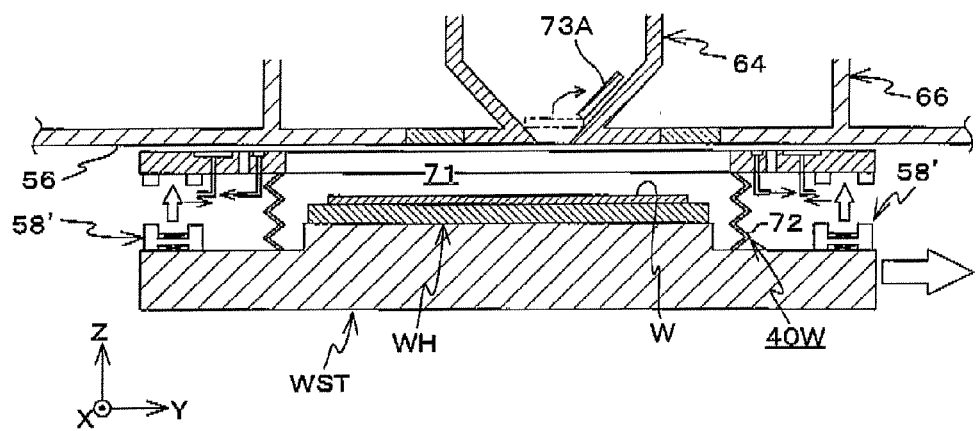

Next, main controller 20C exchanges wafer W' which has been exposed on wafer stage WST to a new wafer W via a wafer carrier system (not shown), in a state where wafer stage WST is positioned at the predetermined loading position shown in FIG. 44A.

And, at the stage where a new wafer W has been loaded on wafer stage WST, main controller 20C moves wafer stage WST in the +Y direction. In the course of this movement, main controller 20C supplies current to coil 75b of electromagnet 58a of electromagnet/permanent magnet unit 58' and generates a magnetic repulsion in electromagnet/permanent magnet unit 1257, so that static gas bearing member 142 is driven upward (refer to FIG. 44B).

Because the upper surface of static gas bearing member 142 moves closer to the lower surface of lower side plate 56 by this upward drive, main controller 20C operates vacuum pump 37 and gas supply device 39 at an appropriate timing, and furthermore makes shutter 73A move into an opened state via shutter drive unit 73B so that the inside of space 71 is set to a vacuum environment.

By the operations described above, the wafer exchange operation on wafer stage WST is completed.

When the reticle exchange and the wafer exchange are completed in the manner described above, main controller 20C performs a series of preparatory operations for exposure which includes reticle alignment, baseline measurement of alignment system ALG, wafer alignment by the so-called EGA method and the like, in a procedure similar to the ones described earlier.

When the series of preparatory operations are completed, then, as is previously described, main controller 20C performs exposure operation by the step-and-scan method. More specifically, main controller 20C moves wafer stage WST to a scanning starting position (acceleration starting position) for exposure of the first shot area, while monitoring positional information from wafer interferometer 82W according to the positional information of each shot area on wafer W which was obtained as a result of wafer alignment, and also moves reticle stage RST to a scanning starting position (acceleration starting position) and performs scanning exposure on the first shot area. On this scanning exposure, while performing Z position control and attitude control of reticle R and wafer W based on the measurement values of the reticle focus sensor (13a, 13b) and the wafer focus sensor (14a, 14b), respectively, main controller 20C drives reticle stage RST and wafer stage WST in opposite directions mutually and also controls the speed of both stages so that the velocity ratio of the stages accurately coincides with the projection magnification of projection optical system PO, and performs exposure (transfer of the reticle pattern). Accordingly, on the first shot area on wafer W, for example, a transferred image of the circuit pattern is formed.

When scanning exposure of the first shot area is completed in the manner described above, main controller 20C performs a stepping operation between shot areas so as to move wafer stage WST to a scanning starting position (acceleration starting position) for exposure of the second shot area, and hereafter, alternately repeats a scanning exposure operation to the shot areas and the stepping operation between shot areas. In the manner described above, in exposure apparatus 10C, the pattern of reticle R is transferred onto all the shot areas on wafer W by the step-and-scan method.

During the scanning exposure described above, because EUV light EL emitted from light source device 12 reaches wafer W passing through a vacuum environment such as space 71' formed by vacuum chamber 11, the second vacuum chamber 66, the first vacuum chamber 64, and seal unit 42R, and space 71 formed by seal unit 42W, almost none of the EUV light EL is absorbed by other materials such as oxygen before the light reaches wafer W.

According to exposure apparatus 10C of the fourth embodiment described in detail above, an equivalent effect as exposure apparatus 10B of the third embodiment previously described can be obtained. In addition to this, in the fourth embodiment, because projection unit PU includes the first vacuum chamber 64, which has its inside set to a negative pressure state (a vacuum state), and the second vacuum chamber 66 set to a negative pressure state whose pressure is higher than the first vacuum chamber 64 (a state where the degree of vacuum is low) and has the first vacuum chamber 64 housed in the inside, the difference in pressure in the inside and the outside of the first vacuum chamber 64 can be made smaller when compared with the case when the first vacuum chamber 64 is arranged under atmospheric pressure. Because this suppresses the deformation of the first vacuum chamber 64 caused by the difference in pressure inside and outside the first vacuum chamber 64, it becomes possible to suppress variation such as in the positional relation of a mirror element which constitutes projection optical system PO housed in the first vacuum chamber 64 as much as possible.

Further, according to exposure apparatus 10C of the embodiment, because the apparatus is equipped with projection unit PU in which the variation such as in the positional relation of the mirror element is suppressed as much as possible, by performing exposure using such projection unit PU, exposure with high precision can be performed for over a long period.

Incidentally, in the fourth embodiment, while the case has been described where transparent member 15a is arranged between opening 66b of the second vacuum chamber 66 and the upper end of the first vacuum chamber 64 and transparent member 15b is arranged between opening 66c of the second vacuum chamber 66 and the lower end of the first vacuum chamber 64, as well as this, for example, either one of transparent members 15a or 15b can be arranged. Further, when there is hardly any gaseous circulation via opening 66b or 66c of the second vacuum chamber 66 and the opening between the upper end or the lower end of the first vacuum chamber 64 (or when the gaseous circulation hardly has any influence on the exposure precision), transparent members 15a and 15b do not have to be arranged. In the case transparent members 15a and 15b are not arranged, for example, even if compressed air leaks from static gas bearing members 142 and 142' into space 71 and 71', most of the compressed air enters the second vacuum chamber 66. Accordingly, because the compressed air is made so that it hardly enters the first vacuum chamber 64, exposure with high precision can be performed for over a long period.

Further, in the fourth embodiment above, while the reticle focus sensor (13a, 13b) and the wafer focus sensor (14a, 14b) were to be arranged in the second vacuum chamber 66, at least one of the reticle focus sensor and the wafer focus sensor can be arranged in the first vacuum chamber 64. Further, of the reticle focus sensor and the wafer focus sensor, at least a part of the sensors can be placed exterior to projection unit PU.

Incidentally, the shape of the first vacuum chamber 64 and the second vacuum chamber 66 described in the fourth embodiment above is only a mere example, and it goes without saying that the present invention is not limited to the shape described above.

Further, in the fourth embodiment above, while the case has been described where projection unit FU has a double chamber (the first vacuum chamber 64 and the second vacuum chamber 66), the present invention is not limited to this, and another chamber can be arranged furthermore outside the second vacuum chamber 66.

Incidentally, in the third and fourth embodiments above, while the case has been described where the apparatus is equipped with electromagnet unit 57' that drives static gas bearing member 142' upward against its self-weight on the exchange of reticle R and connects static gas bearing member 142' and reticle stage RST by electromagnetic force as a mechanism for fixing static gas bearing member 142' to reticle stage RST, other mechanisms can also be used, as long as the mechanism can connect reticle stage RST and static gas bearing member 142'. For example, a mechanism that connects reticle stage RST and static gas bearing member 142' by vacuum suction force can also be employed, or a mechanism which connects both sections by a mechanical connection can also be employed.

Further, the same applies for the wafer side, and various kinds of mechanisms that can move static gas bearing member 142 in the +Z direction instead of electromagnet/permanent magnet unit 58' can be employed, such as, for example, a mechanism that makes a drive force in the +Z direction act on static gas bearing member 142 by a gaseous blowout force, or a voice coil motor or the like.

Incidentally, in the third and fourth embodiments described above, while the case has been described where static gas bearing members 142 and 142', exhaust grooves 142b and 142b', and gas supply grooves 142d and 142d' and the like have a circular shape, the sections above can also have a rectangular ring shape. Further, static gas bearing members 142 and 142', exhaust grooves 142b and 142b', and gas supply grooves 142d and 142d' only need to be a rough circular shape, and for example, can have a shape roughly resembling a letter C.

Incidentally, in the third and fourth embodiments above, while the case has been described where the periphery portion of upper side plate 54 and lower side plate 56a that constitute a part of the chamber (152', 152") each configure a flange section, the present invention is not limited to this, and the flange section can be configured of a different member besides the chamber and can be fixed to the upper end and lower end of the chamber. Further, in the case the upper end surface of the chamber has an area around the size to cover the movement range of the movement range of reticle stage RST and the lower end surface has an area around the size to cover the movement range of the movement range of wafer stage WST, the flange sections do not have to be arranged. In this case, it is desirable to set the degree of flatness of the upper end surface and the lower end surface of the chamber high.

Incidentally, in the first to fourth embodiments (in each of the embodiments above), while the case has been described where the exposure apparatus (10,10A, 10B, 10C) each have seal unit 40W and seal unit 40R, the exposure apparatus can also have at least either one of the seal units. In the case when the exposure apparatus only has seal unit 40W, reticle stage RST can be housed in a vacuum chamber for the reticle stage, and when the exposure apparatus only has seal unit 40R, wafer stage WST can be housed in a vacuum chamber for the wafer stage.

Further, in the first, third, and fourth embodiments above, the reticle focus sensor and the wafer focus sensor each measure the Z position of reticle R and wafer W, via the static gas bearing member. Therefore, when the position and/or attitude of the static gas bearing member changes, a measurement error may occur in the reticle focus sensor and the wafer focus sensor. So, it is desirable to arrange a sensor which can measure the position and/or the inclination of the static gas bearing member, and to perform correction of the measurement error described above, or to perform control of the Z position and/or the attitude of reticle R and wafer W, based on the output of the sensor. Furthermore, in the third and fourth embodiments above, the Z position of reticle R and wafer W is measured with the reticle focus sensor and the wafer focus sensor, respectively, via a part (transparent members 15a and 15b previously described) of the chamber of projection unit PU. Therefore, a measurement error may occur similarly due to the change in position and/or attitude of projection unit PU, or by vibration. So, it is desirable to arrange a sensor which can measure the position and/or the change in attitude, or vibration of projection unit PU, and to perform correction of the measurement error described above, or to perform control of the Z position and/or the attitude of reticle R and wafer W, based on the output of the sensor.

Further, in each of the embodiments above, while the exposure apparatus was equipped with both the reticle focus sensor and the wafer focus sensor, the present invention is not limited to this, and the apparatus can be equipped with either one of the sensors, or does not have to be equipped with the two sensors. Furthermore, in each of the embodiments above, while the wafer focus sensor was arranged on the image plane side of projection unit PU, the present invention is not limited to this, and the wafer focus sensor can be placed distanced away from projection unit PU. For example, in an exposure apparatus by a twin wafer stage method that can execute the exposure operation and the measurement operation (such as, for example, mark detection by the alignment system) almost in parallel using two wafer stages as disclosed in, U.S. Pat. No. 6,341,007, U.S. Pat. No. 6,262,796 and the like, the wafer focus sensor can be arranged in a measurement station where the measurement operation is performed.

Further, instead of a reticle, as a pattern formation member, an electronic mask (also referred to as a variable forming mask, an active mask, or an image generator, such as, for example, a non-emission type image display device (also called a spatial light modulator)), such as, for example, a micromirror device having multiple micromirrors can be employed. In this case, instead of reticle R in each of the embodiments above, the micromirror device can be held by the stage. Especially in the first and second embodiments described above, in the case of using a micromirror device instead of reticle R, the stage or a holder holding the micromirror device does not have to be movable. In any case, on-off control of each micromirror in the area where the exposure beam of the micromirror device is irradiated will have to be performed individually, in synchronization with the wafer movement. In the case the micromirror is held by a movable stage, it is desirable to arrange a measurement device which measures the Z position and inclination of the stage as needed, instead of the reticle focus sensor (13a, 13b).

Incidentally, in each of the embodiments described above, while the case has been described where an open air section (42c, 42c', 142c, 142c') is arranged in static gas bearing member (42, 42', 142, 142'), the open air section does not necessarily have to be arranged. In such a case, compressed air can be exhausted outside from exhaust grooves 42b, 42b', 142b, and 142b'. Further, instead of the open air section, another exhaust groove can be arranged for vacuum suctioning in rough vacuum than the exhaust groove. Further, the shape of the open air section is not limited to the shape previously described, and various kinds of shapes can be employed for the open air section.

Further, in each of the embodiments above, while the case has been described where a total reflection projection optical system which uses EUV light as the exposure light and consists only of six mirrors is used, this is an example, and it is a matter of course that the present invention is not limited to this. More specifically, as a matter of course, it is possible to use a projection optical system consisting of only four mirrors as disclosed in, for example, Kokai (Japanese Patent Unexamined Application Publication) No. 11-345761 bulletin, as well as a projection optical system consisting of other numbers of mirrors.

Incidentally, in each of the embodiments above, while the case has been described where an EUV light having the wavelength of 11 nm is used as the exposure light, EUV light having a wavelength of 13 nm can also be used as the exposure light. In this case, in order to secure reflectivity of around 70% to EUV light having the wavelength of 13 nm, it is necessary to use a multilayer film in which molybdenum Mo and silicon Si are alternately layered as a reflection coating of each mirror.

Further, in each of the embodiments above, while the laser-excited plasma light source was used as the exposure light source, either one of a SOR light source, a betatron light source, a discharged light source, an X-ray laser and the like can also be used.

Incidentally, in each of the embodiments above, while the case has been described where the present invention was applied to a scanning stepper, the present invention can also be applied to an exposure apparatus of the static exposure type such as a stepper by the step-and-repeat method.

Incidentally, the wafer side seal unit of each of the embodiments above can be applied to an exposure apparatus which uses the EB (electron beam). Further, the wafer side seal unit and/or the reticle side seal unit can be applied to an exposure apparatus that uses a fluorine laser beam (an $F_2$ laser beam) having an output wavelength (oscillation wavelength) of 157 nm, as the exposure light, or to an exposure apparatus that uses an $Ar_2$ laser beam (wavelength 126 nm), and in this case, gas such as helium can be filled in chamber 52 and in spaces 71 and 71' inside each seal unit. Further, when the $Ar_2$ laser beam is used, a projection optical system having 4 to 8 mirrors can be used as the projection optical system.

Incidentally, an object on which a pattern is to be formed (an object subject to exposure to which an energy beam is irradiated) in each of the embodiments above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied to an exposure apparatus for transferring a liquid crystal display device pattern onto a rectangular glass plate and an exposure apparatus for producing organic ELs, thin magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Further, the exposure apparatus of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, semiconductor devices are manufactured through the steps of a step where the function/performance design of the wafer is performed, a step where a reticle based on the design step is manufactured, a step where a wafer is manufactured using silicon materials, a lithography step where the pattern formed on the reticle (mask) by the exposure apparatus (pattern formation apparatus) in each of the embodiments above is transferred onto a wafer, a development step where the wafer that has been exposed is developed, an etching step where an exposed member of an area other than the area where the resist remains is removed by etching, a resist removing step where the resist that is no longer necessary when etching has been completed is removed, a device assembly step (including processes such as a dicing process, a bonding process, and a packaging process), inspection steps and the like. In this case, because the exposure apparatus in the embodiment above is used in the lithography step, the productivity of highly integrated devices can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus which irradiates an energy beam on an object via an optical system and forms a predetermined pattern on the object, the apparatus comprising:
    a first chamber that houses the optical system and has its inside set to a negative pressure state;
    a second chamber which houses the first chamber and has its inside set to a negative pressure state with a higher pressure than the first chamber;
    a movable body which moves holding the object;
    a seal mechanism which has a loop-shaped static gas bearing member, the static gas bearing member surrounding the object and having an end section on the opposite side of the side that faces the second chamber connected to the movable body in an air tight state, and which isolates the inside of the static gas bearing member from the outside by a surface on the side facing the second chamber of the static gas bearing member forming a predetermined clearance between the static gas bearing member and a predetermined plane of the second chamber facing the object; and
    a detection system that detects surface position information of the object, the detection system being arranged inside the second chamber and yet outside the first chamber.

2. The exposure apparatus according to claim 1, wherein the second chamber has a chamber main section which houses the first chamber, and a flange section which is arranged projecting on a periphery section of the chamber main section and has a surface configuring a part of the predetermined plane, the predetermined plane having such a size that covers a range of movement of the static gas bearing member.

3. The exposure apparatus according to claim 1 wherein
    the static gas bearing member has a gas blowing groove to blow out gas to the predetermined plane of the second chamber and a gas suction groove to suction the gas which has been blown out, and
    the predetermined clearance is maintained between the static gas bearing member and the predetermined plane, by a balance between a force in a direction withdrawing from the predetermined plane including the static pressure of the gas in the clearance and a force in a direction approaching the predetermined plane caused by a negative pressure which occurs in the vicinity of the gas suction groove by the suction of the gas, acting on the static gas bearing member.

4. The exposure apparatus according to claim 3 wherein
    the gas blowing groove and the gas suction groove have a loop shape, respectively, and
    the gas suction groove is formed on the inner side of the gas blowing groove in a surface on the side facing the predetermined plane of the static gas bearing member.

5. The exposure apparatus according to claim 4 wherein in between the gas blowing groove and the gas suction groove of the static gas bearing member, an open air section is formed whose inside is open to the atmosphere.

6. The exposure apparatus according to claim 1 wherein
    the sealing mechanism further includes a loop-shaped expansion/contraction member which is connected to the movable body and the static gas bearing member, and expands and contracts in a widening direction and a narrowing direction of the clearance.

7. The exposure apparatus according to claim 6, the apparatus further comprising:
    a moving device which makes the static gas bearing member move between a position where the predetermined clearance is formed with the predetermined plane and a position where a spacing larger than the predetermined clearance is formed with the predetermined plane.

8. The exposure apparatus according to claim 7 wherein the moving device makes the static gas bearing member move by electromagnetic force.

9. The exposure apparatus according to claim 1 wherein the energy beam is an extreme ultraviolet light.

10. The exposure apparatus according to claim 1, the apparatus further comprising:
    a shutter device that isolates the inside of the first chamber to the outside.

11. A device manufacturing method including
    exposing an object using the exposure apparatus according to claim 1, and forming a pattern on the object; and
    developing the object on which the pattern is formed.

12. An exposure apparatus which irradiates an energy beam on a mask and transfers a pattern formed on the mask onto an object via an optical system, the apparatus comprising:
    a first chamber that houses the optical system and has its inside set to a negative pressure state;
    a second chamber which houses the first chamber and has its inside set to a negative pressure state with a higher pressure than the first chamber;
    a movable body which moves holding the mask;
    a seal mechanism which has a loop-shaped static gas bearing member, the static gas bearing member surrounding the mask and having an end section on the opposite side of the side that faces the second chamber connected to the movable body in an air tight state, and which isolates the inside of the static gas bearing member from the outside by a surface on the side facing the second chamber of the static gas bearing member forming a predetermined clearance between the static gas bearing member and a predetermined plane of the second chamber facing the mask; and
    a detection system that detects surface position information of the mask, the detection system being arranged inside the second chamber and yet outside the first chamber.

13. The exposure apparatus according to claim 12 wherein the second chamber has a chamber main section which houses the first chamber, and a flange section which is arranged projecting on a periphery section of the chamber main section and has a surface configuring a part of the predetermined plane, the predetermined plane having such a size that covers a range of movement of the static gas bearing member.

14. The exposure apparatus according to claim 12 wherein
    the static gas bearing member has a gas blowing groove to blow out gas to the predetermined plane of the second chamber and a gas suction groove to suction the gas which has been blown out, and the predetermined clearance is maintained between the static gas bearing member and the predetermined plane, by a balance between a force in a direction withdrawing from the predetermined plane including the static pressure of the gas in the clearance and a force in a direction approaching the predetermined plane caused by a negative pressure which occurs in the vicinity of the gas suction groove by the suction of the gas, acting on the static gas bearing member.

15. The exposure apparatus according to claim 14 wherein the gas blowing groove and the gas suction groove have a loop shape, respectively, and the gas suction groove is formed on the inner side of the gas blowing groove in a surface on the side facing the predetermined plane of the static gas bearing member.

16. The exposure apparatus according to claim 15 wherein in between the gas blowing groove and the gas suction groove of the static gas bearing member, an open air section is formed whose inside is open to the atmosphere.

17. The exposure apparatus according to claim 12 wherein the sealing mechanism further includes a loop-shaped expansion/contraction member which is connected to the movable body and the static gas bearing member, and expands and contracts in a widening direction and a narrowing direction of the clearance.

18. The exposure apparatus according to claim 17, the apparatus further comprising:

a moving device which makes the static gas bearing member move between a position where the predetermined clearance is formed with the predetermined plane and a position where a spacing larger than the predetermined clearance is formed with the predetermined plane.

19. The exposure apparatus according to claim 18 wherein the moving device makes the static gas bearing member move by electromagnetic force.

20. The exposure apparatus according to claim 12 wherein the energy beam is an extreme ultraviolet light.

21. The exposure apparatus according to claim 12, the apparatus further comprising:

a shutter device that isolates the inside of the first chamber to the outside.

22. A device manufacturing method including exposing an object using the exposure apparatus according to claim 12, and forming a pattern on the object; and developing the object on which the pattern is formed.

23. An exposure apparatus that has an optical system, the apparatus irradiating an energy beam on an object via the optical system, and forming a predetermined pattern on the object, comprising:

a first chamber that houses the optical system and has its inside set to a negative pressure state;

a second chamber which houses the first chamber and has its inside set to a negative pressure state with a higher pressure than the inside of the first chamber, a seal mechanism which houses the object, and which has a gas bearing member configured to surround the object and isolate the object from the outside in an air tight state; and a detection system that obtains position information of a surface of the object, the detection system being arranged inside the second chamber and yet outside the first chamber.

24. A device manufacturing method including exposing an object using the exposure apparatus according to claim 23, and forming a pattern on the object; and developing the object on which the pattern is formed.

* * * * *